United States Patent
Beaumier et al.

(10) Patent No.: US 10,949,006 B2
(45) Date of Patent: *Mar. 16, 2021

(54) DIGITAL JUKEBOX DEVICE WITH IMPROVED USER INTERFACES, AND ASSOCIATED METHODS

(71) Applicant: TouchTunes Music Corporation, New York, NY (US)

(72) Inventors: Francois Beaumier, Laval (CA); Karim Dhambri, Montreal (CA); Daniel Susla, New York, NY (US); Matthew Labunka, New York, NY (US); Ian Moulton, New York, NY (US); Samer Alameer, Montreal (CA); Michael Tooker, Pointe-Claire (CA)

(73) Assignee: TouchTunes Music Corporation, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/531,635

(22) Filed: Aug. 5, 2019

(65) Prior Publication Data

US 2019/0354208 A1 Nov. 21, 2019

Related U.S. Application Data

(60) Continuation of application No. 14/886,070, filed on Oct. 18, 2015, now Pat. No. 10,423,250, which is a
(Continued)

(51) Int. Cl.
*G07F 7/04* (2006.01)
*G07F 7/08* (2006.01)
(Continued)

(52) U.S. Cl.
CPC .............. *G06F 3/041* (2013.01); *A47B 81/06* (2013.01); *G06F 3/0412* (2013.01);
(Continued)

(58) Field of Classification Search
CPC .......... G06K 15/00; G06K 5/00; G06F 17/00; G06F 7/08; G11B 21/08; G11B 7/085
(Continued)

(56) References Cited

U.S. PATENT DOCUMENTS 3,807,541 A 4/1974 Kortenhaus
3,982,620 A 9/1976 Kotenhaus
(Continued)

FOREIGN PATENT DOCUMENTS

AU 199954012 4/2000
CN 1340939 3/2002
(Continued)

OTHER PUBLICATIONS

"About Ecast", date unknown, leaflet.
(Continued)

*Primary Examiner* — Edwyn Labaze
(74) *Attorney, Agent, or Firm* — Nixon & Vanderhye, P.C.

(57) ABSTRACT

Certain exemplary embodiments relate to entertainment systems and, more particularly, to systems that incorporate digital downloading jukebox features and improved user interfaces. For instance, a smart search may be provided, e.g., where search results vary based on the popularity of songs within the venue, in dependence on songs being promoted, etc. As another example, a tile-based approach to organizing groupings of songs is provided. Groupings may involve self-populating collections of songs that combine centrally-promoted songs, songs in a given genre that are popular across an audiovisual distribution network, and songs that are locally popular and match up with the given genre (e.g., because of shared attributes such as same or similar genre, artist, etc.). Different tile visual presentations also are contemplated, as are different physical jukebox
(Continued)

designs. In certain example embodiments, a sealed core unit with the "brains" of the jukebox is insertable into a docking station.

14 Claims, 69 Drawing Sheets

Related U.S. Application Data division of application No. 14/668,228, filed on Mar. 25, 2015.

(60) Provisional application No. 61/970,338, filed on Mar. 25, 2014.

(51) Int. Cl.
| | | |
|---|---|---|
| *G06F 3/041* | (2006.01) | |
| *G06F 16/438* | (2019.01) | |
| *G06F 16/64* | (2019.01) | |
| *G06F 16/44* | (2019.01) | |
| *G06F 16/68* | (2019.01) | |
| *G06F 16/632* | (2019.01) | |
| *G06F 16/638* | (2019.01) | |
| *A47B 81/06* | (2006.01) | |
| *G06F 3/0482* | (2013.01) | |
| *G06F 3/0484* | (2013.01) | |
| *G06F 3/16* | (2006.01) | |
| *G07F 17/30* | (2006.01) | |
| *H04N 21/414* | (2011.01) | |
| *H04N 21/482* | (2011.01) | |
| *H04N 21/81* | (2011.01) | |
| *H05K 5/00* | (2006.01) | |
| *H05K 5/02* | (2006.01) | |
| *H05K 5/06* | (2006.01) | |
| G06F 3/0481 | (2013.01) | |
| G06F 3/0488 | (2013.01) | |
| G11B 27/34 | (2006.01) | |

(52) U.S. Cl.
CPC ........ *G06F 3/0482* (2013.01); *G06F 3/04842* (2013.01); *G06F 3/162* (2013.01); *G06F 3/165* (2013.01); *G06F 16/438* (2019.01); *G06F 16/44* (2019.01); *G06F 16/632* (2019.01); *G06F 16/639* (2019.01); *G06F 16/64* (2019.01); *G06F 16/686* (2019.01); *G07F 7/04* (2013.01); *G07F 7/0873* (2013.01); *G07F 17/305* (2013.01); *H04N 21/41415* (2013.01); *H04N 21/482* (2013.01); *H04N 21/8113* (2013.01); *H05K 5/0017* (2013.01); *H05K 5/0213* (2013.01); *H05K 5/0221* (2013.01); *H05K 5/0247* (2013.01); *H05K 5/06* (2013.01); *G06F 3/0481* (2013.01); *G06F 3/0484* (2013.01); *G06F 3/0488* (2013.01); *G06F 3/04817* (2013.01); *G06F 3/04847* (2013.01); *G06F 3/04883* (2013.01); *G11B 27/34* (2013.01)

(58) Field of Classification Search
USPC ............... 235/383, 375, 380, 381; 369/30.06
See application file for complete search history.

(56) References Cited

U.S. PATENT DOCUMENTS

| | | |
|---|---|---|
| 4,008,369 A | 2/1977 | Theurer et al. |
| 4,186,438 A | 1/1980 | Benson |
| 4,232,295 A | 11/1980 | McConnell |
| 4,335,809 A | 6/1982 | Wain |
| 4,335,908 A | 6/1982 | Burge |
| 4,336,935 A | 6/1982 | Goldfarb |
| 4,356,509 A | 10/1982 | Skerlos et al. |
| 4,369,442 A | 1/1983 | Werth et al. |
| 4,375,287 A | 3/1983 | Smith |
| 4,412,292 A | 10/1983 | Sedam |
| 4,413,260 A | 11/1983 | Siegel et al. |
| 4,521,014 A | 6/1985 | Sitrick |
| 4,528,643 A | 7/1985 | Freeny |
| 4,558,413 A | 12/1985 | Schmidt et al. |
| 4,572,509 A | 2/1986 | Sitrick |
| 4,577,333 A | 3/1986 | Lewis et al. |
| 4,582,324 A | 4/1986 | Koza |
| 4,588,187 A | 5/1986 | Dell |
| 4,593,904 A | 6/1986 | Graves |
| 4,597,058 A | 6/1986 | Izumi |
| 4,636,951 A | 1/1987 | Harlick |
| 4,652,998 A | 3/1987 | Koza |
| 4,654,799 A | 3/1987 | Ogaki |
| 4,658,093 A | 4/1987 | Hellman |
| 4,667,802 A | 5/1987 | Verduin et al. |
| 4,674,055 A | 6/1987 | Ogaki et al. |
| 4,675,538 A | 6/1987 | Epstein |
| 4,677,311 A | 6/1987 | Morita |
| 4,677,565 A | 6/1987 | Ogaki |
| 4,703,465 A | 10/1987 | Parker |
| 4,704,725 A | 11/1987 | Harvey et al. |
| 4,707,804 A | 11/1987 | Leal |
| 4,722,053 A | 1/1988 | Dubno |
| 4,761,684 A | 8/1988 | Clark |
| 4,766,581 A | 8/1988 | Korn et al. |
| 4,787,050 A | 11/1988 | Suzuki |
| 4,792,849 A | 12/1988 | McCalley |
| 4,807,052 A | 2/1989 | Amano |
| 4,811,325 A | 3/1989 | Sharples |
| 4,814,972 A | 3/1989 | Winter et al. |
| 4,825,054 A | 4/1989 | Rust |
| 4,829,570 A | 5/1989 | Schotz |
| 4,852,154 A | 7/1989 | Lewis et al. |
| 4,857,714 A | 8/1989 | Sunyich |
| 4,868,832 A | 9/1989 | Marrington |
| 4,885,694 A | 12/1989 | Pray et al. |
| 4,905,279 A | 2/1990 | Nishio |
| 4,920,432 A | 4/1990 | Eggers |
| 4,922,420 A | 5/1990 | Nakagawa |
| 4,924,378 A | 5/1990 | Hershey |
| 4,926,485 A | 5/1990 | Yamashita |
| 4,937,807 A | 6/1990 | Weitz |
| 4,949,187 A | 8/1990 | Cohen |
| 4,953,159 A | 8/1990 | Hayden et al. |
| 4,956,768 A | 9/1990 | Sidi |
| 4,958,835 A | 9/1990 | Tashiro |
| 4,965,675 A | 10/1990 | Masashi et al. |
| 4,977,593 A | 12/1990 | Ballance |
| 4,999,806 A | 3/1991 | Chernow |
| 5,008,814 A | 4/1991 | Mathur |
| 5,012,121 A | 4/1991 | Hammond |
| 5,027,426 A | 6/1991 | Chiocca |
| 5,041,921 A | 8/1991 | Scheffler |
| 5,046,093 A | 9/1991 | Wachob |
| 5,053,758 A | 10/1991 | Cornett et al. |
| 5,058,089 A | 10/1991 | Yoshimara |
| 5,077,607 A | 12/1991 | Johnson et al. |
| 5,081,534 A | 1/1992 | Geiger et al. |
| 5,101,451 A | 3/1992 | Ash et al. |
| 5,101,499 A | 3/1992 | Streck et al. |
| 5,106,097 A | 4/1992 | Levine |
| 5,117,407 A | 5/1992 | Vogel |
| 5,128,862 A | 7/1992 | Mueller |
| 5,138,712 A | 8/1992 | Corbin |
| 5,148,159 A | 9/1992 | Clark et al. |
| 5,155,847 A | 10/1992 | Kirouac |
| 5,159,678 A | 10/1992 | Wengelski et al. |
| 5,163,131 A | 11/1992 | Row |
| 5,166,886 A | 11/1992 | Molnar |
| 5,172,413 A | 12/1992 | Bradley et al. |
| 5,180,309 A | 1/1993 | Egnor |
| 5,189,630 A | 2/1993 | Barstow et al. |

(56) References Cited

U.S. PATENT DOCUMENTS

| | | |
|---|---|---|
| 5,191,573 A | 3/1993 | Hair |
| 5,191,611 A | 3/1993 | Lang |
| 5,192,999 A | 3/1993 | Graczyk |
| 5,197,094 A | 3/1993 | Tillery |
| 5,203,028 A | 4/1993 | Shiraishi |
| 5,210,854 A | 5/1993 | Beaverton et al. |
| 5,214,761 A | 5/1993 | Barrett et al. |
| 5,222,134 A | 6/1993 | Waite et al. |
| 5,228,015 A | 7/1993 | Arbiter et al. |
| 5,231,157 A | 7/1993 | Herzig et al. |
| 5,237,157 A | 8/1993 | Kaplan |
| 5,237,322 A | 8/1993 | Heberle |
| 5,239,480 A | 8/1993 | Huegel |
| 5,250,747 A | 10/1993 | Tsumura |
| 5,252,775 A | 10/1993 | Urano |
| 5,260,999 A | 11/1993 | Wyman |
| 5,261,104 A | 11/1993 | Bertram et al. |
| 5,262,875 A | 11/1993 | Mincer et al. |
| 5,276,866 A | 1/1994 | Paolini |
| 5,278,904 A | 1/1994 | Servi |
| 5,282,028 A | 1/1994 | Johnson et al. |
| 5,289,476 A | 2/1994 | Johnson et al. |
| 5,289,546 A | 2/1994 | Hetherington |
| 5,315,161 A | 5/1994 | Robinson |
| 5,315,711 A | 5/1994 | Barone et al. |
| 5,319,455 A | 6/1994 | Hoarty et al. |
| 5,321,846 A | 6/1994 | Yokota et al. |
| 5,327,230 A | 7/1994 | Dockery |
| 5,331,614 A | 7/1994 | Ogawa |
| 5,335,313 A | 8/1994 | Douglas |
| 5,339,095 A | 8/1994 | Redford |
| 5,339,413 A | 8/1994 | Koval |
| 5,341,350 A | 8/1994 | Frank |
| 5,355,302 A | 10/1994 | Martin et al. |
| 5,357,276 A | 10/1994 | Banker |
| 5,369,778 A | 11/1994 | SanSoucie |
| 5,375,206 A | 12/1994 | Hunter |
| 5,386,251 A | 1/1995 | Movshovich |
| 5,389,950 A | 2/1995 | Martin et al. |
| 5,404,505 A | 4/1995 | Levinson |
| 5,406,634 A | 4/1995 | Anderson et al. |
| 5,408,417 A | 4/1995 | Wilder |
| 5,410,326 A | 4/1995 | Goldstein |
| 5,410,703 A | 4/1995 | Nilsson et al. |
| 5,418,713 A | 5/1995 | Allen |
| 5,420,923 A | 5/1995 | Beyers |
| 5,428,252 A | 6/1995 | Walker |
| 5,428,606 A | 6/1995 | Moskowitz |
| 5,431,492 A | 7/1995 | Rothschild |
| 5,440,632 A | 8/1995 | Bacon et al. |
| 5,444,499 A | 8/1995 | Saitoh |
| 5,445,295 A | 8/1995 | Brown |
| 5,455,619 A | 10/1995 | Truckenmiller et al. |
| 5,455,926 A | 10/1995 | Keele |
| 5,457,305 A | 10/1995 | Akel |
| 5,465,213 A | 11/1995 | Ross |
| 5,465,329 A | 11/1995 | Whisler |
| 5,467,326 A | 11/1995 | Miyashita et al. |
| 5,469,370 A | 11/1995 | Ostrover et al. |
| 5,469,573 A | 11/1995 | McGill et al. |
| 5,471,576 A | 11/1995 | Yee |
| 5,473,746 A | 12/1995 | Pritt et al. |
| 5,475,835 A | 12/1995 | Hickey |
| 5,481,509 A | 1/1996 | Knowles |
| 5,487,167 A | 1/1996 | Dinallo et al. |
| 5,489,103 A | 2/1996 | Okamoto |
| 5,495,610 A | 2/1996 | Shing |
| 5,496,178 A | 3/1996 | Back |
| 5,499,921 A | 3/1996 | Sone |
| 5,511,000 A | 4/1996 | Kaloi |
| 5,513,117 A | 4/1996 | Small |
| 5,515,173 A | 5/1996 | Mankovitz et al. |
| 5,519,435 A | 5/1996 | Anderson |
| 5,519,457 A | 5/1996 | Nishigaki et al. |
| 5,521,631 A | 5/1996 | Budow et al. |
| 5,521,918 A | 5/1996 | Kim |
| 5,521,922 A | 5/1996 | Fujinami et al. |
| 5,523,781 A | 6/1996 | Brusaw |
| 5,528,732 A | 6/1996 | Klotz |
| 5,532,734 A | 7/1996 | Goertz |
| 5,532,991 A | 7/1996 | Sasaki |
| 5,546,039 A | 8/1996 | Hewitt et al. |
| 5,548,729 A | 8/1996 | Akiyoshi |
| 5,550,577 A | 8/1996 | Verbiest |
| 5,554,968 A | 9/1996 | Lee |
| 5,555,244 A | 9/1996 | Gupta |
| 5,557,515 A | 9/1996 | Abbruzzese et al. |
| 5,557,541 A | 9/1996 | Schulhof |
| 5,557,724 A | 9/1996 | Sampat et al. |
| 5,559,505 A | 9/1996 | McNair |
| 5,559,549 A | 9/1996 | Hendricks |
| 5,559,714 A | 9/1996 | Banks et al. |
| 5,561,709 A | 10/1996 | Remillard |
| 5,565,908 A | 10/1996 | Ahmad |
| 5,566,237 A | 10/1996 | Dobbs |
| 5,570,363 A | 10/1996 | Holm |
| 5,578,999 A | 11/1996 | Matsuzawa et al. |
| 5,579,404 A | 11/1996 | Fielder et al. |
| 5,583,561 A | 12/1996 | Baker et al. |
| 5,583,937 A | 12/1996 | Ullrich et al. |
| 5,583,994 A | 12/1996 | Rangan |
| 5,583,995 A | 12/1996 | Gardner et al. |
| 5,592,482 A | 1/1997 | Abraham |
| 5,592,551 A | 1/1997 | Lett |
| 5,592,611 A | 1/1997 | Midgely et al. |
| 5,594,509 A | 1/1997 | Florin |
| 5,596,702 A | 1/1997 | Stucka et al. |
| 5,607,099 A | 3/1997 | Yeh et al. |
| 5,612,581 A | 3/1997 | Kageyama |
| 5,613,909 A | 3/1997 | Stelovsky |
| 5,616,876 A | 4/1997 | Cluts |
| 5,617,565 A | 4/1997 | Augenbraun et al. |
| 5,619,247 A | 4/1997 | Russo |
| 5,619,249 A | 4/1997 | Billock et al. |
| 5,619,250 A | 4/1997 | McClellan et al. |
| 5,619,698 A | 4/1997 | Lillich |
| 5,623,666 A | 4/1997 | Pike |
| 5,631,693 A | 5/1997 | Wunderlich et al. |
| 5,636,276 A | 6/1997 | Brugger |
| 5,638,426 A | 6/1997 | Lewis |
| 5,642,337 A | 6/1997 | Oskay et al. |
| 5,643,831 A | 7/1997 | Ochiai et al. |
| 5,644,714 A | 7/1997 | Kikinis |
| 5,644,766 A | 7/1997 | Coy |
| 5,654,714 A | 8/1997 | Takahashi et al. |
| 5,659,466 A | 8/1997 | Norris et al. |
| 5,661,517 A | 8/1997 | Budow et al. |
| 5,661,802 A | 8/1997 | Nilssen |
| 5,663,756 A | 9/1997 | Blahut et al. |
| 5,668,592 A | 9/1997 | Spaulding |
| 5,668,778 A | 9/1997 | Quazi |
| 5,668,788 A | 9/1997 | Allison |
| 5,675,734 A | 10/1997 | Hair |
| 5,680,533 A | 10/1997 | Yamato et al. |
| 5,684,716 A | 11/1997 | Freeman |
| 5,689,641 A | 11/1997 | Ludwig et al. |
| 5,691,778 A | 11/1997 | Song |
| 5,691,964 A | 11/1997 | Niederlein et al. |
| 5,696,914 A | 12/1997 | Nahaboo et al. |
| 5,697,844 A | 12/1997 | Von Kohorn |
| 5,703,795 A | 12/1997 | Mankowitz |
| 5,708,811 A | 1/1998 | Arendt |
| 5,712,976 A | 1/1998 | Falcon et al. |
| 5,713,024 A | 1/1998 | Halladay |
| 5,715,416 A | 2/1998 | Baker |
| 5,717,452 A | 2/1998 | Janin et al. |
| 5,721,583 A | 2/1998 | Harada et al. |
| 5,721,815 A | 2/1998 | Ottesen et al. |
| 5,721,827 A | 2/1998 | Logan et al. |
| 5,721,829 A | 2/1998 | Dunn et al. |
| 5,724,525 A | 3/1998 | Beyers et al. |
| 5,726,909 A | 3/1998 | Krikorian |
| 5,734,719 A | 3/1998 | Tsevdos et al. |
| 5,734,961 A | 3/1998 | Castille |

(56) References Cited

U.S. PATENT DOCUMENTS

| | | |
|---|---|---|
| 5,739,451 A | 4/1998 | Winksy et al. |
| 5,743,745 A | 4/1998 | Reintjes |
| 5,745,391 A | 4/1998 | Topor |
| 5,748,254 A | 5/1998 | Harrison et al. |
| 5,748,468 A | 5/1998 | Notenboom et al. |
| 5,748,954 A | 5/1998 | Mauldin |
| 5,751,336 A | 5/1998 | Aggarwal et al. |
| 5,752,232 A | 5/1998 | Basore et al. |
| 5,757,936 A | 5/1998 | Lee |
| 5,758,340 A | 5/1998 | Nail |
| 5,761,655 A | 6/1998 | Hoffman |
| 5,762,552 A | 6/1998 | Vuong |
| 5,774,527 A | 6/1998 | Handelman et al. |
| 5,774,668 A | 6/1998 | Choquier |
| 5,774,672 A | 6/1998 | Funahashi |
| 5,778,395 A | 7/1998 | Whiting |
| 5,781,889 A | 7/1998 | Martin et al. |
| 5,786,784 A | 7/1998 | Gaudichon |
| 5,790,172 A | 8/1998 | Imanaka |
| 5,790,671 A | 8/1998 | Cooper |
| 5,790,856 A | 8/1998 | Lillich |
| 5,790,935 A | 8/1998 | Payton |
| 5,793,364 A | 8/1998 | Bolanos et al. |
| 5,793,980 A | 8/1998 | Glaser |
| 5,798,785 A | 8/1998 | Hendricks |
| 5,802,283 A | 9/1998 | Grady et al. |
| 5,802,558 A | 9/1998 | Pierce |
| 5,802,599 A | 9/1998 | Cabrera |
| 5,805,804 A | 9/1998 | Laursen et al. |
| 5,808,224 A | 9/1998 | Kato |
| 5,809,246 A | 9/1998 | Goldman |
| 5,812,643 A | 9/1998 | Schelberg et al. |
| 5,815,146 A | 9/1998 | Youden et al. |
| 5,825,884 A | 10/1998 | Zdepski et al. |
| 5,828,343 A | 10/1998 | MacDonald et al. |
| 5,831,555 A | 11/1998 | Yu et al. |
| 5,831,663 A | 11/1998 | Waterhouse et al. |
| 5,832,024 A | 11/1998 | Schotz et al. |
| 5,832,287 A | 11/1998 | Atalla |
| 5,835,843 A | 11/1998 | Haddad |
| 5,842,869 A | 12/1998 | McGregor et al. |
| 5,845,104 A | 12/1998 | Rao |
| 5,845,256 A | 12/1998 | Pescitelli et al. |
| 5,848,398 A | 12/1998 | Martin |
| 5,851,149 A | 12/1998 | Xidos et al. |
| 5,854,887 A | 12/1998 | Kindell |
| 5,857,020 A | 1/1999 | Peterson |
| 5,857,707 A | 1/1999 | Devlin |
| 5,862,324 A | 1/1999 | Collins |
| 5,864,811 A | 1/1999 | Tran et al. |
| 5,864,868 A | 1/1999 | Contois |
| 5,864,870 A | 1/1999 | Guck |
| 5,867,714 A | 2/1999 | Todd |
| 5,870,721 A | 2/1999 | Norris |
| 5,880,386 A | 3/1999 | Wachi et al. |
| 5,880,769 A | 3/1999 | Nemirofsky et al. |
| 5,884,028 A | 3/1999 | Kindell |
| 5,884,298 A | 3/1999 | Smith |
| 5,887,139 A | 3/1999 | Madison, Jr. et al. |
| 5,887,193 A | 3/1999 | Takahashi |
| 5,893,162 A | 4/1999 | Lau et al. |
| 5,895,455 A | 4/1999 | Bellinger et al. |
| 5,896,094 A | 4/1999 | Narisada et al. |
| 5,903,266 A | 5/1999 | Berstis et al. |
| 5,913,040 A | 6/1999 | Rakavy |
| 5,914,712 A | 6/1999 | Sartain et al. |
| 5,915,094 A | 6/1999 | Kouloheris |
| 5,915,238 A | 6/1999 | Tjaden |
| 5,917,537 A | 6/1999 | Lightfoot |
| 5,917,835 A | 6/1999 | Barrett |
| 5,918,213 A | 6/1999 | Bernard et al. |
| 5,920,700 A | 7/1999 | Gordon et al. |
| 5,920,702 A | 7/1999 | Johnson |
| 5,923,885 A | 7/1999 | Johnson |
| 5,926,531 A | 7/1999 | Petite |
| 5,926,624 A | 7/1999 | Katz et al. |
| 5,930,765 A | 7/1999 | Martin |
| 5,931,908 A | 8/1999 | Gerba |
| 5,933,090 A | 8/1999 | Christenson |
| 5,940,504 A | 8/1999 | Griswold |
| 5,949,411 A | 9/1999 | Doerr et al. |
| 5,949,688 A | 9/1999 | Montoya |
| 5,953,429 A | 9/1999 | Wakai et al. |
| 5,956,716 A | 9/1999 | Kenner et al. |
| 5,959,869 A | 9/1999 | Miller |
| 5,959,945 A | 9/1999 | Kleiman |
| 5,960,167 A | 9/1999 | Roberts et al. |
| 5,963,916 A | 10/1999 | Kaplan |
| 5,966,495 A | 10/1999 | Takahashi |
| 5,970,467 A | 10/1999 | Alavi |
| 5,978,855 A | 11/1999 | Metz et al. |
| 5,978,912 A | 11/1999 | Rakavy et al. |
| 5,980,261 A | 11/1999 | Mino et al. |
| 5,999,499 A * | 12/1999 | Pines .................... G07F 17/305 369/30.3 |
| 5,999,624 A | 12/1999 | Hopkins |
| 6,002,720 A | 12/1999 | Yurt |
| 6,005,599 A | 12/1999 | Asai et al. |
| 6,008,735 A | 12/1999 | Chiloyan et al. |
| 6,009,274 A | 12/1999 | Fletcher |
| 6,011,758 A | 1/2000 | Dockes et al. |
| 6,018,337 A | 1/2000 | Peters |
| 6,018,726 A | 1/2000 | Tsumura |
| 6,021,386 A | 2/2000 | Davis |
| 6,023,705 A | 2/2000 | Bellinger et al. |
| 6,025,868 A | 2/2000 | Russo |
| 6,034,925 A | 3/2000 | Wehmeyer |
| 6,036,189 A | 3/2000 | Gomez |
| 6,038,591 A | 3/2000 | Wolfe et al. |
| 6,040,829 A | 3/2000 | Croy et al. |
| 6,041,354 A | 3/2000 | Biliris et al. |
| 6,049,891 A | 4/2000 | Inamoto |
| 6,054,987 A | 4/2000 | Richardson |
| 6,055,573 A | 4/2000 | Gardenswartz et al. |
| 6,057,874 A | 5/2000 | Michaud |
| 6,069,672 A | 5/2000 | Claassen |
| 6,072,982 A | 6/2000 | Haddad |
| 6,107,937 A | 8/2000 | Hamada |
| 6,118,450 A | 9/2000 | Proehl et al. |
| 6,124,804 A | 9/2000 | Kitao et al. |
| 6,131,088 A | 10/2000 | Hill |
| 6,131,121 A | 10/2000 | Mattaway et al. |
| 6,134,547 A | 10/2000 | Huxley et al. |
| 6,138,150 A | 10/2000 | Nichols et al. |
| 6,148,142 A | 11/2000 | Anderson |
| 6,151,077 A | 11/2000 | Vogel et al. |
| 6,151,634 A | 11/2000 | Glaser |
| 6,154,207 A | 11/2000 | Farris et al. |
| 6,157,935 A | 12/2000 | Tran et al. |
| 6,161,059 A | 12/2000 | Tedesco et al. |
| 6,170,060 B1 | 1/2001 | Mott et al. |
| 6,173,172 B1 | 1/2001 | Masuda et al. |
| 6,175,861 B1 | 1/2001 | Williams, Jr. et al. |
| 6,182,126 B1 | 1/2001 | Nathan et al. |
| 6,185,184 B1 | 2/2001 | Mattaway et al. |
| 6,185,619 B1 | 2/2001 | Joffe et al. |
| 6,191,780 B1 | 2/2001 | Martin et al. |
| 6,192,340 B1 | 2/2001 | Abecassis |
| 6,195,732 B1 | 2/2001 | Adams et al. |
| 6,198,408 B1 | 3/2001 | Cohen |
| 6,202,060 B1 | 3/2001 | Tran |
| 6,209,060 B1 | 3/2001 | Machida |
| 6,212,138 B1 | 4/2001 | Kalis et al. |
| 6,216,175 B1 | 4/2001 | Sliger et al. |
| 6,216,227 B1 | 4/2001 | Goldstein et al. |
| 6,219,692 B1 | 4/2001 | Stiles |
| 6,223,209 B1 | 4/2001 | Watson |
| 6,226,412 B1 | 5/2001 | Schwab |
| 6,226,715 B1 | 5/2001 | Van Der Wolf et al. |
| 6,240,550 B1 | 5/2001 | Nathan et al. |
| 6,243,725 B1 | 6/2001 | Hempleman et al. |
| 6,247,022 B1 | 6/2001 | Yankowski |
| 6,256,773 B1 | 7/2001 | Bowman-Amuah |
| 6,262,569 B1 | 7/2001 | Carr et al. |

(56) References Cited

U.S. PATENT DOCUMENTS

| | | |
|---|---|---|
| 6,280,327 B1 | 8/2001 | Leifer et al. |
| 6,282,709 B1 | 8/2001 | Reha et al. |
| 6,288,688 B1 | 9/2001 | Hughes et al. |
| 6,288,991 B1 | 9/2001 | Kajiyama et al. |
| 6,289,382 B1 | 9/2001 | Bowman-Amuah |
| 6,292,443 B1 | 9/2001 | Awazu et al. |
| 6,298,373 B1 | 10/2001 | Burns et al. |
| 6,301,710 B1 | 10/2001 | Fujiwara |
| 6,302,793 B1 | 10/2001 | Fertitta et al. |
| 6,308,204 B1 | 10/2001 | Nathan et al. |
| 6,311,214 B1 | 10/2001 | Rhoads |
| 6,315,572 B1 | 11/2001 | Glaser |
| 6,323,911 B1 | 11/2001 | Schein et al. |
| 6,332,025 B2 | 12/2001 | Takahashi et al. |
| 6,336,219 B1 | 1/2002 | Nathan |
| 6,341,166 B1 | 1/2002 | Basel |
| 6,344,862 B1 | 2/2002 | Williams et al. |
| 6,346,951 B1 | 2/2002 | Mastronardi |
| 6,353,820 B1 | 3/2002 | Edwards et al. |
| 6,356,971 B1 | 3/2002 | Katz et al. |
| 6,359,616 B1 | 3/2002 | Ogura et al. |
| 6,359,661 B1 | 3/2002 | Nickum |
| 6,370,580 B2 | 4/2002 | Kriegsman |
| 6,381,575 B1 | 4/2002 | Martin et al. |
| 6,384,737 B1 | 5/2002 | Hsu et al. |
| 6,393,584 B1 | 5/2002 | McLaren et al. |
| 6,396,480 B1 | 5/2002 | Schindler et al. |
| 6,397,189 B1 | 5/2002 | Martin et al. |
| 6,407,987 B1 | 6/2002 | Abraham |
| 6,408,435 B1 | 6/2002 | Sato |
| 6,408,437 B1 | 6/2002 | Hendricks et al. |
| 6,421,651 B1 | 7/2002 | Tedesco et al. |
| 6,425,125 B1 | 7/2002 | Fries et al. |
| 6,430,117 B2 * | 8/2002 | Zimmer ............ G07F 17/305 369/30.06 |
| 6,430,537 B1 | 8/2002 | Tedesco et al. |
| 6,430,738 B1 | 8/2002 | Gross et al. |
| 6,434,678 B1 | 8/2002 | Menzel |
| 6,438,450 B1 | 8/2002 | DiLorenzo |
| 6,442,549 B1 | 8/2002 | Schneider |
| 6,446,080 B1 | 9/2002 | Van Ryzin et al. |
| 6,446,130 B1 | 9/2002 | Grapes |
| 6,449,688 B1 | 9/2002 | Peters et al. |
| 6,470,496 B1 | 10/2002 | Kato et al. |
| 6,473,794 B1 | 10/2002 | Guheen et al. |
| 6,488,508 B2 | 12/2002 | Okamoto |
| 6,490,570 B1 | 12/2002 | Numaoka |
| 6,493,871 B1 | 12/2002 | McGuire et al. |
| 6,496,927 B1 | 12/2002 | McGrane et al. |
| 6,498,855 B1 | 12/2002 | Kokkosoulis et al. |
| 6,522,707 B1 | 2/2003 | Brandstetter et al. |
| 6,535,911 B1 | 3/2003 | Miller et al. |
| 6,538,558 B2 | 3/2003 | Sakazume et al. |
| 6,543,052 B1 | 4/2003 | Ogasawara |
| 6,544,122 B2 | 4/2003 | Araki et al. |
| 6,549,719 B2 | 4/2003 | Mankovitz |
| D475,029 S | 5/2003 | Nathan et al. |
| 6,560,651 B2 | 5/2003 | Katz et al. |
| 6,570,507 B1 | 5/2003 | Lee et al. |
| 6,571,282 B1 | 5/2003 | Bowman-Amuah |
| 6,577,735 B1 | 6/2003 | Bharat |
| 6,578,051 B1 | 6/2003 | Mastronardi et al. |
| 6,587,403 B1 | 7/2003 | Keller et al. |
| 6,590,838 B1 | 7/2003 | Gerlings et al. |
| 6,598,230 B1 | 7/2003 | Ballhorn |
| 6,622,307 B1 | 9/2003 | Ho |
| 6,628,939 B2 | 9/2003 | Paulsen |
| 6,629,318 B1 | 9/2003 | Radha et al. |
| 6,643,620 B1 | 11/2003 | Contolini et al. |
| 6,643,690 B2 | 11/2003 | Duursma et al. |
| 6,654,801 B2 | 11/2003 | Mann et al. |
| 6,658,090 B1 | 12/2003 | Harjunen et al. |
| 6,662,231 B1 | 12/2003 | Drosset et al. |
| 6,702,585 B2 | 3/2004 | Okamoto |
| 6,724,974 B2 | 4/2004 | Naruto et al. |
| 6,728,824 B1 | 4/2004 | Chen |
| 6,728,956 B2 | 4/2004 | Ono |
| 6,728,966 B1 | 4/2004 | Arsenault et al. |
| 6,744,882 B1 | 6/2004 | Gupta et al. |
| 6,751,794 B1 | 6/2004 | McCaleb et al. |
| 6,755,744 B1 | 6/2004 | Nathan et al. |
| 6,762,585 B2 | 7/2004 | Liao |
| 6,789,215 B1 | 9/2004 | Rupp et al. |
| 6,816,578 B1 | 11/2004 | Kredo et al. |
| 6,850,252 B1 | 2/2005 | Hoffberg |
| 6,898,161 B1 | 5/2005 | Nathan |
| 6,904,592 B1 | 6/2005 | Johnson |
| 6,920,614 B1 | 7/2005 | Schindler et al. |
| 6,928,653 B1 | 8/2005 | Ellis et al. |
| 6,934,700 B1 | 8/2005 | Ijdens et al. |
| 6,942,574 B1 | 9/2005 | LeMay et al. |
| 6,974,076 B1 | 12/2005 | Siegel |
| 7,024,485 B2 | 4/2006 | Dunning et al. |
| 7,073,172 B2 | 7/2006 | Chamberlain |
| 7,103,583 B1 | 9/2006 | Baum et al. |
| 7,107,109 B1 | 9/2006 | Nathan et al. |
| 7,111,129 B2 | 9/2006 | Percival |
| 7,114,013 B2 | 9/2006 | Bakke et al. |
| 7,124,194 B2 | 10/2006 | Nathan et al. |
| 7,181,458 B1 | 2/2007 | Higashi |
| 7,188,352 B2 | 3/2007 | Nathan et al. |
| 7,195,157 B2 | 3/2007 | Swartz et al. |
| 7,198,571 B2 | 4/2007 | LeMay et al. |
| 7,205,471 B2 | 4/2007 | Looney et al. |
| 7,206,417 B2 | 4/2007 | Nathan |
| 7,210,141 B1 | 4/2007 | Nathan et al. |
| 7,231,656 B1 | 6/2007 | Nathan |
| 7,237,198 B1 | 6/2007 | Chaney |
| 7,281,652 B2 | 10/2007 | Foss |
| 7,293,277 B1 | 11/2007 | Nathan |
| 7,356,831 B2 | 4/2008 | Nathan |
| 7,406,529 B2 | 7/2008 | Reed |
| 7,415,707 B2 | 8/2008 | Taguchi et al. |
| 7,418,474 B2 | 8/2008 | Schwab |
| 7,424,731 B1 | 9/2008 | Nathan et al. |
| 7,430,736 B2 | 9/2008 | Nguyen et al. |
| 7,433,832 B1 | 10/2008 | Bezos et al. |
| 7,448,057 B1 | 11/2008 | Nathan |
| 7,483,958 B1 | 1/2009 | Elabbady et al. |
| 7,500,192 B2 | 3/2009 | Mastronardi |
| 7,512,632 B2 | 3/2009 | Mastronardi et al. |
| 7,519,442 B2 | 4/2009 | Nathan et al. |
| 7,533,182 B2 | 5/2009 | Wurtzel et al. |
| 7,549,919 B1 | 6/2009 | Nathan et al. |
| 7,574,727 B2 | 8/2009 | Nathan et al. |
| 7,647,613 B2 | 1/2010 | Drakoulis et al. |
| 7,657,910 B1 | 2/2010 | McAulay et al. |
| D616,414 S | 5/2010 | Nathan et al. |
| 7,749,083 B2 | 7/2010 | Nathan et al. |
| 7,757,264 B2 | 7/2010 | Nathan |
| 7,761,538 B2 | 7/2010 | Lin et al. |
| 7,770,165 B2 | 8/2010 | Olson et al. |
| 7,778,879 B2 | 8/2010 | Nathan et al. |
| 7,783,593 B2 | 8/2010 | Espino |
| 7,783,774 B2 | 8/2010 | Nathan et al. |
| 7,793,331 B2 | 9/2010 | Nathan et al. |
| 7,819,734 B2 | 10/2010 | Nathan et al. |
| 7,822,687 B2 | 10/2010 | Brillon et al. |
| D629,382 S | 12/2010 | Nathan et al. |
| D642,553 S | 8/2011 | Nathan et al. |
| 7,996,873 B1 | 8/2011 | Nathan et al. |
| 8,015,200 B2 | 9/2011 | Seiflien et al. |
| 8,028,318 B2 | 9/2011 | Nathan |
| 8,032,879 B2 | 10/2011 | Nathan et al. |
| 8,037,412 B2 | 10/2011 | Nathan et al. |
| 8,052,512 B2 | 11/2011 | Nathan et al. |
| 8,103,589 B2 | 1/2012 | Nathan et al. |
| 8,151,304 B2 | 4/2012 | Nathan et al. |
| D665,375 S | 8/2012 | Garneau et al. |
| 8,292,712 B2 | 10/2012 | Nathan et al. |
| 8,332,895 B2 | 12/2012 | Nathan et al. |
| 8,429,530 B2 | 4/2013 | Neuman et al. |
| 2001/0016815 A1 | 8/2001 | Takahashi et al. |
| 2001/0023403 A1 | 9/2001 | Martin et al. |

(56) References Cited

U.S. PATENT DOCUMENTS

| | | |
|---|---|---|
| 2001/0030660 A1 | 10/2001 | Zainoulline |
| 2001/0030912 A1 | 10/2001 | Kalis et al. |
| 2001/0037367 A1 | 11/2001 | Iyer |
| 2001/0044725 A1 | 11/2001 | Matsuda et al. |
| 2002/0002079 A1 | 1/2002 | Martin et al. |
| 2002/0002483 A1 | 1/2002 | Siegel et al. |
| 2002/0113824 A1 | 8/2002 | Myers |
| 2002/0116476 A1 | 8/2002 | Eyal et al. |
| 2002/0118949 A1 | 8/2002 | Jones et al. |
| 2002/0120925 A1 | 8/2002 | Logan |
| 2002/0123331 A1 | 9/2002 | Lehaff et al. |
| 2002/0126141 A1 | 9/2002 | Mastronardi |
| 2002/0129036 A1 | 9/2002 | Ho Yuen Lok et al. |
| 2002/0162104 A1 | 10/2002 | Raike et al. |
| 2003/0004833 A1 | 1/2003 | Pollak et al. |
| 2003/0005099 A1 | 1/2003 | Sven et al. |
| 2003/0006911 A1 | 1/2003 | Smith et al. |
| 2003/0008703 A1 | 1/2003 | Gauselmann |
| 2003/0018740 A1 | 1/2003 | Sonoda et al. |
| 2003/0027120 A1 | 2/2003 | Jean |
| 2003/0031096 A1 | 2/2003 | Nathan et al. |
| 2003/0041093 A1 | 2/2003 | Yamane et al. |
| 2003/0065639 A1 | 4/2003 | Fiennes et al. |
| 2003/0076380 A1 | 4/2003 | Yusef et al. |
| 2003/0088538 A1 | 5/2003 | Ballard |
| 2003/0093790 A1 | 5/2003 | Logan et al. |
| 2003/0101450 A1 | 5/2003 | Davidsson et al. |
| 2003/0104865 A1 | 6/2003 | Itkis et al. |
| 2003/0108164 A1 | 6/2003 | Laurin et al. |
| 2003/0135424 A1 | 7/2003 | Davis et al. |
| 2003/0144910 A1 | 7/2003 | Flaherty et al. |
| 2003/0176218 A1 | 9/2003 | LeMay et al. |
| 2003/0191753 A1 | 10/2003 | Hoch |
| 2003/0208586 A1 | 11/2003 | Mastronardi et al. |
| 2003/0225834 A1 | 12/2003 | Lee et al. |
| 2004/0010800 A1 | 1/2004 | Goci |
| 2004/0025185 A1 | 2/2004 | Goci et al. |
| 2004/0085334 A1 | 5/2004 | Reaney |
| 2004/0103150 A1 | 5/2004 | Ogdon et al. |
| 2004/0122773 A1 | 6/2004 | McCombs |
| 2004/0145477 A1 | 7/2004 | Easter |
| 2004/0158555 A1 | 8/2004 | Seedman et al. |
| 2004/0204220 A1 | 10/2004 | Fried et al. |
| 2004/0205171 A1 | 10/2004 | Nathan et al. |
| 2004/0220926 A1 | 11/2004 | Lamkin et al. |
| 2004/0243482 A1 | 12/2004 | Laut |
| 2005/0048816 A1 | 3/2005 | Higgins |
| 2005/0059492 A1 | 3/2005 | Hedin |
| 2005/0060405 A1 | 3/2005 | Nathan et al. |
| 2005/0073782 A1 | 4/2005 | Nathan |
| 2005/0086172 A1 | 4/2005 | Stefik |
| 2005/0111671 A1 | 5/2005 | Nathan |
| 2005/0125833 A1 | 6/2005 | Nathan et al. |
| 2005/0201254 A1 | 9/2005 | Looney et al. |
| 2005/0267819 A1 | 12/2005 | Kaplan |
| 2006/0018208 A1 | 1/2006 | Nathan et al. |
| 2006/0031896 A1 | 2/2006 | Pulitzer |
| 2006/0035707 A1 | 2/2006 | Nguyen et al. |
| 2006/0062094 A1 | 3/2006 | Nathan et al. |
| 2006/0143575 A1 | 6/2006 | Sauermann |
| 2006/0153020 A1 | 7/2006 | Johnson |
| 2006/0163358 A1 | 7/2006 | Biderman |
| 2006/0227673 A1 | 10/2006 | Yamashita et al. |
| 2006/0239131 A1 | 10/2006 | Nathan et al. |
| 2006/0293773 A1 | 12/2006 | Nathan et al. |
| 2007/0025701 A1 | 2/2007 | Kawasaki et al. |
| 2007/0086280 A1 | 4/2007 | Cappello |
| 2007/0121430 A1 | 5/2007 | Nathan |
| 2007/0139410 A1 | 6/2007 | Abe et al. |
| 2007/0142022 A1 | 6/2007 | Madonna et al. |
| 2007/0160224 A1 | 7/2007 | Nathan |
| 2007/0204263 A1 | 8/2007 | Nathan et al. |
| 2007/0209053 A1 | 9/2007 | Nathan |
| 2007/0220052 A1 | 9/2007 | Kudo et al. |
| 2007/0225079 A1 | 9/2007 | Cole et al. |
| 2007/0247979 A1 | 10/2007 | Brillon et al. |
| 2008/0065925 A1 | 3/2008 | Oliverio et al. |
| 2008/0066016 A1 | 3/2008 | Dowdy et al. |
| 2008/0069545 A1 | 3/2008 | Nathan et al. |
| 2008/0077962 A1 | 3/2008 | Nathan |
| 2008/0086379 A1 | 4/2008 | Dion et al. |
| 2008/0096659 A1 | 4/2008 | Kreloff et al. |
| 2008/0137849 A1 | 6/2008 | Nathan |
| 2008/0147711 A1 | 6/2008 | Spiegelman |
| 2008/0155588 A1 | 6/2008 | Roberts et al. |
| 2008/0168807 A1 | 7/2008 | Dion et al. |
| 2008/0171594 A1 | 7/2008 | Fedesna et al. |
| 2008/0195443 A1 | 8/2008 | Nathan et al. |
| 2008/0198271 A1 | 8/2008 | Malki |
| 2008/0222199 A1 | 9/2008 | Tiu et al. |
| 2008/0239887 A1 | 10/2008 | Tooker et al. |
| 2008/0305738 A1 | 12/2008 | Khedouri et al. |
| 2009/0030802 A1 | 1/2009 | Plotnick et al. |
| 2009/0037969 A1 | 2/2009 | Nathan et al. |
| 2009/0042632 A1 | 2/2009 | Guenster et al. |
| 2009/0063976 A1 | 3/2009 | Bull et al. |
| 2009/0070341 A1 | 3/2009 | Mastronardi et al. |
| 2009/0091087 A1 | 4/2009 | Wasmund |
| 2009/0100092 A1 | 4/2009 | Seiflein et al. |
| 2009/0138111 A1 | 5/2009 | Mastronardi |
| 2009/0172565 A1 | 7/2009 | Jackson et al. |
| 2009/0177301 A1 | 7/2009 | Hayes |
| 2009/0241061 A1 | 9/2009 | Asai et al. |
| 2009/0265734 A1 | 10/2009 | Dion et al. |
| 2009/0282491 A1 | 11/2009 | Nathan |
| 2009/0287696 A1 | 11/2009 | Galuten |
| 2009/0307314 A1 | 12/2009 | Smith et al. |
| 2010/0042505 A1 | 2/2010 | Straus |
| 2010/0194703 A1 | 8/2010 | Fedor |
| 2010/0211818 A1 | 8/2010 | Nathan et al. |
| 2010/0241259 A1 | 9/2010 | Nathan |
| 2010/0247081 A1 | 9/2010 | Victoria Pons |
| 2010/0269042 A1 | 10/2010 | Richards |
| 2010/0269066 A1 | 10/2010 | Nathan |
| 2010/0299232 A1 | 11/2010 | Nathan et al. |
| 2011/0066943 A1 | 3/2011 | Brillon et al. |
| 2011/0283236 A1 | 11/2011 | Beaumier |
| 2011/0321026 A1 | 12/2011 | Nathan et al. |
| 2012/0009985 A1 | 1/2012 | Nathan et al. |
| 2012/0053713 A1 | 3/2012 | Nathan |
| 2012/0105464 A1 | 5/2012 | Franceus |
| 2012/0124513 A1* | 5/2012 | Shim .................. G06F 3/0488 715/801 |
| 2012/0143732 A1 | 6/2012 | Nathan et al. |
| 2012/0150614 A1 | 6/2012 | Dion et al. |
| 2012/0158531 A1 | 6/2012 | Dion |
| 2012/0166965 A1 | 6/2012 | Nathan et al. |
| 2012/0240140 A1 | 9/2012 | Nathan |
| 2013/0021281 A1 | 1/2013 | Tse et al. |
| 2013/0040715 A1 | 2/2013 | Nathan et al. |
| 2013/0044995 A1 | 2/2013 | Cappello et al. |
| 2013/0070093 A1 | 3/2013 | Rivera et al. |
| 2013/0091054 A1 | 4/2013 | Nathan et al. |
| 2013/0179468 A1 | 7/2013 | Westphal |
| 2013/0263001 A1 | 10/2013 | Doronichev |
| 2014/0026154 A1 | 1/2014 | Nathan |
| 2015/0227267 A1* | 8/2015 | Jarema, III ............ F16M 11/22 715/719 |
| 2015/0277849 A1 | 10/2015 | Beaumier et al. |
| 2017/0301185 A1* | 10/2017 | Bryant ................. G06F 3/04842 |

FOREIGN PATENT DOCUMENTS

| | | |
|---|---|---|
| DE | 3406058 | 8/1985 |
| DE | 3723737 | 1/1988 |
| DE | 3820835 | 1/1989 |
| DE | 3815071 | 11/1989 |
| DE | 4244198 | 6/1994 |
| DE | 19539172 | 9/1996 |
| DE | 19610739 | 9/1997 |
| DE | 19904007 | 8/2000 |
| EP | 0082077 | 6/1983 |
| EP | 0140593 | 5/1985 |
| EP | 0256921 | 2/1988 |

(56) References Cited

FOREIGN PATENT DOCUMENTS

| | | |
|---|---|---|
| EP | 0283304 | 9/1988 |
| EP | 0283350 | 9/1988 |
| EP | 0309298 | 3/1989 |
| EP | 0313359 | 4/1989 |
| EP | 0340787 | 11/1989 |
| EP | 0363186 | 4/1990 |
| EP | 0425168 | 5/1991 |
| EP | 0464562 | 1/1992 |
| EP | 0480558 | 4/1992 |
| EP | 0498130 | 8/1992 |
| EP | 0507110 | 10/1992 |
| EP | 0529834 | 3/1993 |
| EP | 0538319 | 4/1993 |
| EP | 0631283 | 12/1994 |
| EP | 0632371 | 1/1995 |
| EP | 0711076 | 5/1996 |
| EP | 0786122 | 7/1997 |
| EP | 0817103 | 1/1998 |
| EP | 0841616 | 5/1998 |
| EP | 0919964 | 6/1999 |
| EP | 0959570 | 11/1999 |
| EP | 0974896 | 1/2000 |
| EP | 0974941 | 1/2000 |
| EP | 0982695 | 3/2000 |
| EP | 1001391 | 5/2000 |
| EP | 1170951 | 1/2002 |
| EP | 1288802 | 3/2003 |
| EP | 1408427 | 4/2004 |
| EP | 1549919 | 4/2004 |
| EP | 1962251 | 8/2008 |
| FR | 2602352 | 2/1988 |
| FR | 2808906 | 11/2001 |
| GB | 2122799 | 1/1984 |
| GB | 2166328 | 4/1986 |
| GB | 2170943 | 8/1986 |
| GB | 2193420 | 2/1988 |
| GB | 2238680 | 6/1991 |
| GB | 2254469 | 10/1992 |
| GB | 2259398 | 3/1993 |
| GB | 2262170 | 6/1993 |
| GB | 2380377 | 4/2003 |
| GB | 2505584 | 8/2014 |
| JP | 57173207 | 10/1982 |
| JP | 58-179892 | 10/1983 |
| JP | 60-253082 | 12/1985 |
| JP | 61084143 | 4/1986 |
| JP | 62-192849 | 8/1987 |
| JP | 62-284496 | 12/1987 |
| JP | 63-60634 | 3/1988 |
| JP | 2-153665 | 6/1990 |
| JP | 5-74078 | 3/1993 |
| JP | 5122282 | 5/1993 |
| JP | 07281682 | 10/1995 |
| JP | 07-311587 | 11/1995 |
| JP | 8274812 | 10/1996 |
| JP | 08279235 | 10/1996 |
| JP | 08289976 | 11/1996 |
| JP | 928918 | 2/1997 |
| JP | 9114470 | 5/1997 |
| JP | 9127964 | 5/1997 |
| JP | 09-244900 | 9/1997 |
| JP | 10-098344 | 4/1998 |
| JP | 10-222537 | 8/1998 |
| JP | 11-003088 | 1/1999 |
| JP | 11-024686 | 1/1999 |
| JP | 11-095768 | 4/1999 |
| JP | 2002-83640 | 3/2002 |
| JP | 2002-537584 | 11/2002 |
| JP | 2003-076380 | 3/2003 |
| JP | 2003-084903 | 3/2003 |
| JP | 2003-099072 | 4/2003 |
| JP | 2005-107267 | 4/2005 |
| JP | 2005-184237 | 7/2005 |
| JP | 2006-048076 | 2/2006 |
| JP | 2007-034253 | 2/2007 |
| JP | 2007-041722 | 2/2007 |
| JP | 2007/505410 | 3/2007 |
| JP | 07504517 | 3/2007 |
| JP | 2007-102982 | 4/2007 |
| JP | 2007-104072 | 4/2007 |
| JP | 2007-128609 | 5/2007 |
| JP | 2007-164078 | 6/2007 |
| JP | 2007-164298 | 6/2007 |
| JP | 2007/179333 | 7/2007 |
| JP | 2007-241748 | 9/2007 |
| JP | 2008-058656 | 3/2008 |
| JP | 2009-017529 | 1/2009 |
| JP | 2009-075540 | 4/2009 |
| WO | WO 86/01326 | 2/1986 |
| WO | WO 90/00429 | 1/1990 |
| WO | WO 90/07843 | 7/1990 |
| WO | WO 91/08542 | 6/1991 |
| WO | WO 91/20082 | 12/1991 |
| WO | WO 93/16557 | 8/1993 |
| WO | WO 93/18465 | 9/1993 |
| WO | WO 93/021732 | 10/1993 |
| WO | WO 94/03894 | 2/1994 |
| WO | WO 94/14273 | 6/1994 |
| WO | WO 94/15306 | 7/1994 |
| WO | WO 94/15416 | 7/1994 |
| WO | WO 95/03609 | 2/1995 |
| WO | WO 95/29537 | 11/1995 |
| WO | WO 96/12255 | 4/1996 |
| WO | WO 96/12256 | 4/1996 |
| WO | WO 96/12257 | 4/1996 |
| WO | WO 96/12258 | 4/1996 |
| WO | WO 98/07940 | 2/1998 |
| WO | WO 98/11487 | 3/1998 |
| WO | WO 98/45835 | 10/1998 |
| WO | WO 99/35753 | 7/1999 |
| WO | WO 01/00290 | 1/2001 |
| WO | WO 01/08148 | 2/2001 |
| WO | WO 01/71608 | 9/2001 |
| WO | WO 02/060546 | 8/2002 |
| WO | WO 02/095752 | 11/2002 |
| WO | WO 01/084353 | 1/2003 |
| WO | WO 03/069613 | 8/2003 |
| WO | WO 2004/029775 | 4/2004 |
| WO | 2005/026916 | 3/2005 |
| WO | WO 2006/014739 | 2/2006 |
| WO | WO 2006/056933 | 6/2006 |
| WO | WO 2007/092542 | 8/2007 |
| WO | WO 2008-033853 | 3/2008 |
| WO | WO 2011094330 | 8/2011 |
| WO | WO 2013/040603 | 3/2013 |

OTHER PUBLICATIONS

Ahanger et al.; A Digital On-Demand Video Service Supporting Content-Based Queries; 1993; 9 pages.
Austin Cyber Limits: Name That Tune [online], [retrieved Jul. 23, 2001]. Retrieved from the Internet: <http://www.pbs.ork/klru/austin/games/namethattune.html>.
Back to the Tunes [online], [retrieved Jul. 23, 2001]. Retrieved from the Internet: <http://citc5.hispeed.com/rules.html>.
Bonczek et al, "The DSS Development System", 1983 National Computer Conference, Anaheim, California, May 16-19, 1983, pp. 441-455.
Chan et al., "Distributed servers architectures for networked video services", IEEE Trans on Networking, vol. 9, No. 2, pp. 125-136, 2001.
Chen et al., "Optimization of the grouped sweeping scheduling (GSS) with heterogeneous multimedia streams", ACM Multimedia, pp. 1-7, 1993.
Crutcher et al., "The networked video Jukebox", IEEE, Trans. on circuits and systems for video technology, vol. 4, No. 2, pp. 105-120, 1994.
"Darts Revolution Again", Replay Magazine, Mar. 1991, pp. 146-148.
Decision of the European Patent Office to revoke the related EP Patent No. 786 125, Feb. 17, 2005.

(56) References Cited

OTHER PUBLICATIONS

Derfler et al., "How Networks Work", Millennium Ed., Que Corporation, Jan. 2000.
Drews, C.; Pestoni, F.; "Virtual jukebox: reviving a classic," Proceedings of the 35th Annual Hawaii International Conference System Sciences, pp. 887-893, Jan. 7-10, 2002.
"Ecast Forges Landmark International Technology Partnership", Business Wire at www.findarticles.com/cf_0/m0EIN/2000_July_25/63663604/print.html, 2 pages, Jul. 25, 2000.
"Ecast Selects Viant to Build Siren Entertainment System (TM)", ScreamingMedia, PR Newswire San Francisco, industry.java.sum.com/javanews/stories/story2/0,1072,17618,00.html, 3 pages, Aug. 3, 1999.
European Search Report from EP 1 993 079.
European Search Report issued for European Application No. 08000845.1-1238/1962251, dated Apr. 3, 2009.
Fachbuch, "Unterhaltungselektronic von A-Z" gfu 1, VDE-Verlag GmbH, pp. 12-13, 1983-1984.
"Foobar 2000 Evaluation Updated," MonkeyBiz, Aug. 3, 2008, 4 pages. (with partial English translation). http://monkeybizinfo.blogspot.jp/2008/08/foobar2000.html.
Gallardo et al., "Tangible Jukebox: back to palpable music", ACM TEI, pp. 199-202, 2010.
Gralla, "How the Internet Works", Millennium Ed., Que Corporation, Aug. 1999.
Grimes, Chapter 18, "Taking Advantage of Web-based Audio".
Hewlett-Packard Development Co; HP Open View Storage Data Protector Admin's Guideline Manual Edition; May 2003; Copyright 2003, 60 pages http://h20000.www2.hp.com/bc/docs/support/SupportManual/c00663793l/c00663793.pdf.
Hicks et al., "Dynamic software updating", ACM PLDI, pp. 13-23, 2001.
IBM Technical Disclosure Bulletin, vol. 30, No. 5, Oct. 1987, "Method for Automated Assembly of Software Versions", pp. 353-355.
IBM Technical Disclosure Bulletin, vol. 32, No. 9A, Feb. 1990, "Robotic Wafer Handling System for Class 10 Environments" pp. 141-143.
IBM Technical Disclosure Bulletin, vol. 33, No. 12, May 1991, "High-speed Opens and Shorts Substrate Tester", pp. 251-259.
IBM Technical Disclosure Bulletin, vol. 41, No. 1, Jan. 1998, "Safe Mechanism for Installing Operating System Updates with Applications," pp. 557-559.
ITouch 8 Plus brochure, JVL Corporation, 2005, 2 pages.
ITOUCH 27 New Games brochure, JVL Corporation, 2005, 2 pages.
Johnny Rockets Name That Tune [online], [retrieved Mar. 7, 2002]. Retrieved from the Internet: <http://www.johnnyrockets.com/docs/funstuff.html>.
Koskelainem, "Report on Streamworks™".
Kozierok, The PC Guide, Site Version 2.2.0, http://www.pcguide.com, Apr. 17, 2001.
Kraiss et al., "Integrated document caching and prefetching in storage hierarchies based on Markov chain predictions", The VLDB Journal, vol. 7, issue 3, pp. 141-162, 1998.
Liang et al., "Dynamic class loading in the Java virtual machine", ACM OOPSLA, pp. 36-44, 1998.
Look and iTouch brochure, JVL Corporation, 2004, 2 pages.
Ludescher et al., "File Storage Management for TFTF physics data", IEEE, pp. 856-859, 1992.
Megatouch Champ brochure, Merit Industries, Inc., 2005, 2 pages.
Melnik et al., "A mediation infrastructure for digital library services", ACM DL, pp. 123-132, 2000.
Merriam Webster's Collegiate Dictionary, Tenth Edition, Merriam-Webster, Inc., p. 361 (definition of dynamically).
Mickey B's Jukebox Revue—Name That Tune! [online], [retrieved Jul. 23, 2001]. Retrieved from the Internet: <http://mickeyb.com/tune/>.
Mod Box Internet brochure, Merit Entertainment, 2006, 2 pages.
Newsome et al., "Proxy compilation of dynamically loaded java classes with MoJo", ACM LCTES, pp. 204-212, Jun. 2002.
Outlaw, Computer Technology Review, "Virtual Servers Offer Performance Benefits for Network Imaging", 1993.
Patent Abstract of Japan vol. 95, No. 010 & JP 07 281682 A (Naguo Yuasa), 27 Oct. 1 JP 07 281682, figure 1-6 abrége.
Peter Pawlowski, "Basic Player Whose Appearance and Functions can be Customized Freely 'Foobar 2000' v1.0 is Unveiled," Windows Forest, Japan, Jan. 12, 2010, 3 pages (with partial English translation). http://forest.impress.co.jp/docs/news/20100112_341870.html.
Pohlmann, "Principles of Digital Audio", Third Edition, 1995.
PR Newswire, Press Release, "MusicMatch Announces Commerical Availability of Meta Trust Certified MusicMatch jukebox", New York; Nov. 15, 1999, extracted from Internet, http://proquest.umi.com on Sep. 17, 2002.
Rollins et al., "Pixie: A jukebox architecture to support efficient peer content exchange", ACM Multimedia, pp. 179-188, 2002.
Schneier, "Applied Cryptography", Second Edition, John Wiley & Sons, Inc. New York, 1996.
Sprague et al., "Music selection using the partyvote democratic Jukebox", ACM AVI, pp. 433-436, 2008.
Stevens, "TCP/IP Illustrated: vol. 1, the Protocols".
Stewart, "Ecast Deploys Marimba's Castanet to Power an Internet-Based, Entertainment Management System for the Out-of-Home Market", Marimba, Press Release, 3 pages, www.marimba.com/news/releases/ecast.dec13.html, Dec. 13, 1999.
Strauss et al., "Information Jukebox A semi public device for presenting multimedia information content", Pers. Ubiquit Comput, 7, pp. 217-220, 2003.
Summary of the oral proceedings regarding EP 786 125 before the Opposition Division of the European Patent Office, Feb. 17, 2005.
Tom & Liz's Name That Tune [online], [retrieved Jul. 23, 2001]. Retrieved from the Internet: <http://home.att.net/~tomnliz/Music.html>.
U.S. Appl. No. 29/371,355, Garneau et al., filed Dec. 14, 2010.
U.S. Appl. No. 61/536,015, filed Sep. 18, 2011; Rivera et al.
U.S. Appl. No. 29/401,854, filed Sep. 16, 2011; Garneau et al.
U.S. Appl. No. 61/129,637, Dion, filed Jul. 9, 2008.
U.S. Appl. No. 61/202,617, Dion, filed Mar. 18, 2009.
U.S. Appl. No. 61/584,750, filed Jan. 9, 2012; Rivera et al.
Vortex Brochure, JVL Corporation, 2005, 2 pages.
Waingrow, "Unix Hints & Hacks", Que Corporation, Indianapolis, IN, 1999.
White, "How Computers Work", Millennium Ed., Que Corporation, Indianapolis, IN, Sep. 1999 (Sep. 22, 1999).
Yuki Murata, iTunes no 'Kankyo Settei' Catalog & Tips 10 Sen, Mac People, ASCII Corporation, Oct. 1, 2007.
Written Opinion issued in PCT/US1122598, dated Mar. 29, 2011.
Hoppers, "Jukebox Aesthetics in the Swing Era," Article Jun. 30, 2009, retrieved Jul. 27, 2015, pp. 1-36. www.jitterbuzz.com/jukeboxes_aesthetics.html.

\* cited by examiner

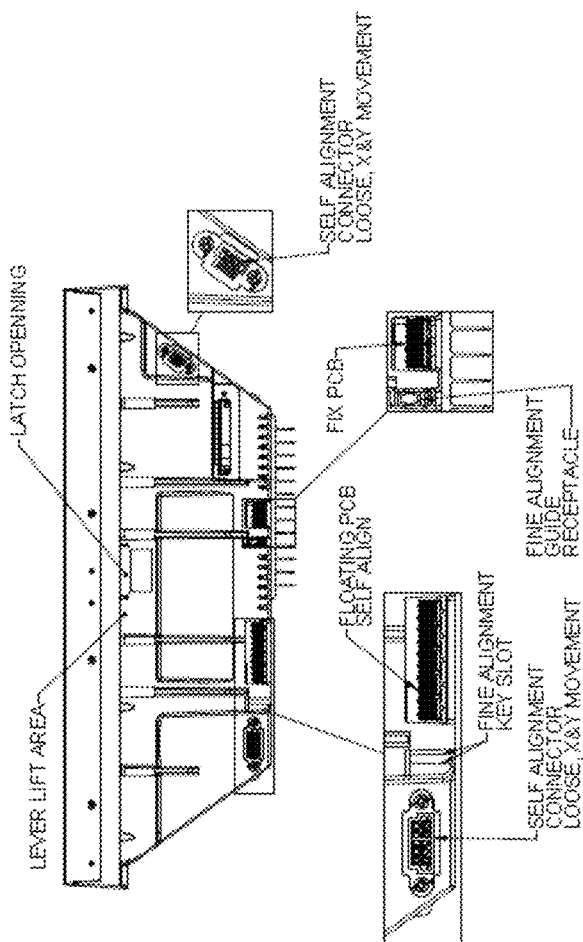
FIG. 50
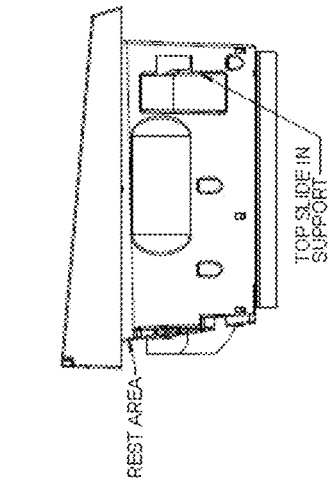
FIG. 52
FIG. 49
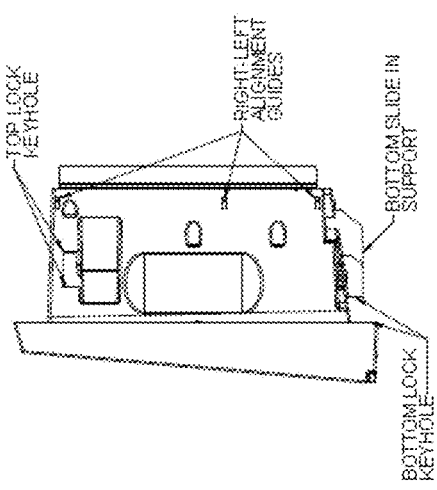
FIG. 51

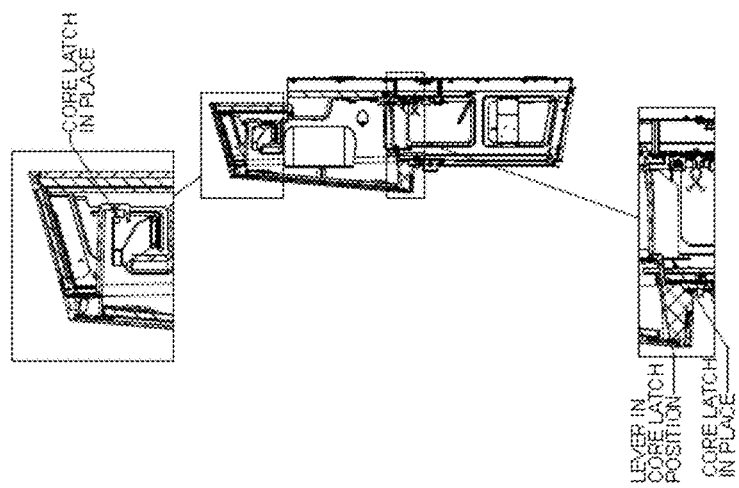
FIG. 56
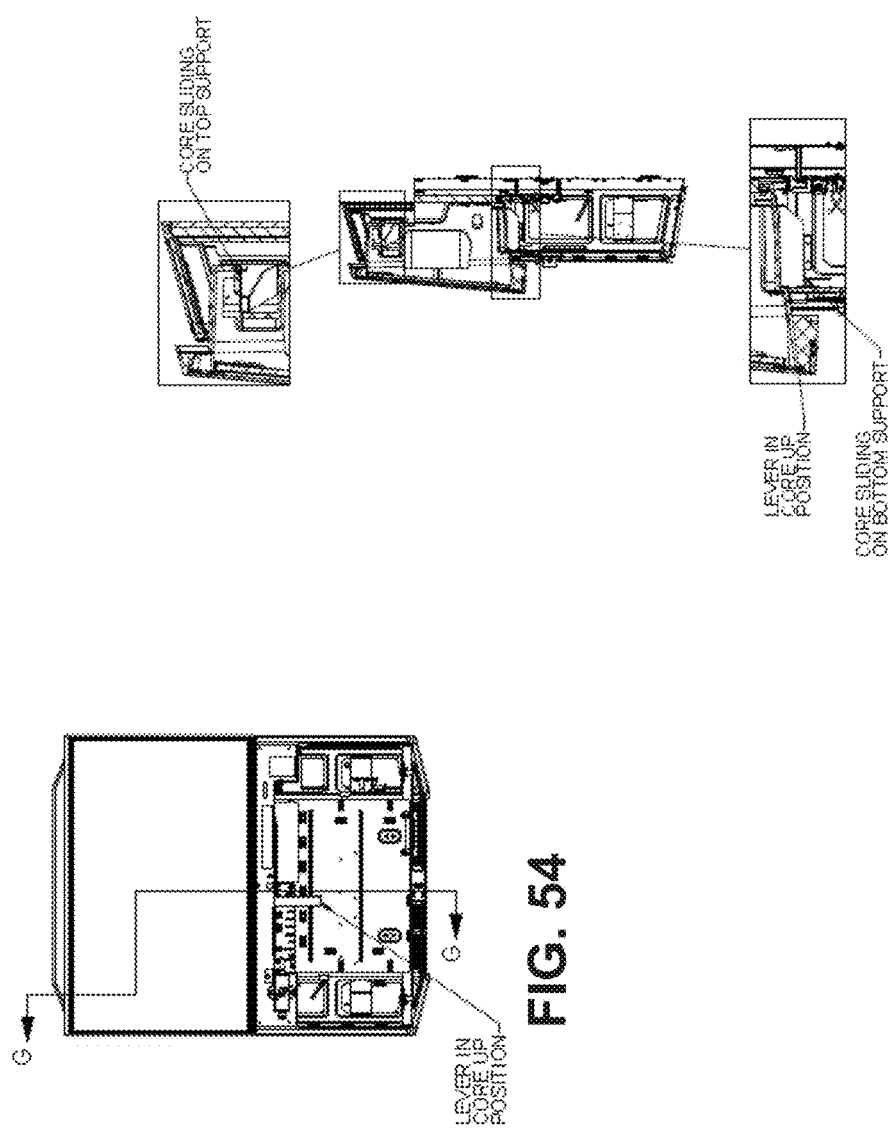
FIG. 55
FIG. 54

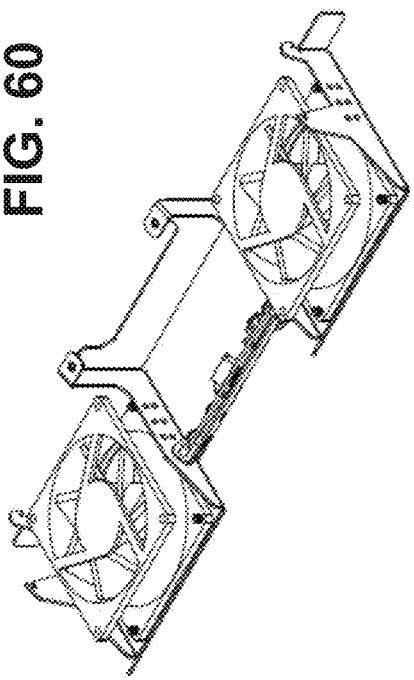
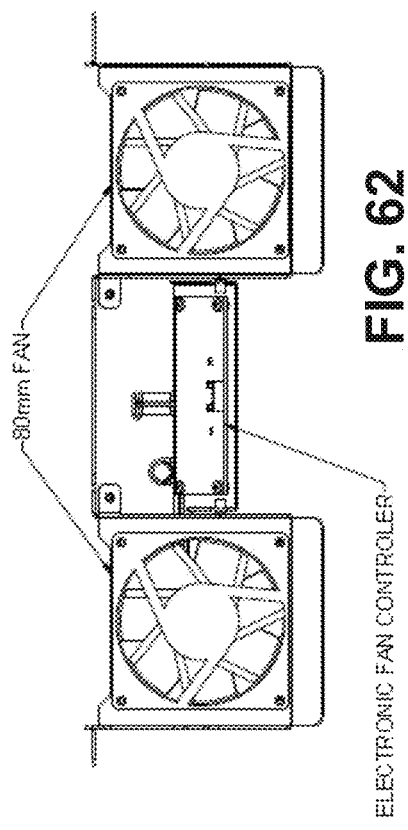
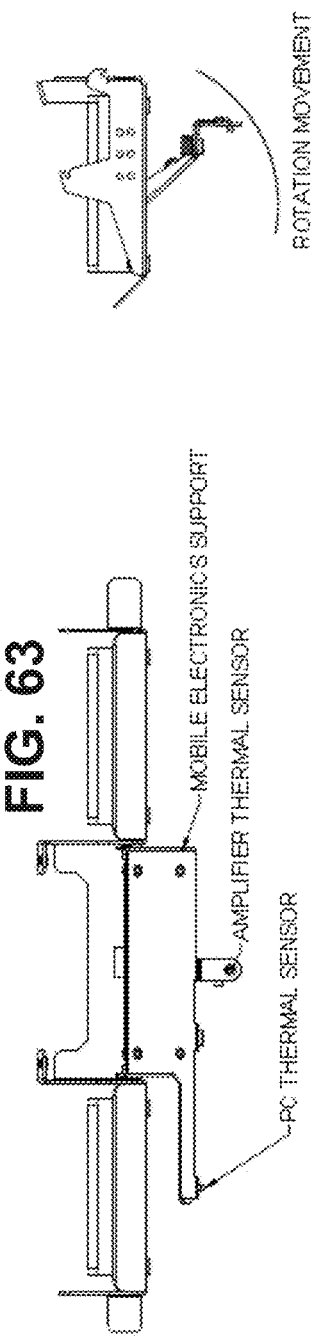
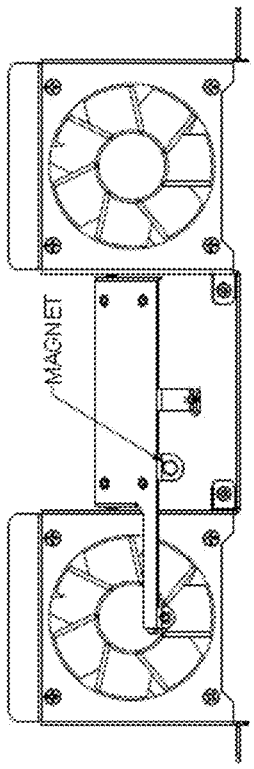

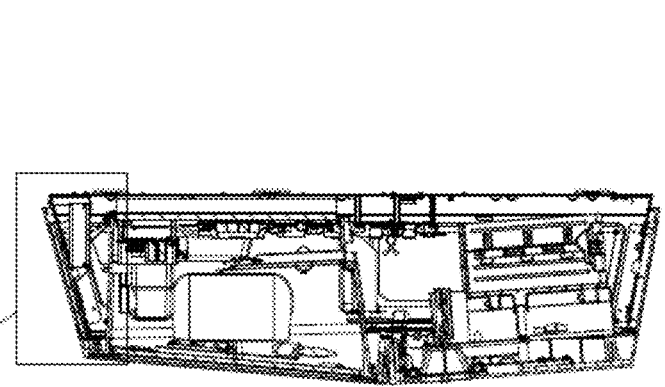
FIG. 67
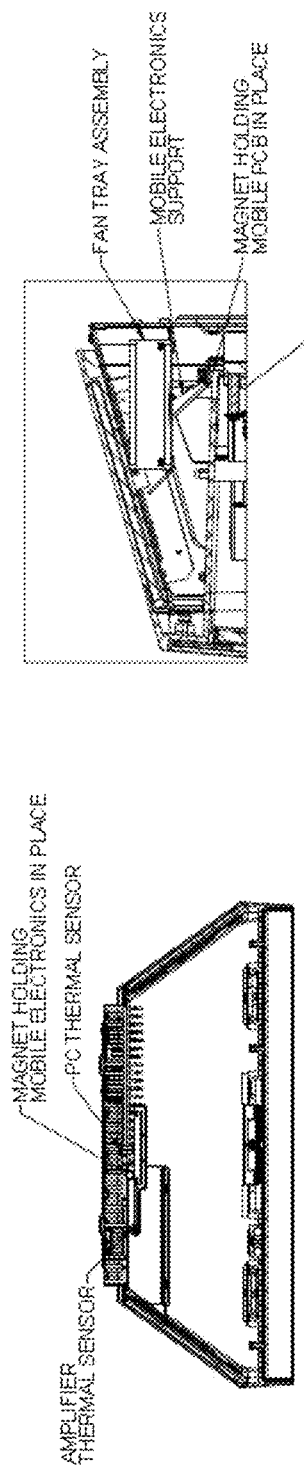
FIG. 68
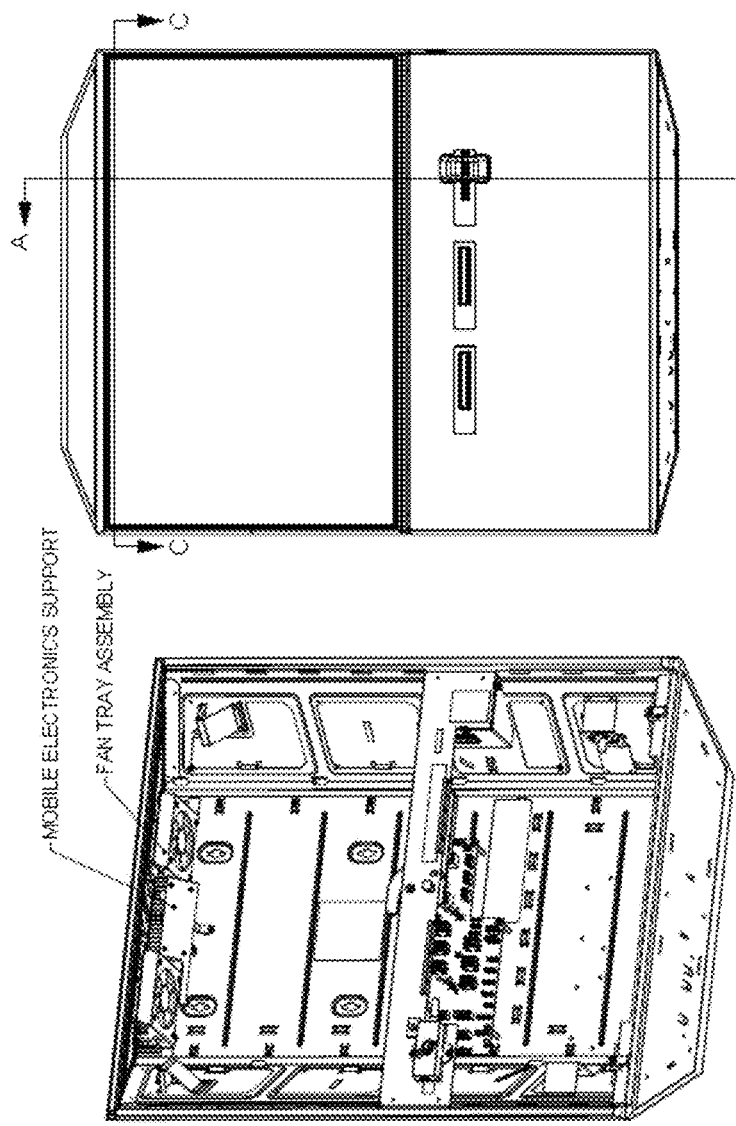
FIG. 66
FIG. 65

Fig. 70a

| Field | Example | Definition |
|---|---|---|
| Profile ID | 123456789ABC | TT Assigned Profile ID created in section 2.a. |
| Default Profile | YES / NO | Indicates whether a profile is designated as a default. There can be only one active default profile in a territory. |
| Profile Name | DEFAULT – US<br>DEFAULT – CA<br>DEFAULT – UK<br>FAMILY FRIENDLY<br>LATIN BAR | Internal profile title description that can be edited in the profile details screen. |
| Parent – Profile – ID | Default – UK | Display of the profile's hierarchical parent. |
| Territory | US<br>CA<br>UK<br>Etc. | Indicates which territory the profile will be available. Territories are defined based on both the catalog's geographical location and the music licensing rules. |
| Package | 1 | Associating a profile to a package. Only active playlist channels will be available in a profile. A package is tied to background music playlists. |
| Sub-Catalog (Filtering) | By Genre<br>By Style<br>By Album<br>By Artist<br>By Song<br>By Explicit<br>By Maturity<br>Lyric Verified | A link to filtering criteria that can be managed at a profile level. For example, a Family Friendly profile will exclude songs with the "Explicit" content flag checked and the "Lyric Verified" flag unchecked. |
| Profile Status | Active (On)<br>Inactive (Off) | Determines the availability of a profile in the new Openstage. Can be set to Active or Inactive. Only "Active" profiles will be published to the network. |
| Translation | English<br>Spanish<br>French<br>UK English | Determines whether a Profile should be assigned based on the default language setting for an individual jukebox. More language translations must be supported. |
| Description | This is the default playlist... | Internal free form text used to describe the profile |

PROFILE HEADER

Fig. 70b

| | | | |
|---|---|---|---|
| TILE DEFINITION | Tile Section | Home Carousel | Tile definition, presentation rules, and distribution rules must be defined for Homepage Carousel and Browse Playlists Grid |
| | | Browse Playlists Grid | |
| | Sequence Type | 1-N | Sequence of a Tile on the carousel from left to right and on the grid view in the other Tile Sections. A Tile sequence can be pre-determined in the profile by entering in a numerical sequence in ascending order (1, 2, 3) or by choosing to let the jukeboxes local popularity drive sequencing. |
| | | Local Popularity, Profile Popularity, Network Pop | |
| | Tile Definition | Network (Static) | Determines whether a tile is pre-assigned by the Music Ops team to reference specific content (Playlist, Album, Artist, Song). If Local (dynamic) is selected, the profile must allow the local jukebox popularity to assign content to a tile based on the highest local popularity. |
| | | Local (Dynamic) | |
| | Tile ID | 123456789ABC | TT assigned ID for the featured asset and it's profile association. If the Tile Selection is "Local (Dynamic)", the Tile ID will be determined by pulling the Most Popular (based on Local Popularity) content (Playlists, Artists, Albums, Songs) |
| | | Most Popular Local Content | |
| | Tile Type | Song | Type of Asset that will be featured (e.g. Genre, Playlist, Artist, Album, Song). Playlist encompasses the three types: Genre, New & Hot, Themes / Best Of |
| | | Artist | |
| | | Album | |
| | | Playlist | |
| | Internal Asset ID | 1234567890ABC | TT assigned ID for the asset. Must be either it's playlist ID, genre ID, album ID, artist ID, or song ID. |
| | Tile Name | Featured Artist | Internal Tile display name of MP asset |
| | Song Sorting | Sequenced | For Playlists associated to a profile, a Music Ops user can pre-determine the default song sorting criteria for a playlist.

For clarification, there is no requirement to have this field enabled (available) for featured Artist, Album, and Song. |
| | | Alphabetical (A-Z) | |
| | | Local Popularity | |
| | | Profile Popularity | |
| | | Network Popularity | |
| | | Release Date (Ascending) | |
| | | Release Date (Descending) | |

Fig. 71b

| | | |
|---|---|---|
| Tile Sequence Type | 1-N | Sequence of a Tile on the carousel from left to right and on the grid view in the other Tile Sections. A Tile sequence can be pre-determined in the profile by entering in a numerical sequence in ascending order (1, 2, 3) or by choosing to let the jukeboxes local popularity drive sequencing. |
| | Local Popularity, Profile Popularity, Network Pop | |
| Tile Name | Staff Favorites | Internal name of tile that is searchable in MP |
| Tile ID | 123456789ABC | TT assigned ID for the featured asset and it's profile association. If the Tile Selection is "Local (Dynamic)", the Tile ID will be determined by pulling the Most Popular (based on Local Popularity) content (Playlists, Artists, Albums, Songs) |
| Internal Asset ID | 1234567890ABC | TT assigned ID for the asset. Must be either it's playlist ID, genre ID, album ID, artist ID, or song ID. |
| Tile Definition (Dynamic, Static) | Static | Determines whether a tile is pre-assigned by the Music Ops team to reference specific content (Playlist, Album, Artist, Song). If Local (dynamic) is selected, the profile must allow the local jukebox popularity to assign content to a tile based on the highest local popularity. |
| | Dynamic (Local), Dynamic (Profile), Dynamic (Network) | |
| Tile Type | Song | Type of Asset that will be featured (e.g. Genre, Playlist, Artist, Album, Song). Playlist encompasses the three types: Genre, New & Hot, Themes / Best Of |
| | Artist | |
| | Album | |
| | Playlist | |
| Credits | 0, 1, 2, 3 | An override of credits for songs associated to a tile. Regardless of a songs credit price on a jukebox, this will allow the music team to override credit pricing in special circumstances (for example: Discount Happy Hour) |
| Tab | Blue Tab Text Box | Allows users to enter text that will display on the blue tab of a tile. If no text is entered there should not be a blue tab on the jukebox. |
| No Text | Y/N | If selected, the black text box overlay will not be displayed and text cannot be entered in line 1, 2, 3. The expectation is that this will be used with a |

Fig. 71c(1)

| | | |
|---|---|---|
| | | custom upload of an image where they do not want to display the text black bar description. |
| Translations | US English | When a profile is associated to a jukebox, it should contain tile text for each of the four supported languages in OpenStage 2.0. When text is entered in the lines (1, 2, 3) they can vary based on which language is selected on the jukebox. This is very similar to how we manage translations today on playlists. |
| | French | |
| | Spanish | |
| | UK English | |
| Text Line 1 | Featuring | First line of text on a Tile's black bar overlay |
| Text Line 2 | The Rolling | Second line of text on a Tile's black bar overlay |
| Text Line 3 | Stones | Third line of text on a Tile's black bar overlay |
| Artwork Type | Artist Image | Allows the user to pre-determine how artwork should be displayed on a tile. |
| | 1 X Album | |
| | 4 X Album | |
| | Custom upload (Override) | |
| Artwork Refresh | Weekly | How frequently should artwork refresh for 1X or 4X album images. |
| | Daily | |
| | Session | |
| Plus Sign Button | Button | When clicked, it should prompt the user to upload an image to the tile from Artman. This will be the method for associating "custom upload" override images on tiles. |
| Song Sorting | Sequenced | For Playlists associated to a profile, a Music Ops user can pre-determine the default song sorting criteria for a playlist.<br><br>For clarification, there is no requirement to have this field enabled (available) for featured Artist, Album, and Song. |
| | Alphabetical (A-Z) | |
| | Local Popularity | |
| | Profile Popularity | |
| | Network Popularity | |
| | Release Date (Ascending) | |
| | Release Date (Descending) | |

Fig. 71c(2)

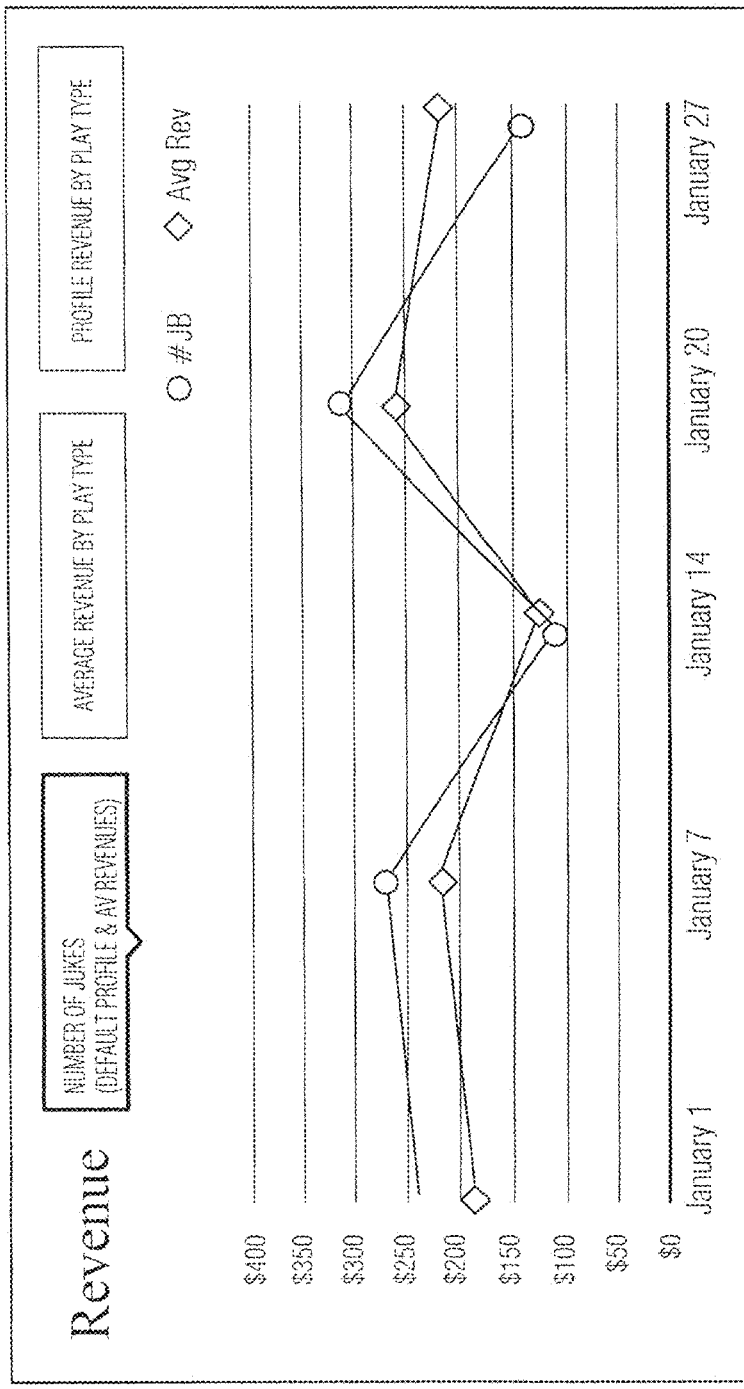
Fig. 73a(1)

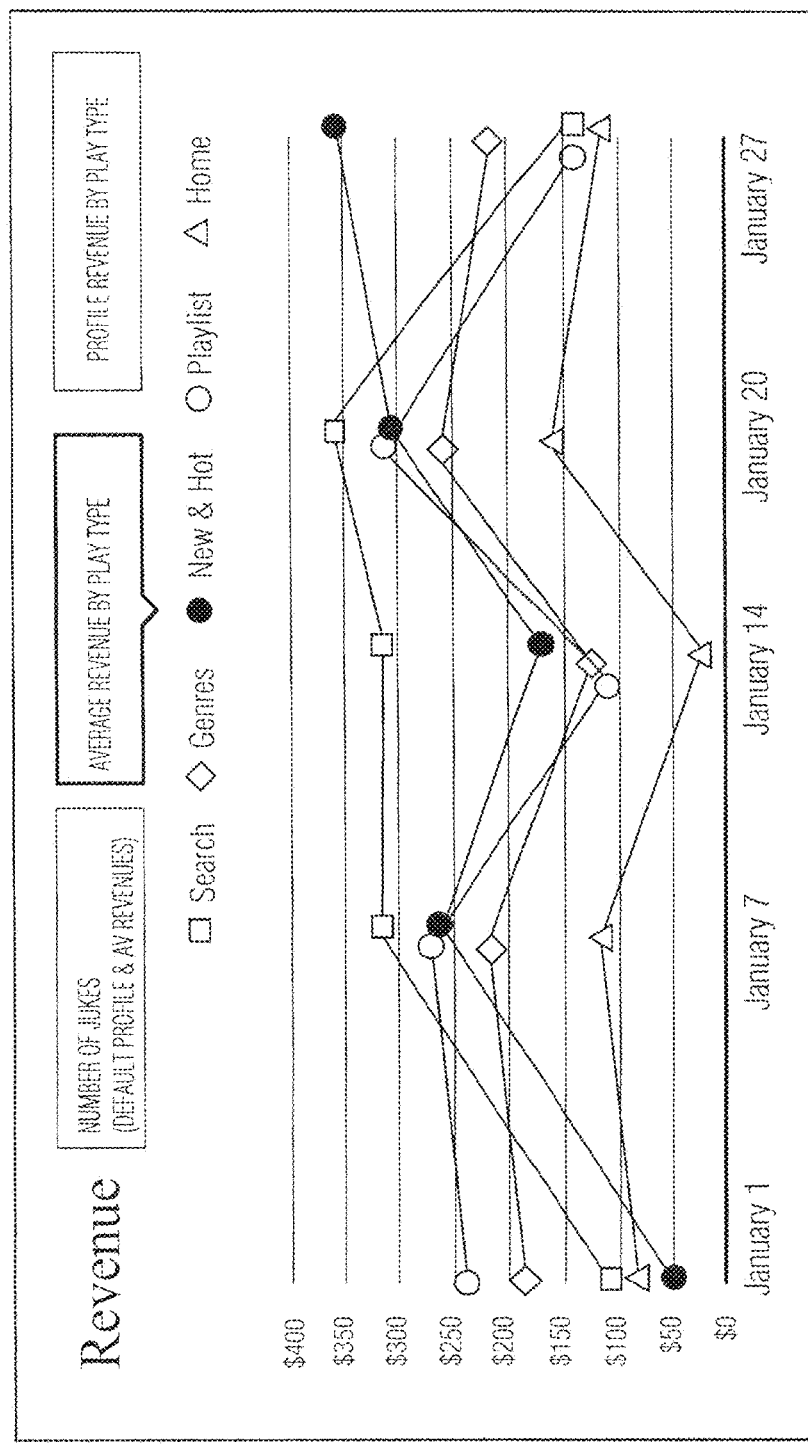
Fig. 73a(2)

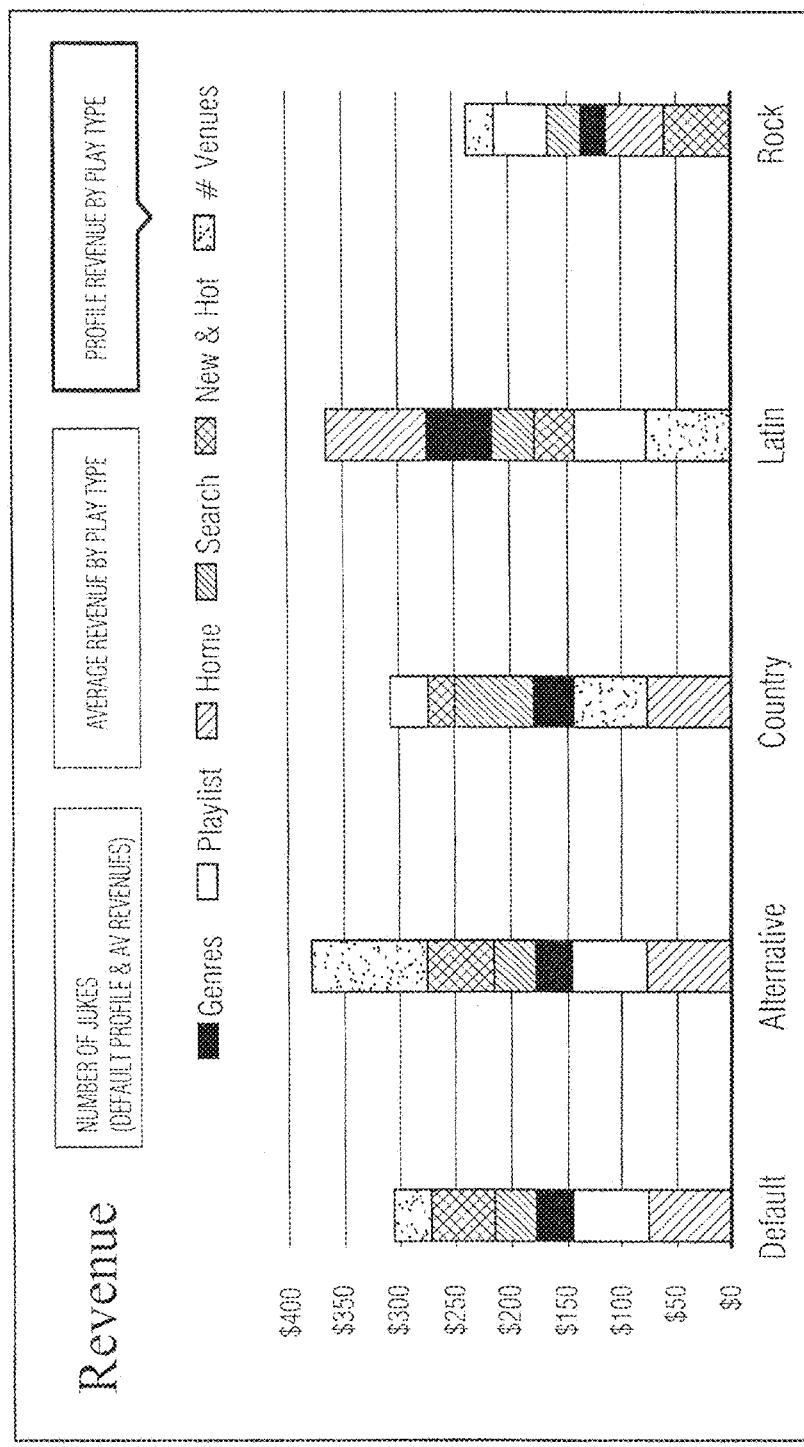
Fig. 73a(3)

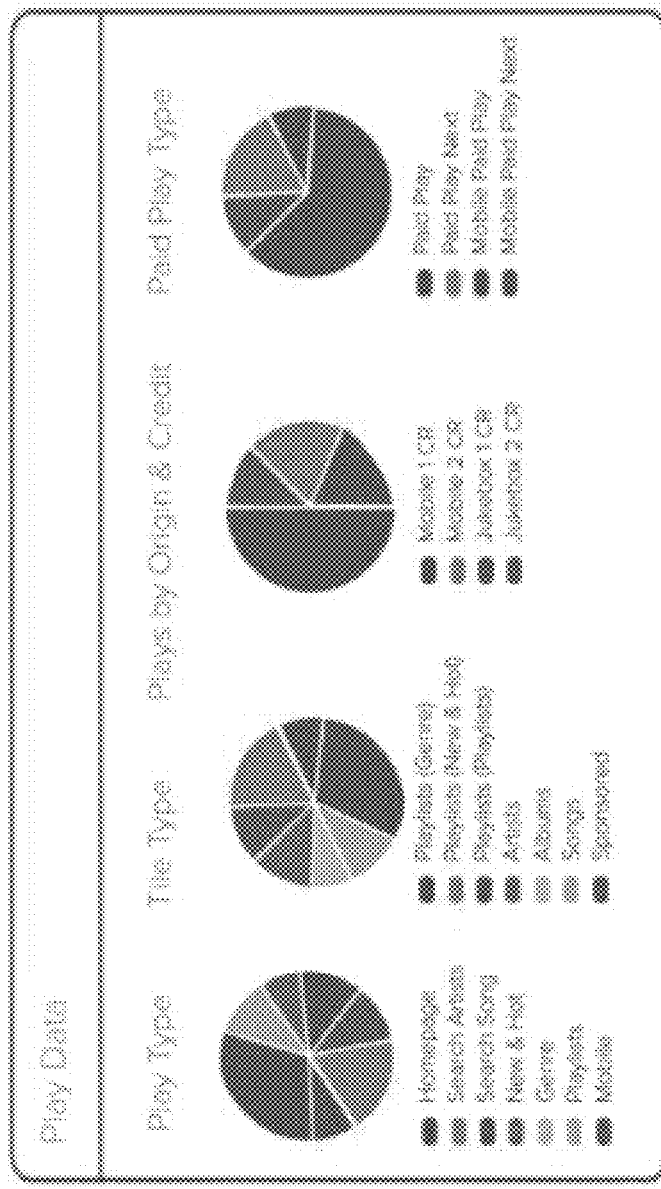
Fig. 73(a)(4)
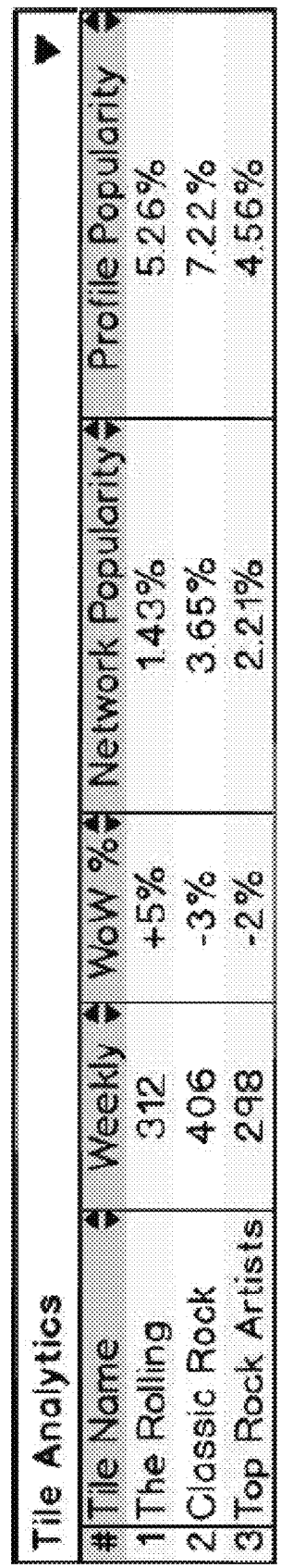
Fig. 73b

Fig. 74

DIGITAL JUKEBOX DEVICE WITH IMPROVED USER INTERFACES, AND ASSOCIATED METHODS

CROSS-REFERENCES TO RELATED APPLICATIONS

This is a continuation of application Ser. No. 14/886,070 filed Oct. 18, 2015, which is a divisional of application Ser. No. 14/668,228 filed Mar. 25, 2015, which claims the benefit of U.S. Application No. 61/970,338 filed on Mar. 25, 2014, the entire contents of each of which are hereby incorporated by reference herein.

This application incorporates by reference the entire contents of U.S. Application Nos. 61/920,688 and 29/477,654, both filed Dec. 24, 2013.

This application also incorporates by reference the entire contents of U.S. application Ser. No. 13/833,173 filed Mar. 15, 2013, which is a continuation-in-part (CIP) of U.S. application Ser. No. 13/621,922 filed Sep. 18, 2012, which claims the benefit of Provisional Application Nos. 61/584,750 filed Jan. 9, 2012 and 61/536,015 filed Sep. 18, 2011.

This application also incorporates by reference the entire contents of U.S. application Ser. No. 13/138,660 filed Mar. 5, 2012, which is a National Stage Application of International Application No. PCT/US2010/000799 filed Mar. 17, 2010, which claims the benefit of Provisional Application No. 61/202,617 filed Mar. 18, 2009.

This application also incorporates by reference the entire contents of U.S. application Ser. No. 12/929,466 filed Jan. 26, 2011, which claims the benefit of Provisional Application Nos. 61/431,036 filed Jan. 9, 2011 and 61/298,509 filed Jan. 26, 2010.

TECHNICAL FIELD

Certain exemplary embodiments relate to entertainment systems and, more particularly, certain exemplary embodiments relate to jukebox systems that incorporate digital downloading jukebox features and improved user interfaces.

BACKGROUND AND SUMMARY

Jukeboxes have been around for decades and provide users with the ability to select desired music for reproduction in a convenient and advantageous manner. Jukeboxes conventionally have been provided in commercial establishments, such as restaurants and bars, in order to provide desired music on demand for patrons thereof for a fee. Over the last several years, a new generation of jukebox devices have become available that provide significant improvements in the operation thereof for all parties involved. More specifically, the conventional standalone phonorecord and CD jukeboxes are being replaced by digital downloading jukeboxes that are controlled by and communicate with a central server. An example of this new generation jukebox system is shown in U.S. Pat. No. 6,308,204, the entire disclosure of which is incorporated herein by reference. A leading provider of this new generation of jukebox systems is TouchTunes Music Corporation.

FIG. 1 shows an overview of an exemplary embodiment of a digital downloading jukebox system 10. As shown in FIG. 1, the jukebox system 10 includes a central server 12 that contains a master library of audio content (typically music), as well as or alternatively audiovisual content (typically music and associated video or graphics), that can be downloaded therefrom. The jukebox system also includes a series of remote jukebox devices 16, 16a-16f. Each of these jukebox devices are generally located in a bar, restaurant, club, or other desired location, and are operable to play music (e.g., from a suitable storage location such as, for example, from a local server, a central and potentially remote server, from local storage, etc.) in response to receiving a payment from a user, such as coins, bills, credit/debit card, etc., and having one or more songs selected by the user for play. In an alternative embodiment, a music service is paid for on a subscription basis by the location, and the selected music is free for the end-user. The jukebox device 16 typically includes a screen 18 that presents information to the user and allows the user to select songs therefrom, as well as an audio system 20 that plays the selected songs. The screen 18 may also be used for displaying song-related video or graphics. The screen 18 may also be used to display advertisements for the jukebox itself in order to attract customers thereto, to display other types of advertisements, and/or to display any other desired information.

The jukebox devices 16 (sometimes referred to herein as simply "jukeboxes") are operable to communicate with the central server 12 through a communications network 14, such as, for example, the Internet. The jukeboxes 16 periodically communicate with the server 12 in order to provide information to the server 12 regarding the specific songs that have been played on the jukebox. The central server then uses this information in order to determine the appropriate royalties and/or other payments that are owed for songs played on each jukebox. Thus, one advantage of this new generation of jukeboxes is that the sound reproduction and/or other applicable music rights can be adhered to in a more accurate and reliable manner, thereby assuring the proper royalties are paid to the artists or music owners. The central server 12 can also provide new songs to the jukebox 16 in order to assure that the appropriate or most popular songs are maintained on the jukebox based on the specific customers at that location. Thus, the songs available on each jukebox can be customized through communication with the central server in order to provide the songs and/or types of music that customers generally request at each jukebox location. As described in the above-referenced U.S. Pat. No. 6,308,204, the central server can also advantageously be used to update the operating software on the jukeboxes in order to, for example, change the operation of the jukebox, such as to provide new or improved features. Thus, another advantage of this new generation of jukeboxes is that the songs (or other audio and/or visual content), and the operation of the jukebox itself can be remotely changed as desired without the need to have someone (such as a routeman) personally service the jukebox. Instead, such updates can be done using the central server 12.

As indicated above, the jukebox devices 16 each include a mass storage device, such as a hard drive, which stores the songs and associated video/graphics data (if any), as well as any other desired graphical information for reproduction on the jukebox. The mass storage device of the jukebox typically has limited storage capacity relative to the storage device of the central server 12. As a result, only a fraction of the songs stored on the central server are typically stored on the mass storage device of the jukebox at any one time. There may be other reasons as well, such as for security of the data or limited room in the jukebox itself, for having limited storage capacity on the jukebox and/or limiting the number of songs stored thereon. For example, physical space may be limited on wall-mount jukeboxes or the like, which are designed to be small in size as compared to free-standing models. As explained above, the songs on the jukebox can be changed through communication with the central server, but typically any one jukebox only stores a relatively small subset of the complete library of songs maintained by the central server at any one time.

In order to increase the revenue that a jukebox generates, making the most desired or popular songs available on the jukebox over time may be seen as an advantage. If customers cannot find songs they like on the jukebox, usage of the jukebox (and the revenue generated thereby) can decrease. On the other hand, it is not always possible to predict in advance exactly what a customer at any particular location will desire to play on the jukebox. In fact, there are likely many instances where a customer would have selected a song that exists on the central server but is not currently present on the jukebox. As a result, the jukebox may not be enjoyed and used to its fullest extent. In order to address this problem and increase revenue, jukebox systems have in the past provided a feature that enables the user to search for songs on the central server from the jukebox and request an immediate download of a desired song from the central server to the jukebox for an additional fee. This feature enables the user to play any song in the master library of songs maintained by the central server using the jukebox, regardless of whether or not the specific song is presently stored in the mass storage of the jukebox itself. Thus, the user can first look for desired songs on the local storage of the jukebox and then, if desired, search further on the central server for desired songs (e.g., in connection with search functionality, potentially accessible by selecting a central server search function button on the screen). The jukebox device typically charges an additional fee (such as five credits instead on one credit) for an immediate download and play of a song from the central server as opposed to a standard play directly from the jukebox's local storage.

As might be discerned from the above, the "conventional wisdom" is to attempt to maximize revenues and ensure a broad-based appeal by providing more and more media offerings or songs via a jukebox. In other words, the conventional wisdom and industry thinking is to make available as many media offerings or songs as possible via a jukebox so that the one jukebox will be appropriate for any venue. The theory is based in part on the common perception that it is easier to develop a single, standard jukebox with as many offerings as possible, than to provide multiple different jukeboxes each making available a different set of limited media content. This common understanding, in turn, may have its roots in the fact that conventional, non-digital jukeboxes clearly had severely limited repertoires and that even many early digital jukeboxes has expanded repertoires that were still limited by licensing and accounting requirements, download speeds, etc.

The assignee has recently discovered that the conventional wisdom no longer is entirely accurate and that the underlying assumptions are somewhat flawed. For example, the assignee has recently discovered that providing more and more media offerings is not necessarily desirable in all instances. This discovery is based, in part, on the assignees' recognition that providing more and more offerings means providing more and more opportunities for patrons to play music that is inconsistent with the authenticity or identity of a location. For instance, the authenticity and identity of a "biker bar" can be severely undermined if a patron were to play what could be considered pop or "teeny-bopper" music, just as a country line dancing venue might have its authenticity and identity undermined if hip hop and rhythm and blues songs were played. The assignee has from time to time experienced difficulties providing jukeboxes in locations for these vary reasons. Surprisingly and unexpectedly, the assignee's experiences provide evidence that the ability to selectively "filter" music by excluding songs, genres, and/or the like often is seen as an unacceptable, incomplete, and/or otherwise undesirable to proprietors of locations.

Apart from or in addition to the actual media being played, the assignee has also discovered that the physical appearance of the utilitarian jukebox is sometimes undesirable. Indeed, the assignee has discovered that the physical appearance of a jukebox or jukebox terminal can be undesirable simply because the device itself looks like a jukebox (e.g., has a payment acceptor, a touch screen display that selectively operates in an "attract mode," includes flashing and/or otherwise changing neon lights, etc.). In a perhaps related matter, the assignee has discovered that the content displayed on a jukebox or jukebox terminal also may be considered undesirable. As above, the physical appearance of the jukebox device and/or content displayed on the jukebox device may threaten to undermine the authenticity or identity of a location. As a perhaps more concrete example, it has been observed by the assignee that so-called "ultralounges" typically react negatively towards the visual appearances of conventional jukeboxes. As another example, the assignee has discovered that the "wrong" types of advertisements and/or media may be displayed at a given location as, for example, ultralounges stereotypically find it more desirable and "authentic" to display attractive men and women wearing fashionable clothing and accessories as compared to album art, concert advertisements, etc.

Still another discovery that the assignee has made is that the conventional ways that people typically discover music (including songs, artists, etc.) are becoming outmoded. In addition to, or rather than, watching a music television station such as MTV or the like, listening to the radio, or paying attention to advertisements, potential patrons are discovering music in new and different ways. User interfaces that enable patrons to browse or search for music on a jukebox device typically enable browsing and/or searching based on artist name, song name, album, and/or the like. But such techniques do not necessarily result in the patron being exposed to new or different music and is still another conventional technique for music discovery. The assignee has realized that today's potential patrons oftentimes are more interested in music discovered through non-traditional social networking outlets and/or through pure "buzz" generated on the Internet or through such social networking outlets.

Given the above discoveries and realizations, it will be appreciated that further improvements to jukebox devices can be made. It also will be appreciated that some or all of such improvements are contrary to accepted wisdom and/or industry-standard practice. For instance, providing more limited media selections probably would be seen as a "step back" when viewed through the lens of conventional thinking, whereas the assignee has realized that it actually may be considered more desirable by some to provide a more limited selection when attempting to preserve the authenticity and/or identity of a location. As another example, jukebox devices conventionally have been viewed as having one of several "classic designs" and digital jukebox devices have been designed to be "updates" to such classic designs, whereas the assignee has realized that jukeboxes are perhaps not as utilitarian or ubiquitous as they have been viewed. Still further, it will be appreciated that conventional browsing and/or searching techniques may be updated and/or replaced, e.g., to reflect newer ways that potential patrons discover and experience music. In general, certain exemplary embodiments relate to the inclusion of innovative user interfaces that help immerse the user in an interactive jukebox world where user interface elements help provide for multi-dimensional interaction with collections of instances of media, synchronized external and/or internal lightshow feedback and/or projection, play queue reveal and/or manipulation, blurring/focusing of elements, synchronized lyrics display, etc. Certain exemplary embodiments described herein also include cameras and/or LEDs that may help, for example, enable artist and/or patron likenesses to be used or incorporated into jukebox interfaces, cameras to be leveraged in attract or flight modes or to serve as mirrors, lighting elements to be used as camera flashes, LEDs to simulate tactile feedback for touch screen displays or patron welcome display messages, provide a jukebox-based security system, apply contextual ads, etc. Adaptive auto-complete search recommendations may be provided in certain exemplary embodiments, as may set lists and/or enhanced collection type browsing.

According to certain exemplary embodiments, jukebox devices with such user interfaces, and/or systems with such jukebox devices are provided. Similarly, according to certain exemplary embodiments, non-transitory computer readable storage mediums tangibly store programs that, when executed, implement the methods described herein.

Certain example embodiments use a profile and tile approach (e.g., as described in greater detail below) that is more dynamic and customizable than catalog-based approaches oftentimes used for music-reproduction systems. The approach of certain example embodiments is advantageous because it has been found that catalogs expose potential patrons to too much information (in the form of too many selections) where there is a very low likelihood that a large percentage of the songs will be played. Although some have attempted to provide sorting based on popularity, a potential patron might not know where the song is in the popularity list, or a song might not be ranked at all, and thus the patron might revert to a very long alphabetical list that is daunting to use. Certain example embodiments implement a cloud-based music merchandizing profile-related approach that effectively narrows down the musical lists to songs more likely to be of interest to a potential patron. In other words, certain example embodiments separate the catalog from music that actually is merchandized.

In certain example embodiments, a playlist in a profile or the like may be populated with a certain number or percentage of promoted songs, network-wide favorites suitable for that profile, and local jukebox favorites suitable for that profile. For instance, a music department of the provider might select 5% of the entries in a rock genre playlist for promotion, 30% of the entries in that list may be network-wide rock song favorites, and the remainder be local jukebox rock favorites. Thus, certain example embodiments relate to self-populating playlists that combine centrally programmed promoted songs, genre-based songs that are popular across the network, and local popularity of songs with the same playlist attributes (such as genre or similar artist). The same or a similar approach may be used when presenting search results. In other words, certain example embodiments provide a smart search, where search results vary based on the popularity of songs within the venue, with consideration given to songs being promoted by the jukebox provider and/or others.

Profiles, searching, etc. might be analytics driven in certain example embodiments. Events may be logged locally at the jukeboxes and collected and processed centrally, e.g., to offload processing power, maintain audit logs, get a good view of a network, etc. The events that are logged may include, for example, touches, time, and searches. Events may be logged to rate collections of music and/or the orders of items therein. For example, a quick time between insertion of payment and musical selection would be desirable, scrolling once followed by a selection would still be desirable, scrolling twice followed by a selection also would still be desirable (although perhaps less so than the preceding option), and hitting the back button might be seen as negative feedback. Advantageously, the cloud-based music merchandising system may allow for customized experiences at each venue.

Images may be carefully selected and potentially made dynamic so as to attract users. For instance, although album art has been used in the past, art belonging to a label but that is more provocative or topical/current (e.g., as being from social media, a current tour, a news media story, etc.) and thus more relevant might be used in its place. In certain example embodiments, a top-level item might have the more provocative image, whereas the second-level item might have the more expected album-related art.

Certain example embodiments may allow certain user types to build profiles, playlists, tiles, and/or the like. As will be apparent from the description below, these items may be programmatically generated and provided in a layered fashion. The user types may include operators, venue owners, patrons, and/or the like.

Certain example embodiments include (1) a centralized gateway that maintains a listing of profiles, playlists, tiles, etc., and determine when updates need to be pushed to jukeboxes, and (2) a backend software package that enables these and/or other items to be created, updated, and/or otherwise managed. The latter may include a link to the catalog for authorized users, but the former may ensure that jukebox patrons only interact with merchandized music based on the profile, etc., distributed to the individual jukeboxes.

The exemplary embodiments, aspects, and advantages disclosed herein may be provided in any suitable combination or sub-combination to achieve yet further exemplary embodiments.

BRIEF DESCRIPTION OF THE DRAWINGS

These and other features, aspects, and advantages of the instant invention will be further understood by review of the following detailed description of the exemplary embodiments when read in conjunction with the appended drawings, in which:

FIG. 49 is a front elevation view of an example enclosed core that may be used in the FIG. 48 example jukebox, in accordance with an exemplary embodiment;

FIG. 50 is a bottom plan view of the example core shown in FIG. 49;

FIG. 51 is a right side elevation view of the example core shown in FIG. 49;

FIG. 52 is a rotated version of FIG. 51;

FIG. 54 is a front elevation view of the FIG. 48 example jukebox with a section line referenced in FIGS. 55-56;

FIG. 55 is a cross-sectional view through the section line shown in FIG. 54, with the example core of FIG. 49 being located in the jukebox shell and with the lever in an unlocked or "core up" position;

FIG. 56 is a cross-sectional view through the section line shown in FIG. 54, with the example core of FIG. 49 being located in the jukebox shell and with the lever in a locked or "core latched" position;

FIG. 60 is a front perspective view of a fan tray that may be used in connection with the FIG. 48 example jukebox, in accordance with an exemplary embodiment;

FIG. 61 shows the range of movement of components in the FIG. 60 example fan tray;

FIG. 62 is a top plan view of the FIG. 60 example fan tray, showing the electronic fan controller thereof;

FIG. 63 is a front elevation view of the FIG. 60 example fan tray;

FIG. 64 is a bottom plan view of the FIG. 60 example fan tray;

FIG. 65 is a front perspective view of the FIG. 60 example fan tray located in the jukebox shell;

FIG. 66 is a front elevation view of the FIG. 48 example jukebox with section lines referenced in FIGS. 67-68;

FIG. 67 is a cross-sectional view of FIG. 66 taken through the A-A line;

FIG. 68 is a cross-sectional view of FIG. 66 taken through the C-C line;

FIG. 70a is an example screen that may be used to create a new profile in certain exemplary embodiments;

FIG. 70b is a table showing an example profile header format that may be used in connection with certain exemplary embodiments;

FIG. 71b is a table showing an example tile definition format that may be used in connection with certain exemplary embodiments;

FIGS. 71c(1)-71c(2) provide another example tile definition format that may be used in connection with certain exemplary embodiments;

FIGS. 73a(1)-73a(4) are graphs showing revenue- and play-related data that may be implemented as a part of an analytics module in accordance with certain exemplary embodiments;

FIG. 73b is an example tile analytics view that may be displayed to users, in accordance with certain exemplary embodiments;

FIG. 74 is an example new tile creation screen that may be used to create dynamic tiles, in accordance with certain exemplary embodiments.

DETAILED DESCRIPTION

Figure 1:
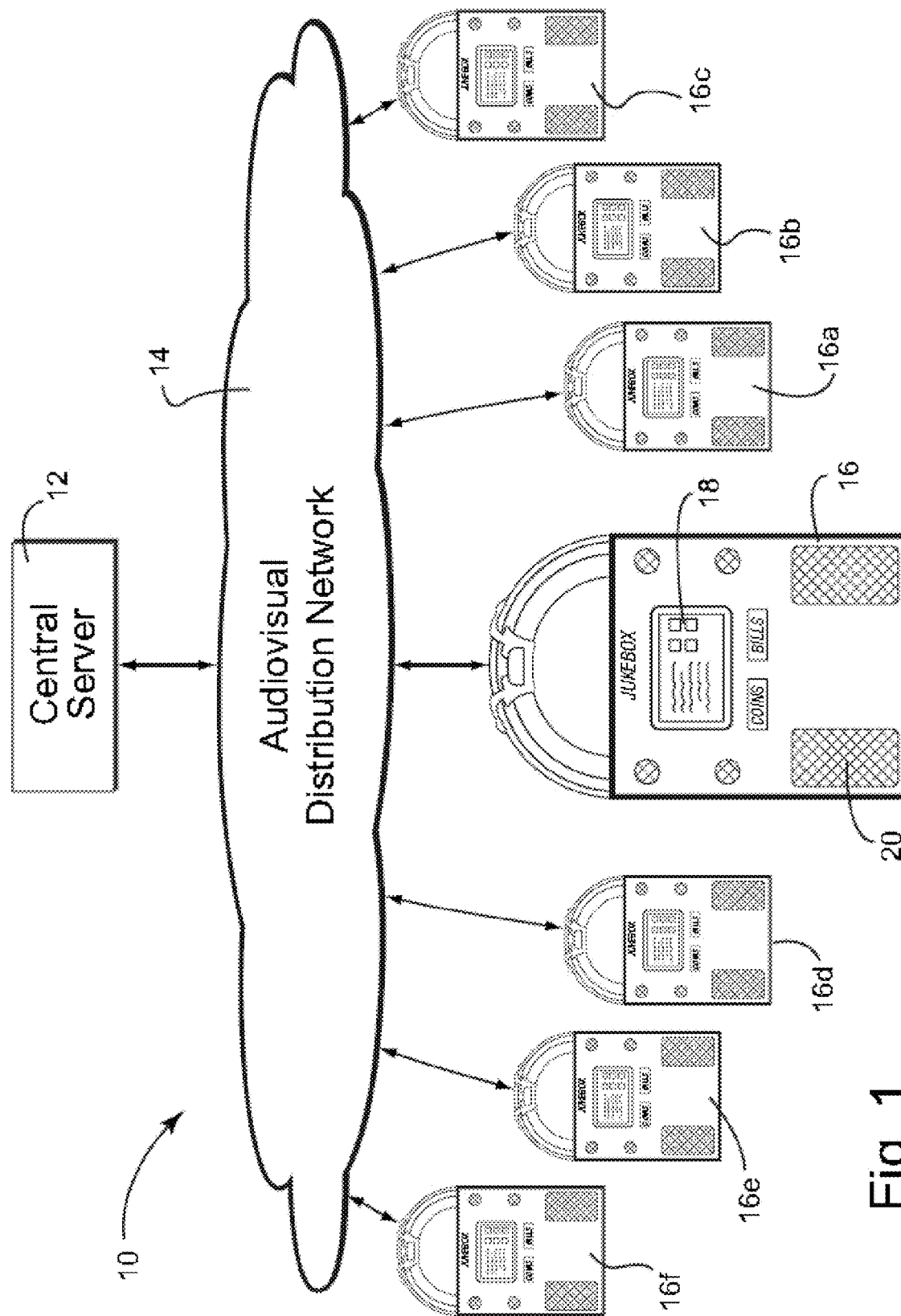
FIG. 1 is a block diagram of a conventional downloading digital jukebox system.
Figure 2:
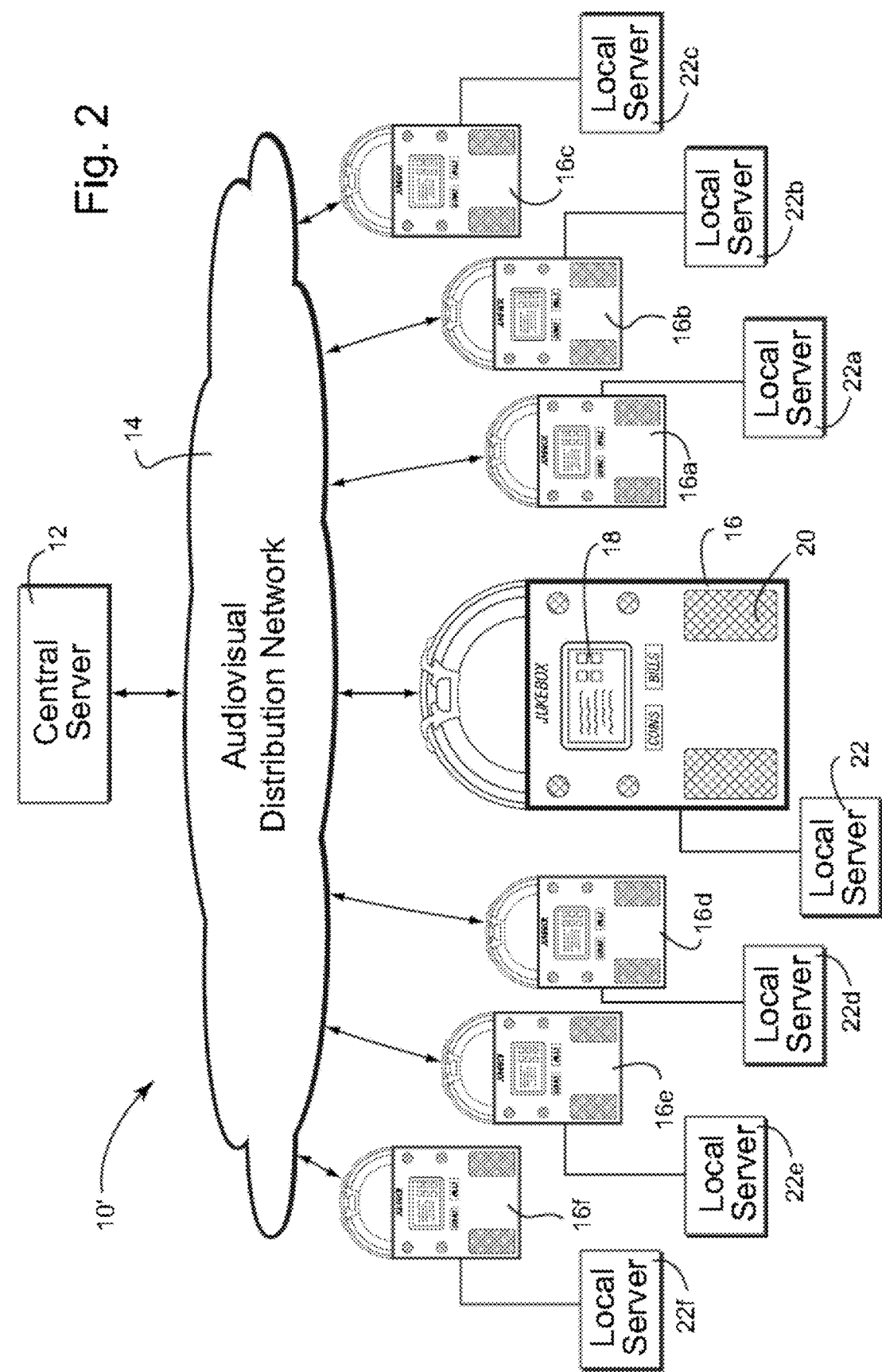
FIG. 2 is a block diagram of an exemplary embodiment of an improved jukebox system 10'.

Referring now to the drawings, FIG. 2 is a block diagram of an exemplary embodiment of an improved jukebox system 10'. The jukebox system 10' includes similar elements as shown in FIG. 1 and described above, including a central server 12, communications network 14, and remote jukebox devices 16, 16a-16f. However, the jukebox system 10' further includes local servers 22, 22a-22f respectively connected to each of the jukebox devices 16, 16a-16f. The central server 12 includes a master library of songs (and/or other content). Each of the jukebox devices includes a subset of the master library on a local storage device of the jukebox. The central server may be used to individually manage the contents of the jukebox device, by monitoring usage of and updating the subset of songs on each of the jukebox devices with the intent of maximizing the usage thereof. The central server 12 periodically receives data from each of the jukeboxes for the purpose of royalty accounting and payment for songs played. The jukebox devices may connect to the network in any suitable manner, such as dial-up modem or broadband modem (e.g., DSL, cable, wireless broadband, or satellite). The communications network 14 may be any suitable network capable of distributing data (e.g., audiovisual data) from the central server 12 to the jukeboxes 16 and enabling data to be uploaded from the jukeboxes 16 to the central server 12.

The songs (and/or other data) may be digitized, compressed and encrypted by the central server 12 prior to sending songs to the jukeboxes for security and bandwidth purposes using known techniques. The songs are then decompressed and decrypted by the jukeboxes for storage and reproduction thereon. Thus, each of the jukeboxes maintains in a database a library of digitized songs for play on the jukebox, wherein the library can be changed or updated through communication by the central server. The jukeboxes may also receive and store data constituting images (e.g., still and/or moving video and/or graphical images) that can be displayed on the display 18 of the jukebox device 16. In one exemplary embodiment of the invention, the jukebox devices have similar structure and operation described in U.S. Pat. No. 6,308,204 referenced above. Thus, the jukebox devices 16 each may include one or more microprocessors, such as a main CPU and an audio DSP, a memory, such as a hard drive, for storing songs and/or other content, a display of displaying visual items, an audio arrangement 20 for providing audio, a communication system for enabling the jukebox to communicate with the central server 12 through the communications network 14, and operating software, including a multitasking operating system, that controls the operation of the jukebox. The operating software also may be updateable through communication with the central server 12 as described, for example, in U.S. Pat. No. 6,308,204 referenced above. The jukeboxes 16 further include one or more payment devices, such as coin, bill and/or credit card input devices, for enabling a customer to pay for usage of the jukebox device in a convenient manner. The screen 18 may be a touch screen that enables the user to input selections by touching the screen.

Each jukebox device has, in one embodiment, a local server 22 that can be accessed by the jukebox device. The local servers are respectively connected to the jukebox devices using Ethernet or other type of local connection. In another embodiment, the local server may simply be a logical extension (e.g. partition, directory, or area) of the jukebox's hard drive, rather than a separate hardware device. The local servers 22 may each include a mirror copy of the master library of musical recordings maintained by the central server 12. The local server 22 can be loaded with the master library by the entity that owns and/or controls the jukebox network prior to shipping the local server and jukebox device to the jukebox distributor or operator. Of course, over time, the local sever will no longer correspond identically to the central server, due to the fact that the central server may be continually updated with additional or new songs. Thus, the local servers 22 also may be updated periodically to maintain a correspondence with the library on the central server 12. This updating can be done, for example, by the central server 12 through communication with the jukebox devices connected with the local servers 22 using, for example, either dial-up or broadband modems. Alternatively, the updating can be done personally with an update tool that can be connected by a routeman or other person directly to the jukebox or local server for the purpose of updating the contents of the local server. The portable tool could include a removable storage medium, such as a hard drive, that could be returned to and reused by the owner of the jukebox system for future updates. The tool itself could be kept by the operator or other person in charge of maintaining specific jukeboxes for use upon receipt of the updated removable storage medium from the owner of the jukebox system. For security reasons, the local server 22 may not include all of the digital data that constitutes any one song that is stored on the local server 22. In addition, the part of the song that is on the local server is encrypted. The jukebox device 16 contains the missing part of each of the songs on the local server, thereby enabling the jukebox to assemble the complete song based on the contents of the local server and the memory on the jukebox device. The missing data located on the jukebox is needed in order to decrypt the songs. For example, a single block (or other small fraction) of data for each song may be missing on the local server but present on the jukebox device, and the encryption may be based on the missing block and may proceed on a block by block basis. Thus, none of the blocks can be decrypted without obtaining and/or decrypting a preceding block. This feature provides significant security and prevents or deters theft or other type of unauthorized use or copying of the songs on the local server. Thus, in this embodiment, each local server must be specifically assigned to a specific jukebox device so that the decryption described above can be properly performed.

In accordance with an exemplary embodiment, the local servers may also each be individually registered with and identified to the central server 12, so that the central server can individually manage and monitor each local server. The same is true for the jukebox device itself, i.e., it may also be registered with the central server so that it too can be individually monitored and managed by the central server. As will be understood from the foregoing description, the local servers become an important and advantageous part of the jukebox system by allowing the contents thereof to be accessed by the jukebox device to provide additional services (such as providing additional songs) not available on the jukebox device itself. As will be explained below, the song library of the central server and/or the storage capacity itself can be advantageously used to provide services to other jukeboxes, such as fee-based residential and commercial jukeboxes and/or other fee-based equipment. One use of the local servers may be to provide an immediate song downloading feature.

Certain exemplary embodiments include a new user interface for exploring and browsing media content, e.g., using a touch-screen. Certain exemplary embodiments obtain a location, a direction, and/or a speed of a sensed touch. This information may be used, in turn, to help navigate among objects in the space provided on the display screen.

In this vein, the space is the general presentation area on which all graphic elements are presented. Collections generally refer to logical collections of media and may be subject to preferential filtering, e.g., to present and make available only media that satisfies criteria for different levels of actors and/or based on different selections. They may sometimes be represented by graphic images. Objects generally refer to songs, artists, playlists, games, or media sources that are represented in a sequence from a central catalog. Objects that are presented may sometimes be thought of as being subject to a match between the user or locations preferences and the attributes of the object was being browsed. As described in certain of assignee's co-pending applications (which are referenced above), an authentication mechanism may be provided to, among other things, identify the user and provide security credential authorization.

Figure 3:
FIG. 3 is an example "home screen" that may be used in connection with certain exemplary embodiments.

An example user interface will now be described in connection with the example screenshots provided in FIGS. 3-24. FIG. 3 is an example "home screen" that may be used in connection with certain exemplary embodiments. The example home screen shown in FIG. 3 includes a group of four main navigation elements. These elements are element 302a-302d, which respectively enable a user to navigate to the home screen, initiate a search, access "top plays," and "discover" music in a new and intuitive manner. Because the user currently is on the home screen, the first, home element 302a is highlighted as being active. The features associated with the other elements 302b-302d will be described in greater detail below. It will be appreciated that these main navigation elements 302a-302d may in certain exemplary embodiments be carried through the various screens to provide a consistent look and feel for the user, and to enable easy navigation among these common, highlighted features.

Additional information may be provided along the left side of the screen under these main navigation elements 302b-302d that may be carried over into some or all of the other views. For example, an icon 304 may provide instructions for how to download a software application (an "app") to a mobile device (such as a smart phone, tablet, phablet, or the like), e.g., that enables the user to at least partially control the jukebox. Such features may, for example, enable a user to order songs, purchase credits, etc. Additional information about the provider of the jukebox may be accessed by pressing the about button 306. A screen with legal information (e.g., copyright, patent, and/or other information) may then be displayed. Promotional items also may be shown in this area.

In the FIG. 3 example, a "Tweet for Tunes promotional icon 308 is displayed. This particular promotion ties into an external social networking site (in this example case, Twitter), and enables a registered jukebox user who also has an account with the external social networking site to announce (in this example case, Tweet) songs that the registered jukebox user is listening to via the jukebox. It also may simulate the functionality of the similar app and, for instance, enable users to search through songs other users have announced. Of course, it will be appreciated that other promotions may have logos provided here or elsewhere, and they may or may not tie into external social networking sites in different examples.

Similar to the leftmost pane with the main navigation elements 302b-302d, etc., an upper status bar provides information that may be carried through the various screens to provide the user with information that may be of assistance in making selections and/or of general interest, regardless of which feature is active or is being activated. For instance, the upper bar includes a "now playing" indication 310, which in this example identifies the song name, the artist or group that performs the song, and album or other artwork associated with the song. A credits indicator 312 also may indicate how many credits have been inserted into the jukebox and can be used for playback, karaoke, photo booth, song purchasing, and/or other purposes. Information about how much money credits cost also is provided in this example layout. Other information that could be helpful to a user regardless of the part of the user interface the user is accessing may be provided in this upper status bar. For example, a login button (e.g., that enables a jukebox user to sign into the jukebox via a jukebox-specific username/password combination, using a single-sign on or SSO login operation in connection with an external social networking site account such as Facebook, Twitter, or the like, via an email account login, etc.), language selection button, help button (e.g., that triggers context sensitive help that may in some cases be customized based on the particular screen being displayed, for instance) can be provided here or elsewhere. It is noted that many user interface elements may support internationalization, e.g., in that instead of hard-coding a piece of text or image, it may be replaced with an identifying label that corresponds to and/or otherwise identifies text in English, French, Spanish, etc., in tables within the database. The system may use the language chosen for the interface and replace the label with the correct text based on a user's selection of the language.

At the bottom of the screen, a featured jukebox-related advertisement may be displayed. In the FIG. 3 example, a leader board type advertisement is provided, highlighting the "ultimate jukebox classics" playlist. This playlist (like some or all of the other playlists described below) may be a custom-curated collection of songs that are available for playback. This particular playlist may include popular jukebox songs like Journey's "Don't Stop Believin'," Joan Jett's "I Love Rock and Roll," Neil Diamond's "Sweet Caroline," etc., e.g., as selected by a group of marketing and/or music professionals. This leader board type advertisement may be carried through various screens with a priority lower than that of main navigation elements 302b-302d and/or the upper status bar. In other words, this leader board type advertisement may be carried through various screens, unless additional space is needed, in which case it may be removed to make room for additional content, etc. The same may be true of the main navigation elements 302b-302d and/or the upper status bar, but they may be removed only if the initial removal of the lower leader board type advertisement is insufficient to provide enough room for the additional content, etc., at least in certain exemplary embodiments.

The main content area of the FIG. 3 example screenshot is bounded by the upper status bar, the lower leader board type advertisement, and the main navigation elements 302b-302d. This main content area may include several sections, e.g., defined by successive rows. The first row includes a featured jukebox-related advertisement 316. The jukebox-related advertisement 316 in this example pertains to a new album and includes promotional artwork related to the same which, in this instance, includes a picture of Kid Rock, his name, and a stylized version of the name of the new album being promoted. It will of course be appreciated that other jukebox-related advertisements may be provided, e.g., advertising artists, songs, labels, events, etc.

Although certain advertisements are described as being jukebox-related advertisements (e.g., because they pertain to music that is playable on the jukebox, for example), non jukebox related advertisements may additionally or alternatively be provided in certain exemplary embodiments, e.g., in the section 316 or elsewhere.

A second row 318 includes elements corresponding to different playlists. As indicated above, these playlists may be custom-curated in certain exemplary embodiments. The example playlists shown in FIG. 3 include favorites, disco songs, and "hot hits." In certain exemplary embodiments, user-generated may be provided in place of, or in addition to, these custom-curated playlists. A user may select a playlist by pressing it, and this may transition to a screen described below. A user may also press and pan to the left or right, e.g., to access additional playlists.

The third row 320 includes elements corresponding to individual songs. These songs are designated as "top plays." They may in certain exemplary embodiments be preselected items, e.g., to promote a certain band, album, label, upcoming events, etc. In certain exemplary embodiments, top plays at an individual location; across locations, e.g., serviced by a single operator, owned by a single party, within a predetermined proximity or grouping of localities, etc.; throughout the entire jukebox network; and/or the like, may be provided in this area in certain exemplary embodiments. In certain exemplary embodiments, this information may be based on an industry-standard or other chart such as, for example, the Billboard Hot 100, Billboard genre charts, etc. As above, a user may also press and pan to the left or right, e.g., to access additional songs.

A user may also press and pan up to access further row-oriented content. For example, additional advertisements, groupings of songs, jukebox-related services (e.g., such as karaoke, photo booth, games, etc.), and/or the like may be made visible and accessible. In certain exemplary embodiments, a real-time or substantially real-time "playing now" stream of songs being played across the network may be provided, e.g., in a row. The central server or other unit may, for example, receive data from individual jukebox devices in the network regarding plays. That play information may be used to keep tallies of the songs being requested over all time, within a configurable fixed or sliding window (e.g., of 5 minutes, 10 minutes, 15 minutes, 1 hour, 1 day, etc.), and/or in some other way. In certain exemplary embodiments, this information may be presented as a Wall Street like ticker, e.g., showing the top 40 or other number of songs moving up and down, e.g., based on network data gathered in real-time or substantially in real-time. The movement may be based on changes from window-to-window, and simple up and down arrows (which optionally may be color coded green and red, or otherwise) may be used to convey movement. In other cases, the amount of movement may be noted, e.g., with a plus or minus sign, optionally together with or in place of a number of spots, and/or the like.

In certain exemplary embodiments, the songs displayed on the main screen may be grouped based on the number of credits that they cost. For instance, the user may be able to choose to see only songs that cost 1-credit, songs that cost 1- or 2-credits, etc. In certain exemplary embodiments, the default display may include songs that cost 1- or 2-credits, but this may be updated based on user selection.

Although certain exemplary embodiments have been described as including more or less "fixed" elements at the top, left, and bottom of the screen, other arrangements may be provided for such information. The arrangement shown in FIG. 3 and discussed above works well for English- and other-language localities, e.g., because a user tends to focus on the main content provided in the approximate vertical center of the screen and to the right (e.g., because many languages are written from left-to-right and top-to-bottom). However, other language localities may move these fixed elements around on the screen and/or relative to one another. For instance, for Hebrew-language localities, the main navigation elements 302a-302d may be moved to the right of the screen, e.g., because the language is written from right-to-left and top-to-bottom. For Asian languages, where a column-based approach may be more appropriate based on writing styles, etc., a 90 degree rotation of the basic elements shown in FIG. 3 may be in order.

Figure 4:
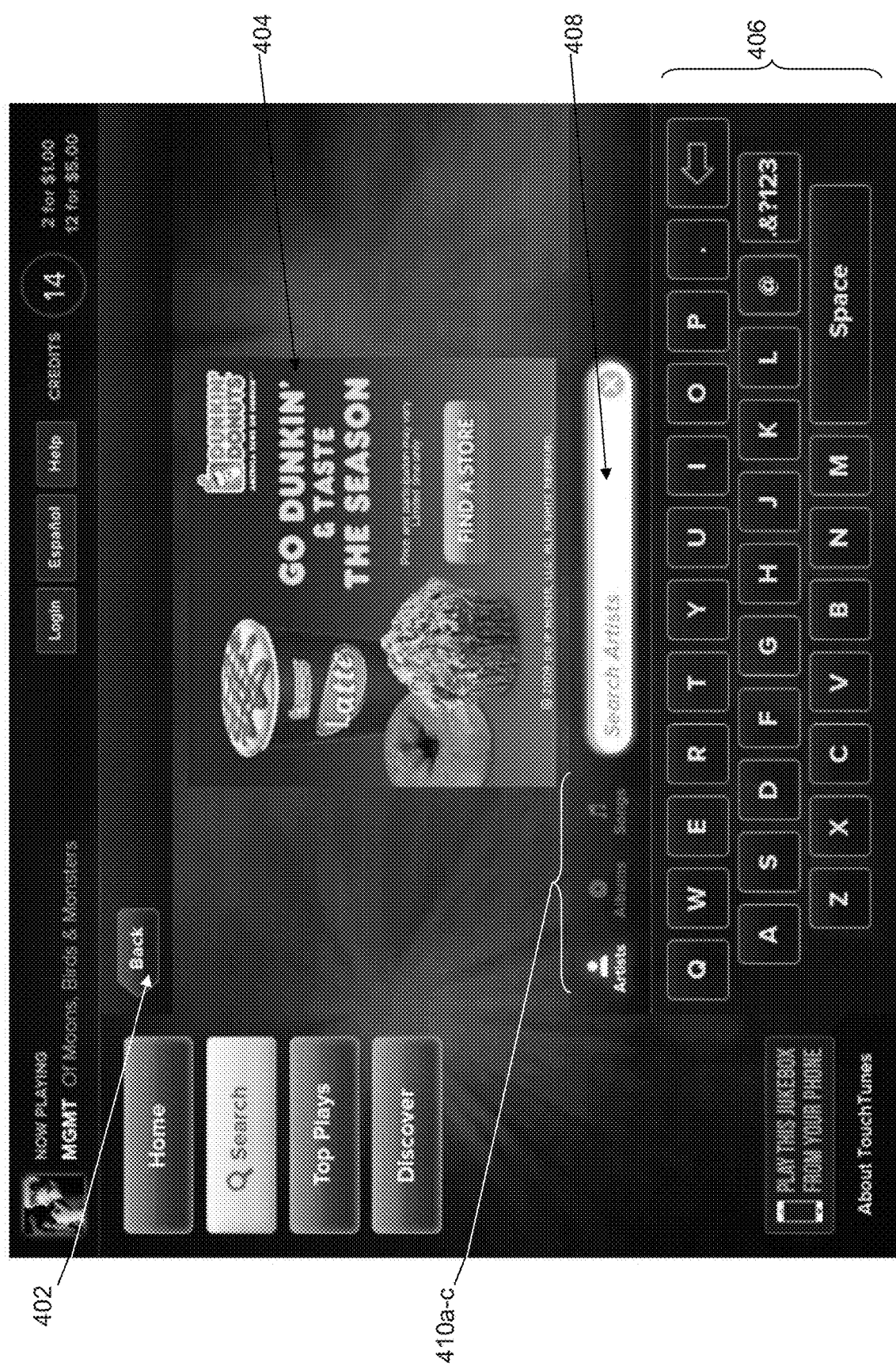
FIG. 4 is an example search screen that may be used in connection with certain exemplary embodiments.

FIG. 4 is an example search screen that may be used in connection with certain exemplary embodiments. The FIG. 4 example screen may be displayed when an initial search is requested, e.g., before any search criteria is entered by the user. In addition to including the main navigation elements 302a-302d (with the search element 302b being highlighted to indicate its selection), the upper status bar may still be provided. This upper area may be expanded to make room for additional control elements, such as, for example, breadcrumbs that show a "path" of user selections through the jukebox interface, the back button 402 (which may in certain exemplary embodiments return the user to the home screen of FIG. 3, the immediately prior selected screen regardless of whether it was the home screen, etc.), and/or the like. However, to make room for the additional content items, the lower leader board type advertisement is removed. In general, the back button may function similar to that of a browser. That is, if a user is going to a new page, section, or modal, then the back button is activated. On the other hand, if this does not apply, then an inference may be made that the user is simply showing the same page but in a different manner and the back button should not revert to a previous state.

Referring to the main content area, before user entry is received, one or more sponsored or other ads 404 may be provided. The ads may be selected at random, in accordance with a predefined ad campaign, in response to information known about a logged in user, as something related to the song currently being played, and/or based on other criteria. The ad 404 may include active links that enable a user to access further content related to the ad, e.g., by pressing on it. For instance, the ad may open a web browser or the like, e.g., with additional content such as, for example, QR codes that can be scanned to access discounts redeemable at a location at a later time, maps of the stores, games, and/or the like. Such additional content may nonetheless be presented within the context of the jukebox ecosystem, e.g., such that the control elements are provided at the top and bottom (and/or other locations of the screen), so that the user still feels connected to the home jukebox environment.

The user may use the keyboard 406 to provide input to the search engine. The entered characters may be displayed in the text entry area 408. If no characters are entered, then the text entry area 408 may simply indicate the selected portion of the catalog that is to be searched. However, to indicate that this is explanatory text (rather than entered text), the indication may be provided in a comparatively lighter color, lower line weight, in italics, etc.

The portion of the catalog to be searched may be specified by selecting one of the control elements 410a-410c which, as shown in the FIG. 4 example, enable the user to specify that artists, albums, and/or songs should be searched. The artists control element 410a is selected and therefore is highlighted in the FIG. 4 example and, because no user data has been provided by the keyboard 406, the text entry area 408 also reflects this selection. It will be appreciated that the song search may search song titles and/or lyrics in certain exemplary embodiments.

Figure 5:
FIG. 5 is an example screen shot of certain artist search results when the FIG. 4 search screen is used.

FIG. 5 is an example screen shot of certain artist search results when the FIG. 4 search screen is used. As shown in FIG. 5, the user entered the text "ZXY321" as an artist search in the text entry area 408. No matching artists were found, and a like indication is provided in the search result summary area 502. The list-based search result list 504 itself is blank. In certain exemplary embodiments, the search results lists 504 and the search result summary area 502 may be updated in real-time, e.g., as the user enters additional characters.

Figure 6:
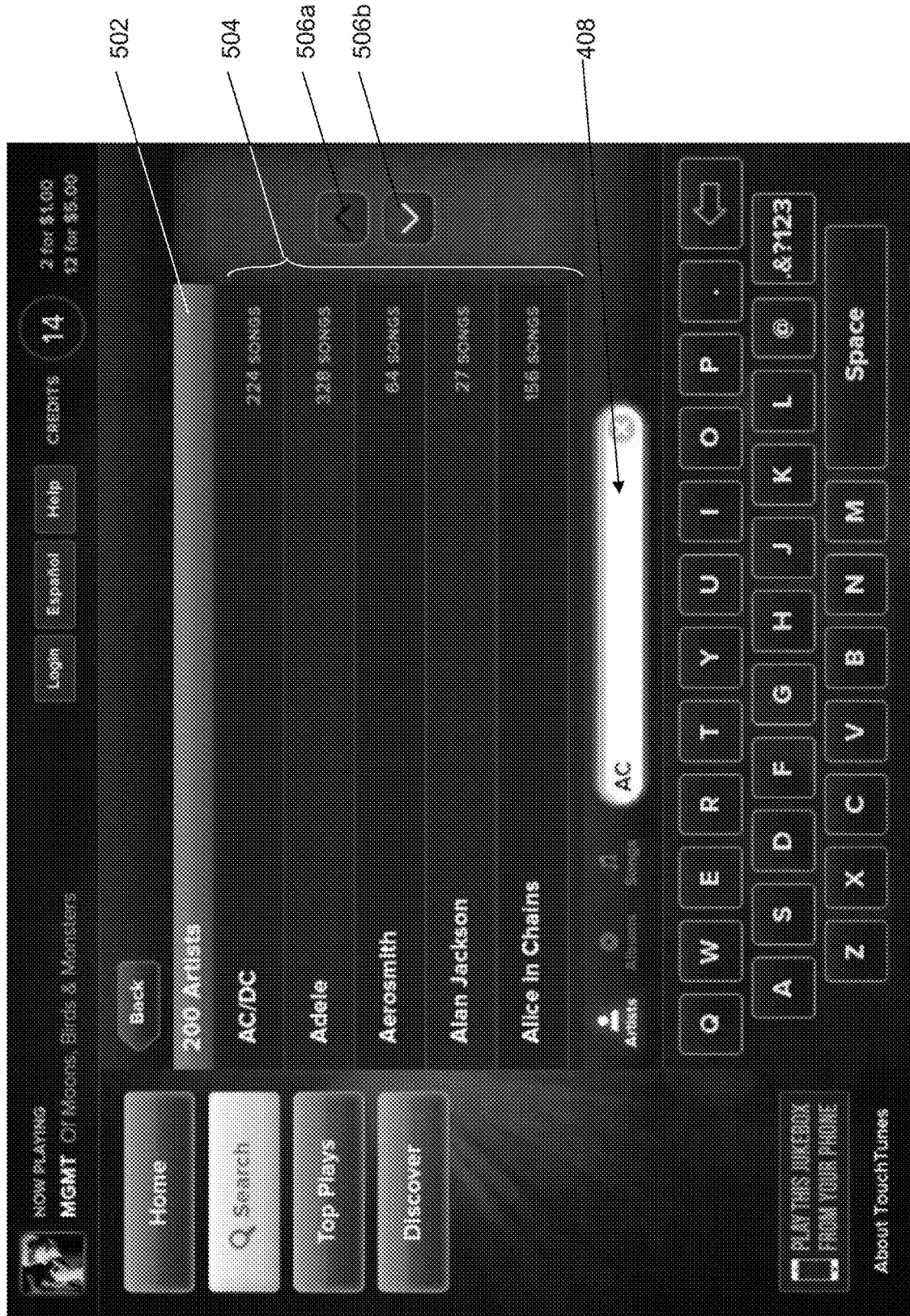
FIG. 6 is another example screen shot of certain artist search results when the FIG. 4 search screen is used.

FIG. 6 is another example screen shot of certain artist search results when the FIG. 4 search screen is used. As shown in FIG. 6, the user entered the text "AC" as an artist search in the text entry area 408. The search result summary area 502 indicates that 200 artists were found, and the list-based search result list 504 includes the matching entries. Optionally, the number of songs associated with each matching entry may be provided in the search result list 504. The up and down arrows 506a and 506b may be used to navigate through the list, or the user may simply scroll the list up and down, e.g., by moving his/her finger accordingly.

The search lists may be ordered by proximity to the match in certain exemplary embodiments. Of the results shown, "AC/DC" is the best match and thus is listed first. "Adele" is listed second, because "AC" and "AD" are close to one another, both alphabetically and on the keyboard. This may help to address difficulties that are sometimes encountered when using a touch screen keyboard and/or other like interface. Similarity searching may be provided, e.g., so that strings containing the search text are retrieved (for example, "Alan Jackson" contains "AC"), so that inadvertent misspellings can sometimes retrieve relevant results, etc.

Figure 7:
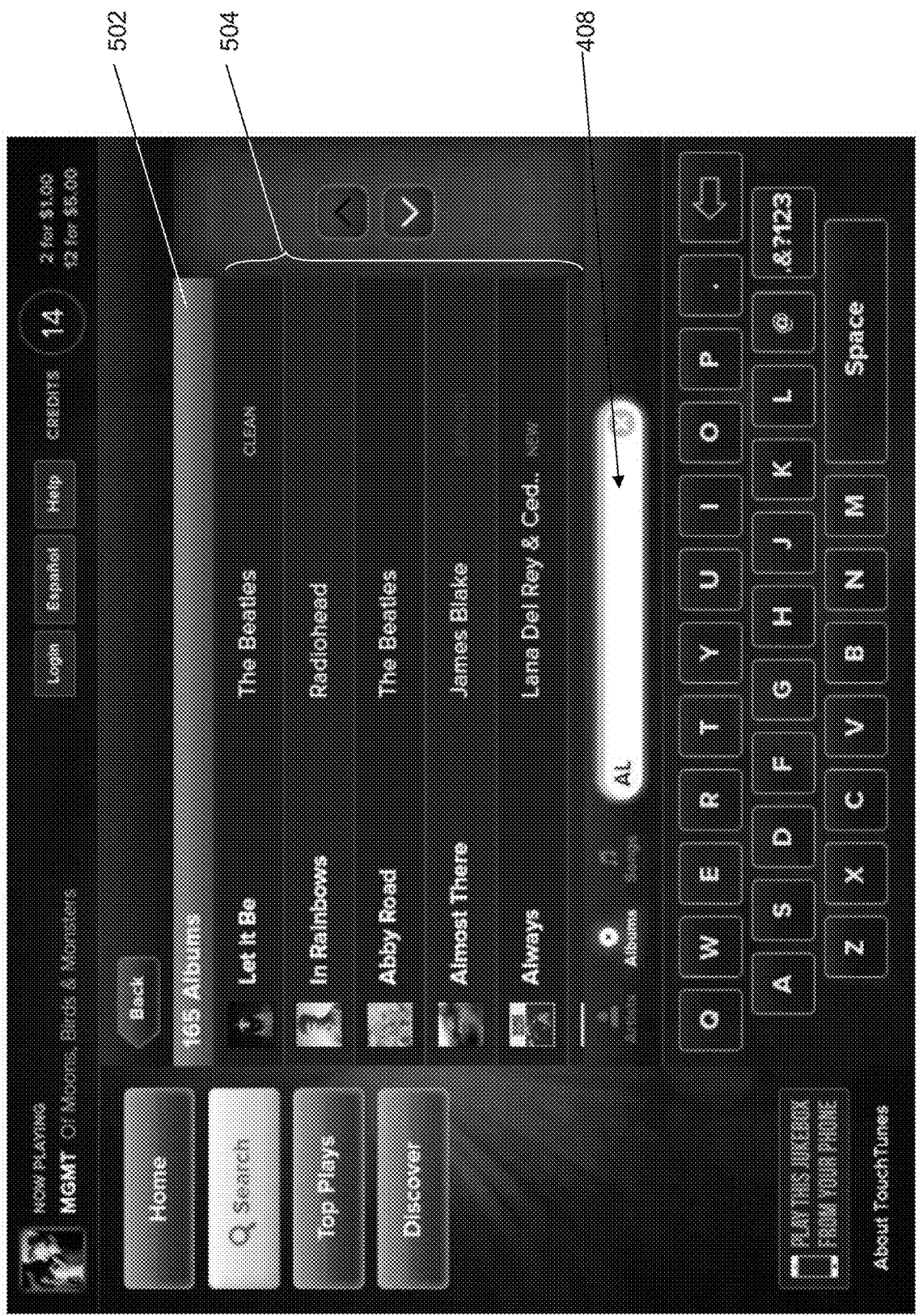
FIG. 7 is an example screen shot of certain album search results when the FIG. 4 search screen is used.

FIG. 7 is an example screen shot of certain album search results when the FIG. 4 search screen is used. As shown in FIG. 7, the user entered the text "AL" as an album search in the text entry area 408. The search result summary area 502 indicates that 165 albums were found, and the list-based search result list 504 includes the matching entries. Optionally, additional information may be provided together with the albums, e.g., in columnar format. For instance, the artist name is listed, as are other items of note. The other items of note may indicate, for example, whether there is a clean or explicit version of an album available, whether the album has been flagged as being new (e.g., newly added to the jukebox network within a predetermined time period such as a week, a month, or other period, newly released with the same or similar time period, etc.). Other information of interest may include an indication of how many songs are included in each album, a metric of how popular the albums are, etc. In certain exemplary embodiments, albums may be sorted based on the information provided in the search result list 504.

Figure 8:
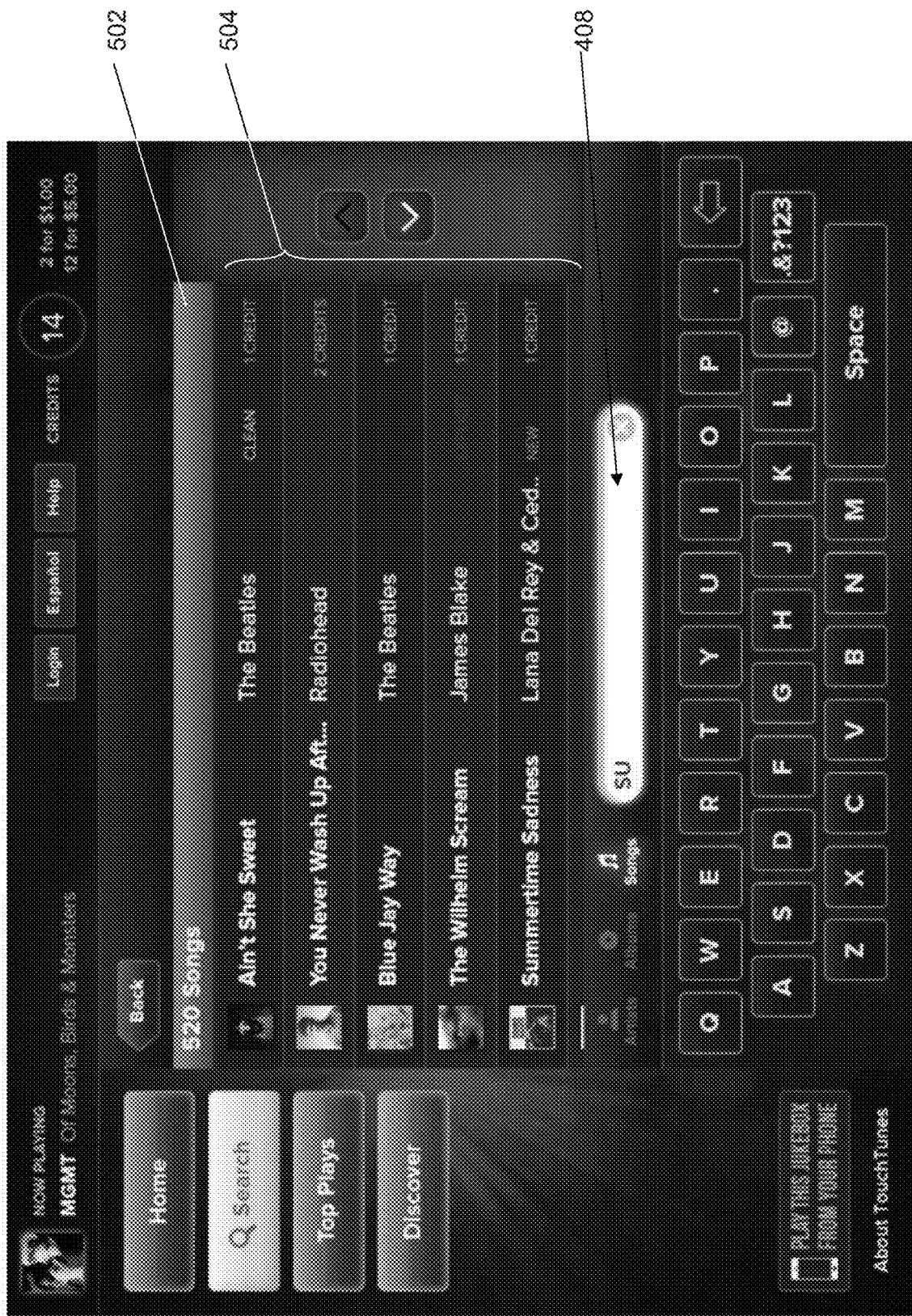
FIG. 8 is an example screen shot of certain album search results when the FIG. 4 search screen is used.

FIG. 8 is an example screen shot of certain album search results when the FIG. 4 search screen is used. As shown in FIG. 8, the user entered the text "SU" as a song search in the text entry area 408. The search result summary area 502 indicates that 520 songs were found, and the list-based search result list 504 includes the matching entries. Optionally, additional information may be provided together with the songs, similar to as described above. The credits needed to play each song are, for example, displayed together with the artist name and other items of note (e.g., clean vs. explicit versions of the songs, new flags, etc.).

Figure 9:
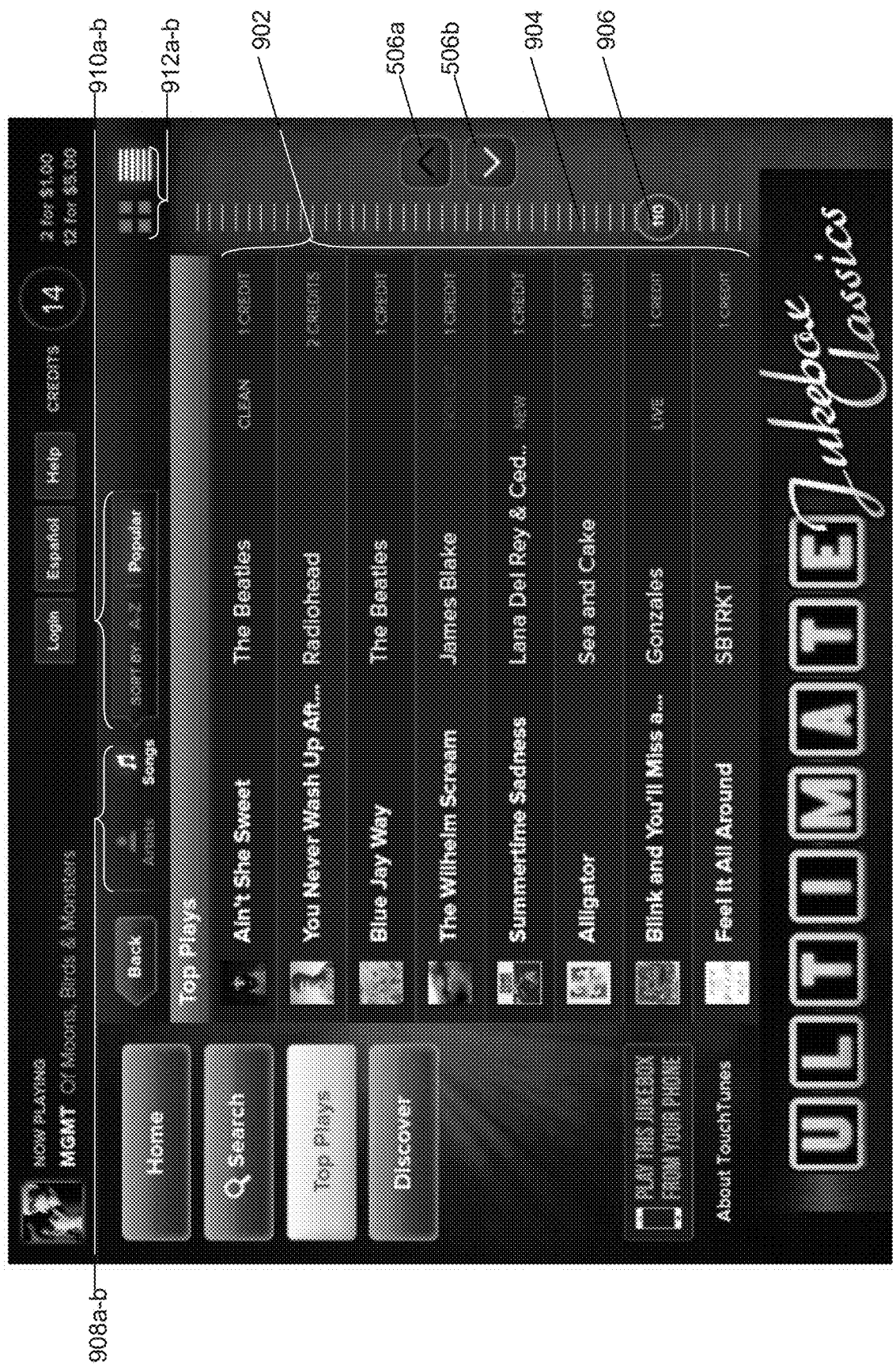
FIG. 9 is an example "top plays" screen that may be used in connection with certain exemplary embodiments.

FIG. 9 is an example "top plays" screen that may be used in connection with certain exemplary embodiments. The entries in the top plays list may be generated in any suitable way. For instance, as described above, in certain exemplary embodiments, a real-time or substantially real-time stream of songs being played across the network may be provided. The central server or other unit may, for example, receive data from individual jukebox devices in the network regarding song and/or album plays. That play information may be used to keep tallies of the songs and/or albums being requested over all time, within a configurable sliding window (e.g., of 5 minutes, 10 minutes, 15 minutes, 1 hour, 1 day, etc.), and/or in some other way. That list may be generated and/or retrieved periodically (e.g., to match updates), daily/nightly, or at some other regular or irregular interval. It also may be generated and/or retrieved dynamically, e.g., when the top plays element 302c is selected. In certain exemplary embodiments, industry-standard and/or other charts may be used to provide such information.

Top play information may be presented in list form, e.g., using the list 902. A user may navigate the list using the up and down control elements, by pressing and moving up or down on the list 902 itself, or by using the scrubber bar 904. The user may jump to an arbitrary position, e.g., by pressing a location on the scrubber bar 904, with the topmost portion being location 1 and the bottommost portion representing the end of the list. The current position may be identified, e.g., using scrubber bar position indicator 906.

As will be appreciated from FIG. 9, a user may select top plays in terms of albums or songs, and may sort the resulting top plays by alphabetically or by popularity (e.g., as a primary sort criterion) using catalog selectors 908*a*-908*b* and sort selectors 910*a*-910*b*, respectively. Depending on such selections, the list 902 may include some or all of the additional information described above and/or other information.

Figure 10:
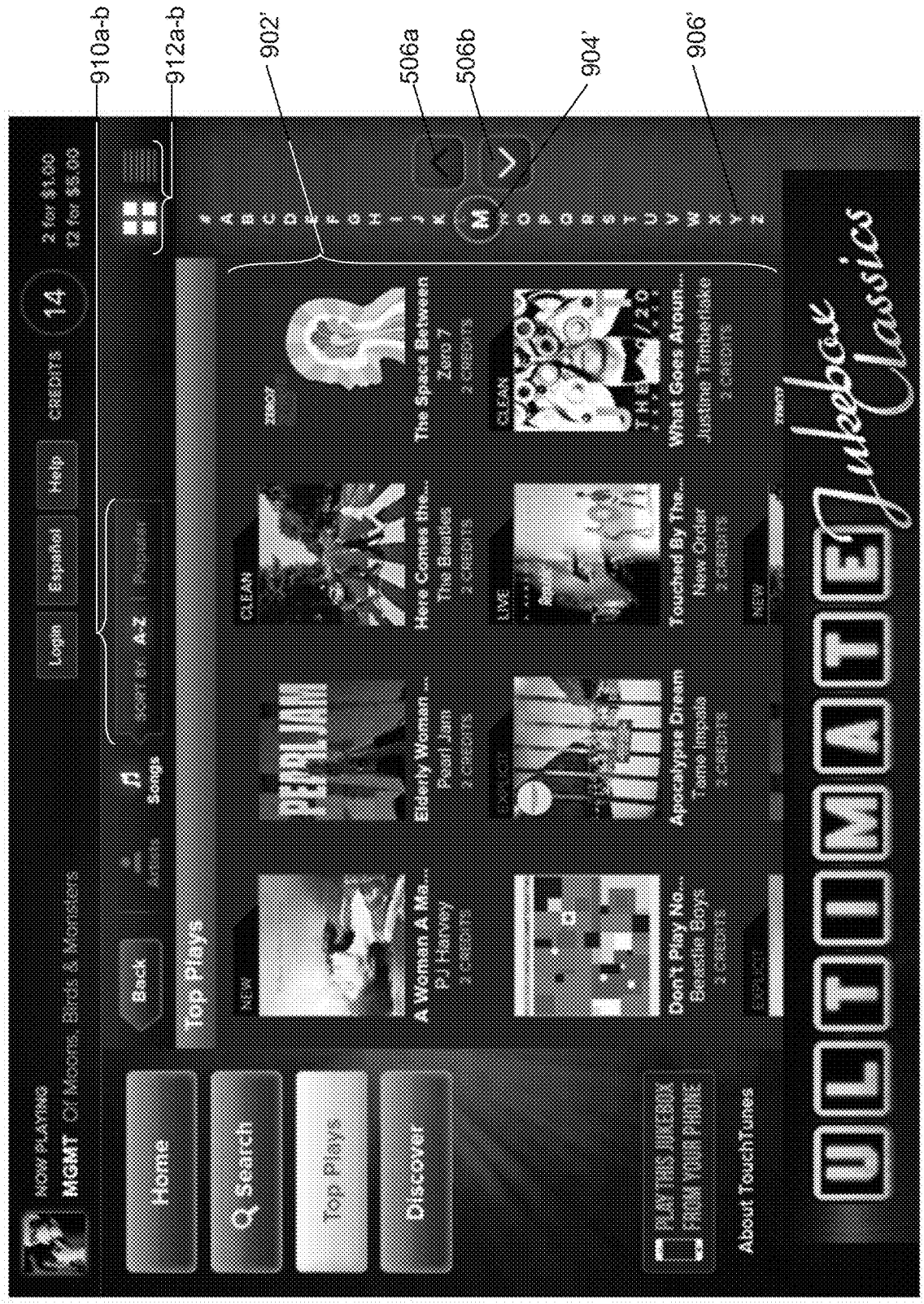
FIG. 10 is another example "top plays" screen that may be used in connection with certain exemplary embodiments.

It also will be appreciated from FIG. 9 that a list view may provided. However, using layout selectors 912*a*-912*b*, a user may reorient the items in a grid view. In this regard, FIG. 10 is another example "top plays" screen that may be used in connection with certain exemplary embodiments, e.g., that incorporates a grid view. The grid-based list 902' includes the same information as shown in the list 902, but the data is rearranged to make it more visually appealing. Navigation through the grid may be provided in manners similar to as described above. It will be appreciated from the FIG. 10 example that songs have been selected for ordering in alphabetical order using sort selectors 910*a*. This selection replaces the numerical scrubber bar 904 and the numerical scrubber bar position indicator 906 with an alphabetical scrubber bar 904' and an alphabetical scrubber bar position indicator 906', as is perhaps more appropriate for such an ordering.

Figure 11:
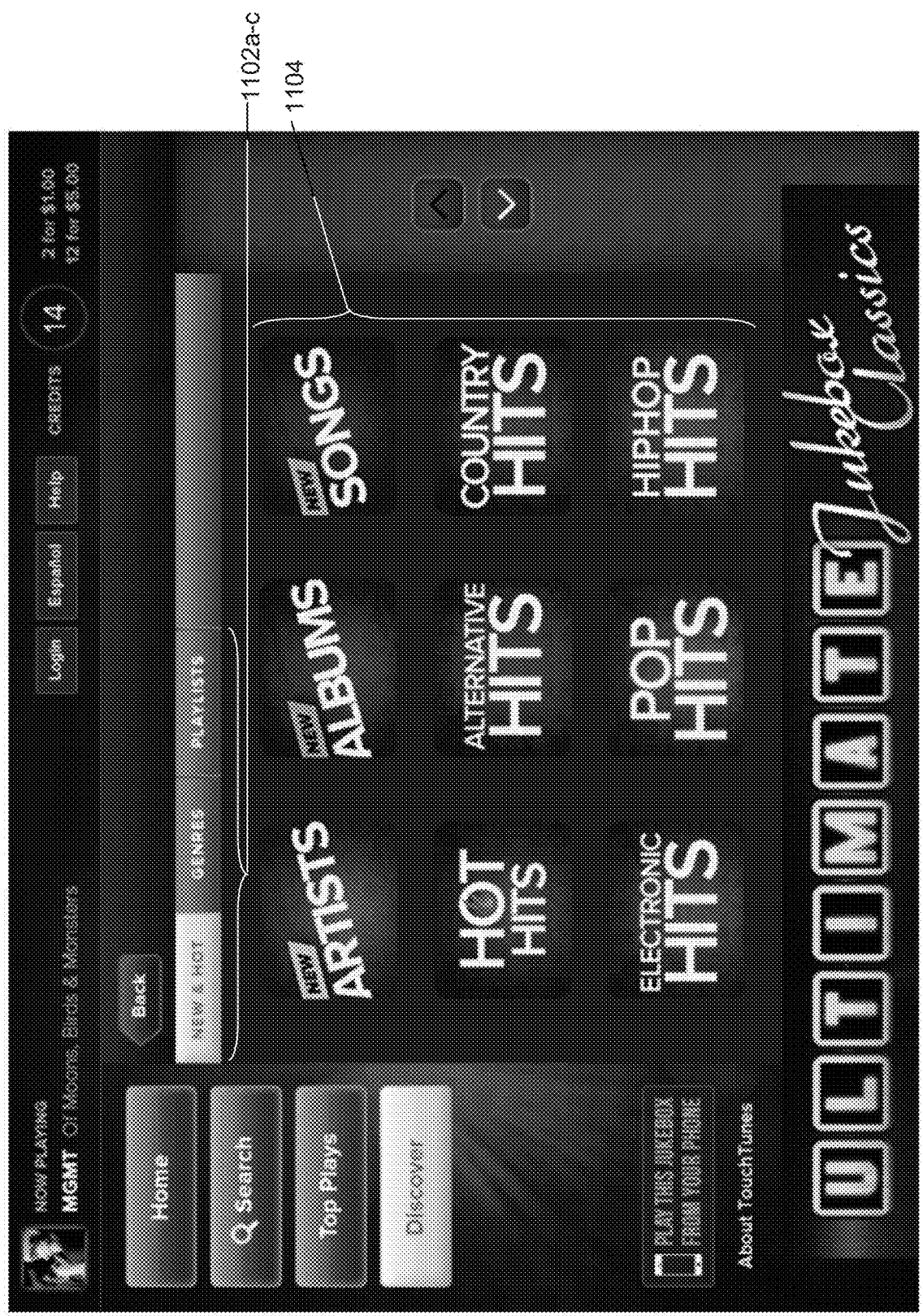
FIG. 11 is an example "discover" screen that may be used in connection with certain exemplary embodiments.

FIG. 11 is an example "discover" screen that may be used in connection with certain exemplary embodiments. The discover screen enables users to select whether categorized sets of songs should be browsed by groups of new and hot music, genres, or playlists, e.g., using the discovery mechanism selectors 1102*a*-1102*c*. Because the "new and hot" discovery mechanism selector 1102*a* is actuated, the categorized sets of songs in the content area 1104 reflect new artists, new albums, new songs, hot hits across genres, and hits within genres. Additional categorized sets of songs may be navigated to using the navigation techniques set forth in detail above. The entries within each category may be based on, for example, actual jukebox and/or jukebox network play, curated sets of music, user-generated content in the form of musical playlists, etc.

Figure 12:
FIG. 12 is an example "new artists" screen that may be selected from the example "discover" screen of FIG. 11.

FIG. 12 is an example "new artists" screen that may be selected from the example "discover" screen of FIG. 11. The example FIG. 12 screen is similar to the FIG. 9 example screen, e.g., in that a list 1202 is provided with artist entries. Additional information (e.g., album art, clean vs. explicit lyrics flags, number of songs, etc.) may be provided. A scrubber bar 1204 with a scrubber bar position indicator 1206 may be used to help navigate the entries, e.g., together with the other navigation techniques described above. A user may switch between list and table views, e.g., using layout selectors 1208*a*-1208*b*. Although not shown in FIG. 12, options for reordering the artists alphabetically may be provided.

Figure 13:
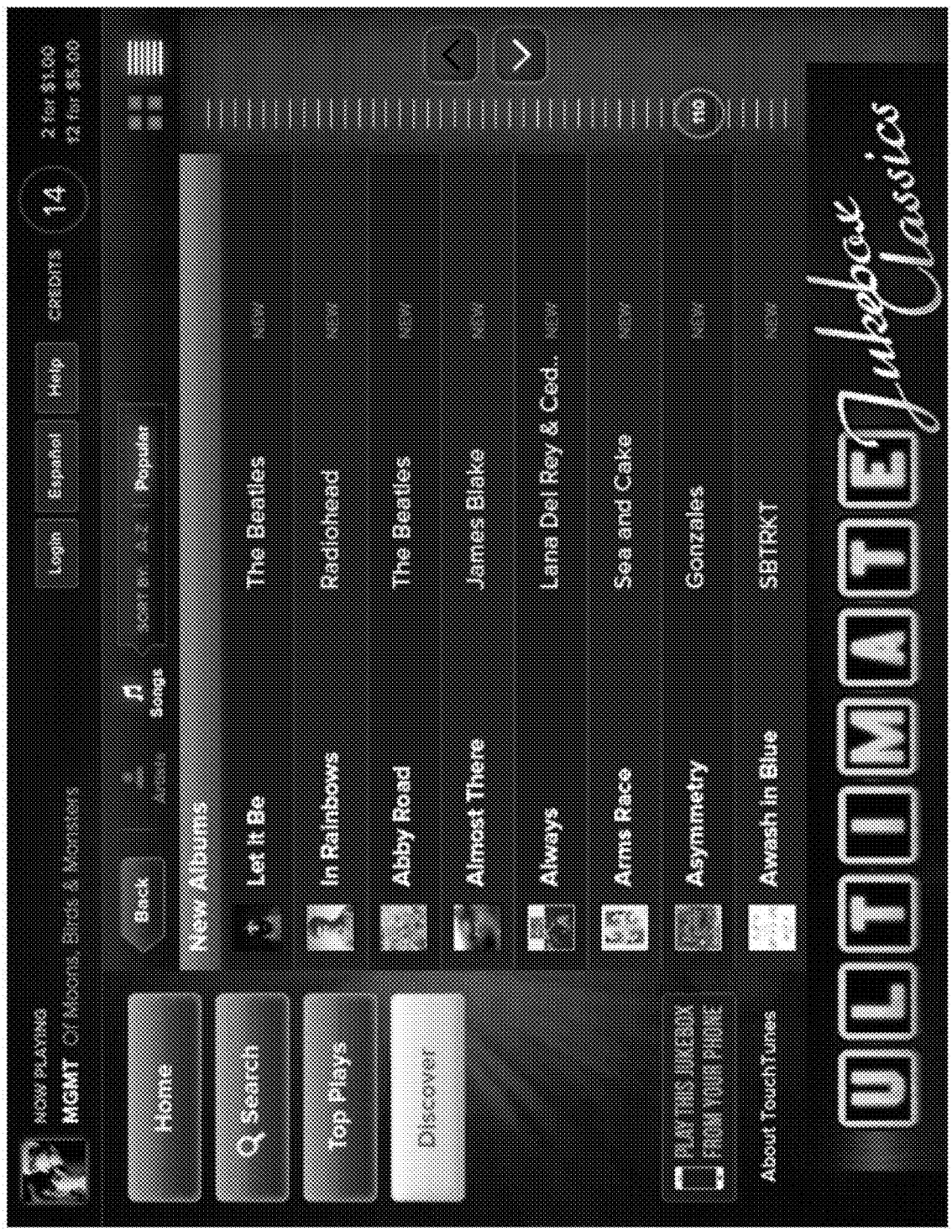
FIG. 13 is an example "new albums" screen that may be selected from the example "discover" screen of FIG. 11.
Figure 14:
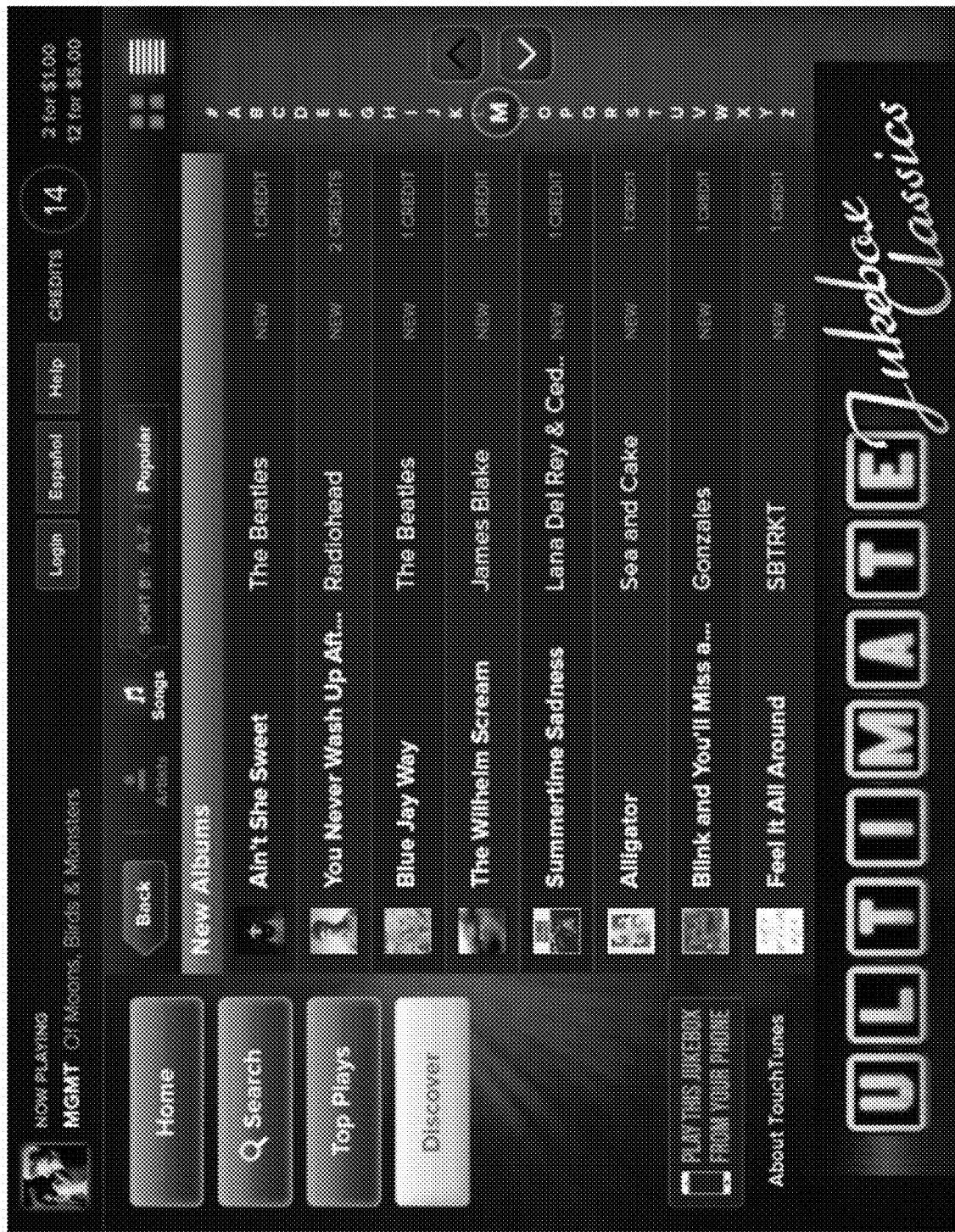
FIG. 14 is another example "new albums" screen that may be selected from the example "discover" screen of FIG. 11.

FIG. 13 is an example "new albums" screen that may be selected from the example "discover" screen of FIG. 11. FIG. 13 also is similar to the FIG. 9 example screen and the same, similar, or different user interface elements may be provided, e.g., for navigating, reordering, and/or otherwise adjusting the entries, etc. Likewise, FIG. 14 is another example "new albums" screen that may be selected from the example "discover" screen of FIG. 11 also is similar to the FIG. 9 example screen and the same, similar, or different user interface elements may be provided, e.g., for navigating, reordering, and/or otherwise adjusting the entries, etc. However, a song popularity ordering may be provided in connection with an alphabetical scrubber bar.

Figure 15:
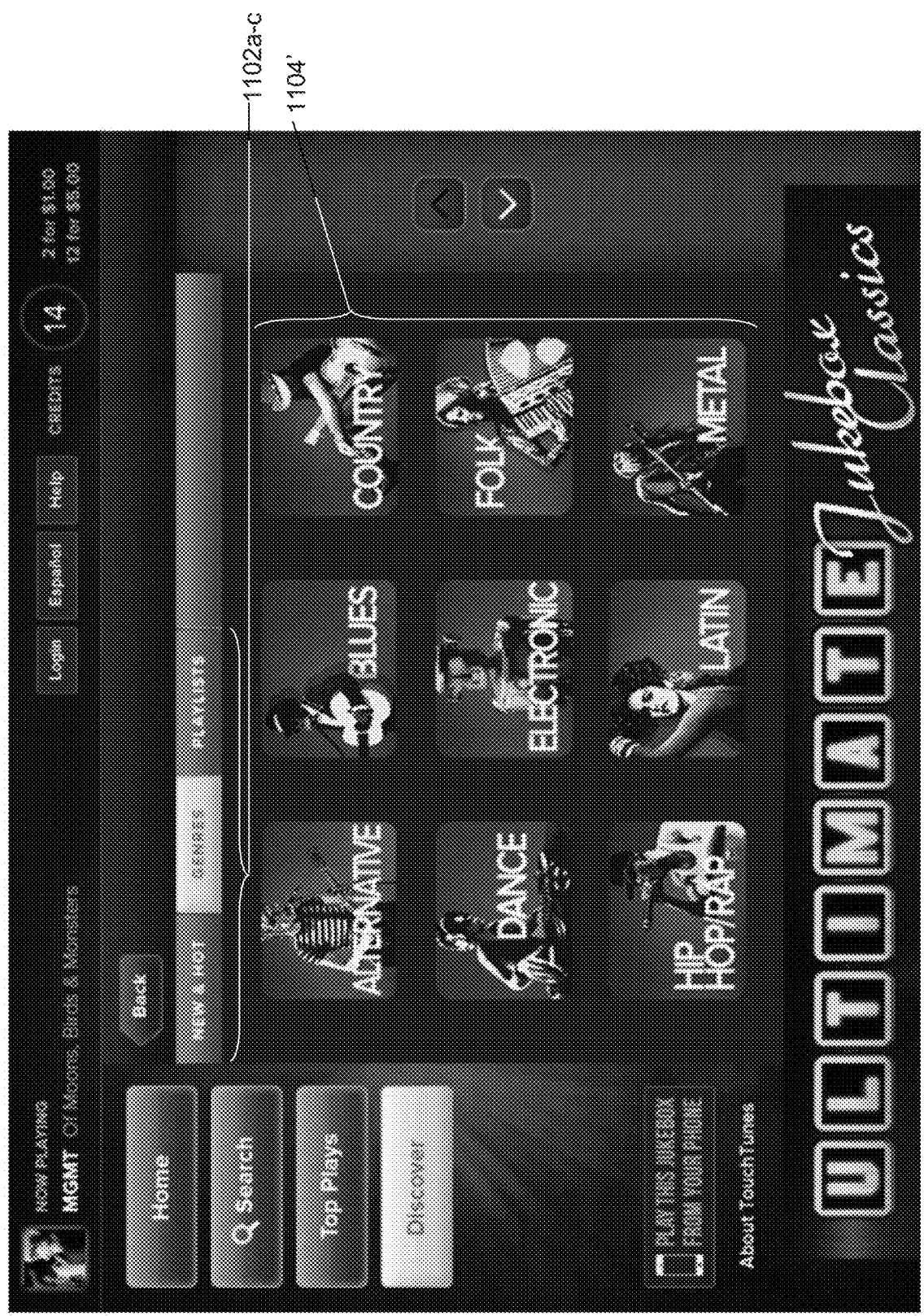
FIG. 15 is another view of the example "discover" screen of FIG. 11 that may be used in connection with certain exemplary embodiments.
Figure 16:
FIG. 16 is another view of the example "discover" screen of FIG. 11 that may be used in connection with certain exemplary embodiments.

FIGS. 15-16 are further views of the example "discover" screen of FIG. 11 that may be used in connection with certain exemplary embodiments. FIG. 15 includes categorized sets of songs in the content area 1104' organized by genres, and FIG. 16 includes categorized sets of songs in the content area 1104" organized by playlists.

Figure 17:
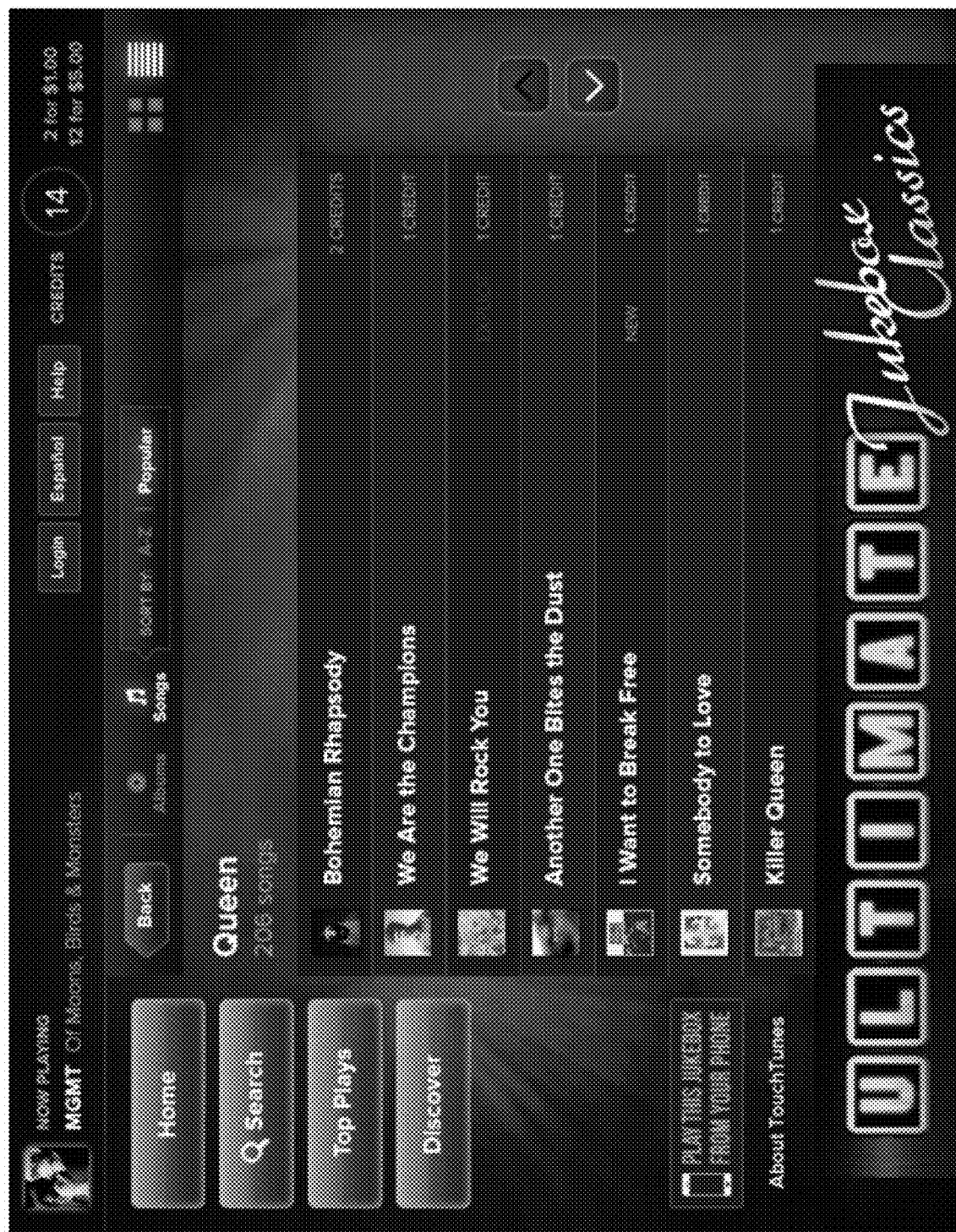
FIG. 17 is an example "song listing page" for a selected artist, in accordance with certain exemplary embodiments.

FIG. 17 is an example "song listing page" for a selected artist, in accordance with certain exemplary embodiments. The FIG. 17 example lists songs for the artist Queen. An indication is provided that 206 songs are provided in the catalog of available songs. As with the examples above, a song listing may be provided in list or grid view, and a user may navigate through the returned entries in the manners set forth above. Artwork related to an album and additional information about the individual song entries also may be provided, e.g., as described above. A user may also reorder entries alphabetically or by popularity, and may switch between album and song views. The FIG. 17 example screen may be reached from (for instance) the example screens shown in FIGS. 3, 6-8, 10-16, and 18 (possibly through a single user interaction), e.g., if an album, artist, playlist, collection, or other appropriate element is selected.

Figure 18:
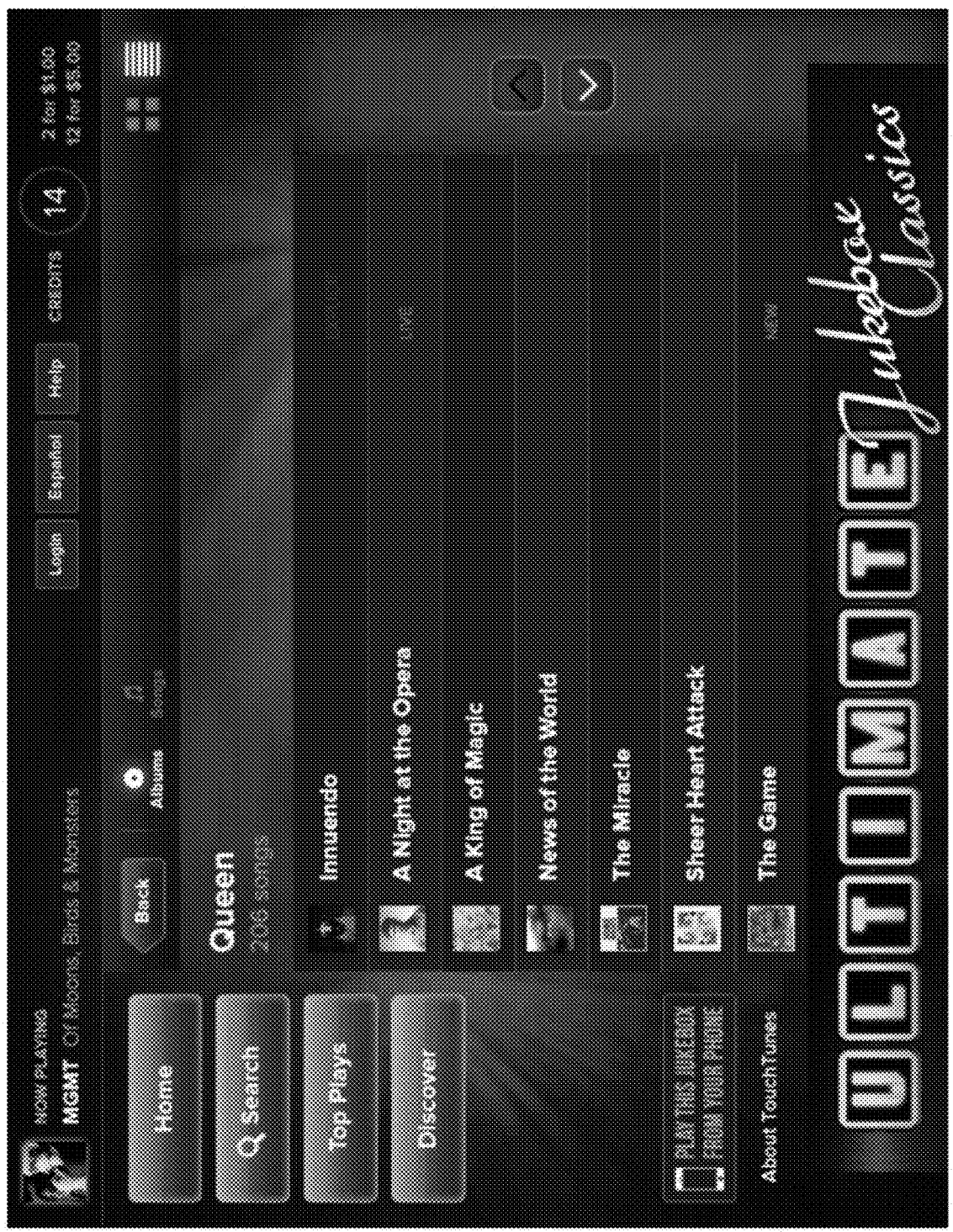
FIG. 18 is an example "album listing page" for a selected artist, in accordance with certain exemplary embodiments.

FIG. 18 is an example "album listing page" for a selected artist, in accordance with certain exemplary embodiments. The FIG. 18 example lists albums by Queen. Once again, an indication is provided that 206 songs are provided in the catalog of available songs. Alternatively, or in addition, an indication of the available albums may be provided. The display, navigation, and other features of FIG. 18 is similar to that described above, e.g., in connection with FIG. 17. The FIG. 18 example screen may be reached from (for instance) the example screens shown in FIGS. 3, 6-8, 11-12, and 15-17 (possibly through a single user interaction), e.g., if an album, artist, playlist, collection, or other appropriate element is selected.

Figure 19:
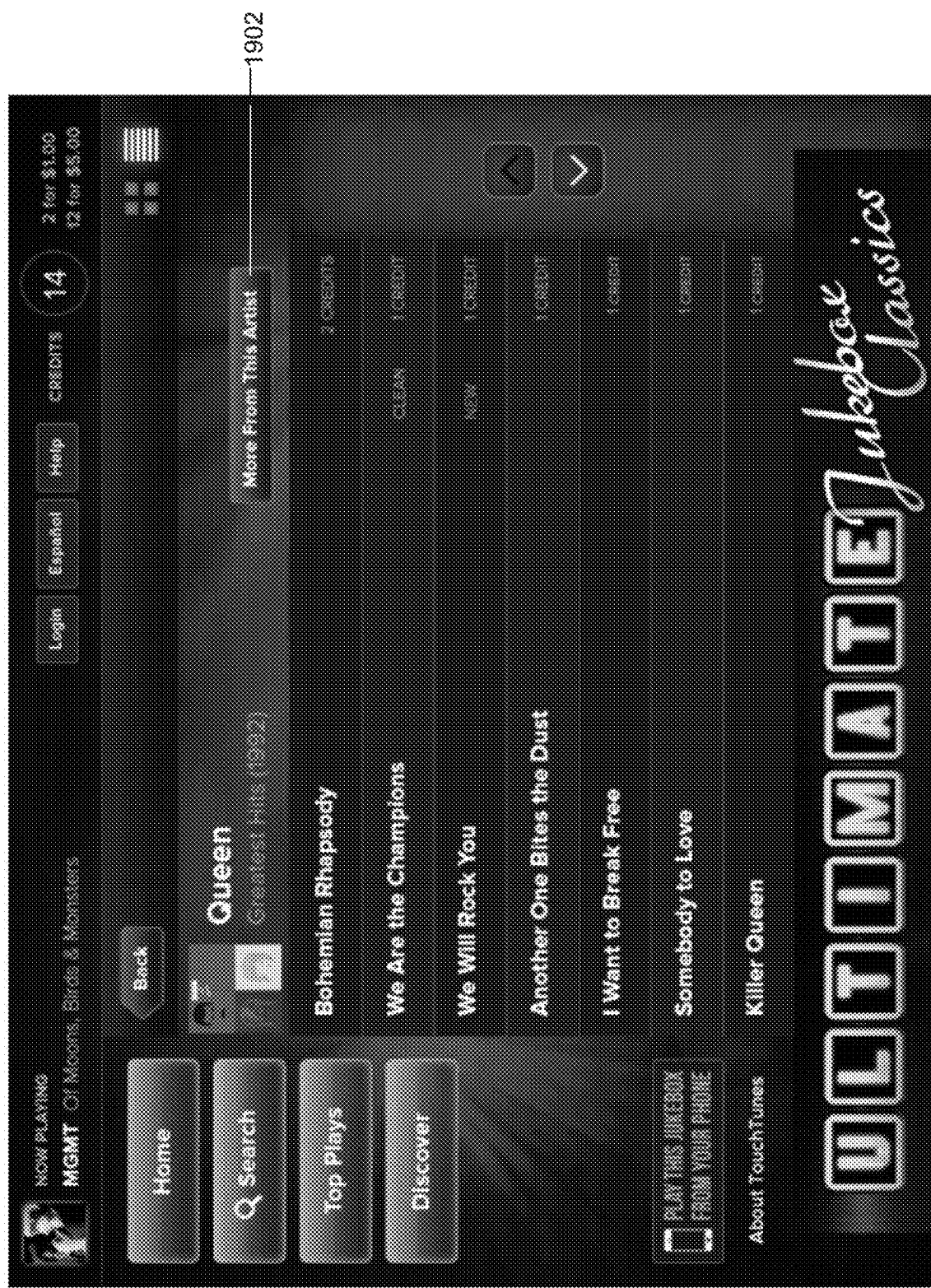
FIG. 19 is an example detailed screen for an album selected from the example "album listing page" of FIG. 18.

FIG. 19 is an example detailed screen for an album selected from the example "album listing page" of FIG. 18. The FIG. 19 example screen may be displayed, for instance, when a user selects an album from FIG. 18. The songs from the album are displayed, along with album art. The navigation, ordering, and other options described above may be available in certain exemplary embodiments. By pressing the more information element 1902, a user may "zoom out" and receive listings of albums and/or songs available from Queen.

When a song is selected, the user may be presented with a screen such as that shown in one of FIGS. 20-23, e.g., depending on the circumstances. That is, FIGS. 20-23 show example "play screens" in accordance with certain exemplary embodiments. These play screens include album art or the like, as well as a textual description of the song and artist name. Copyright information also may be displayed, as desirable or as required by law.

Figure 20:
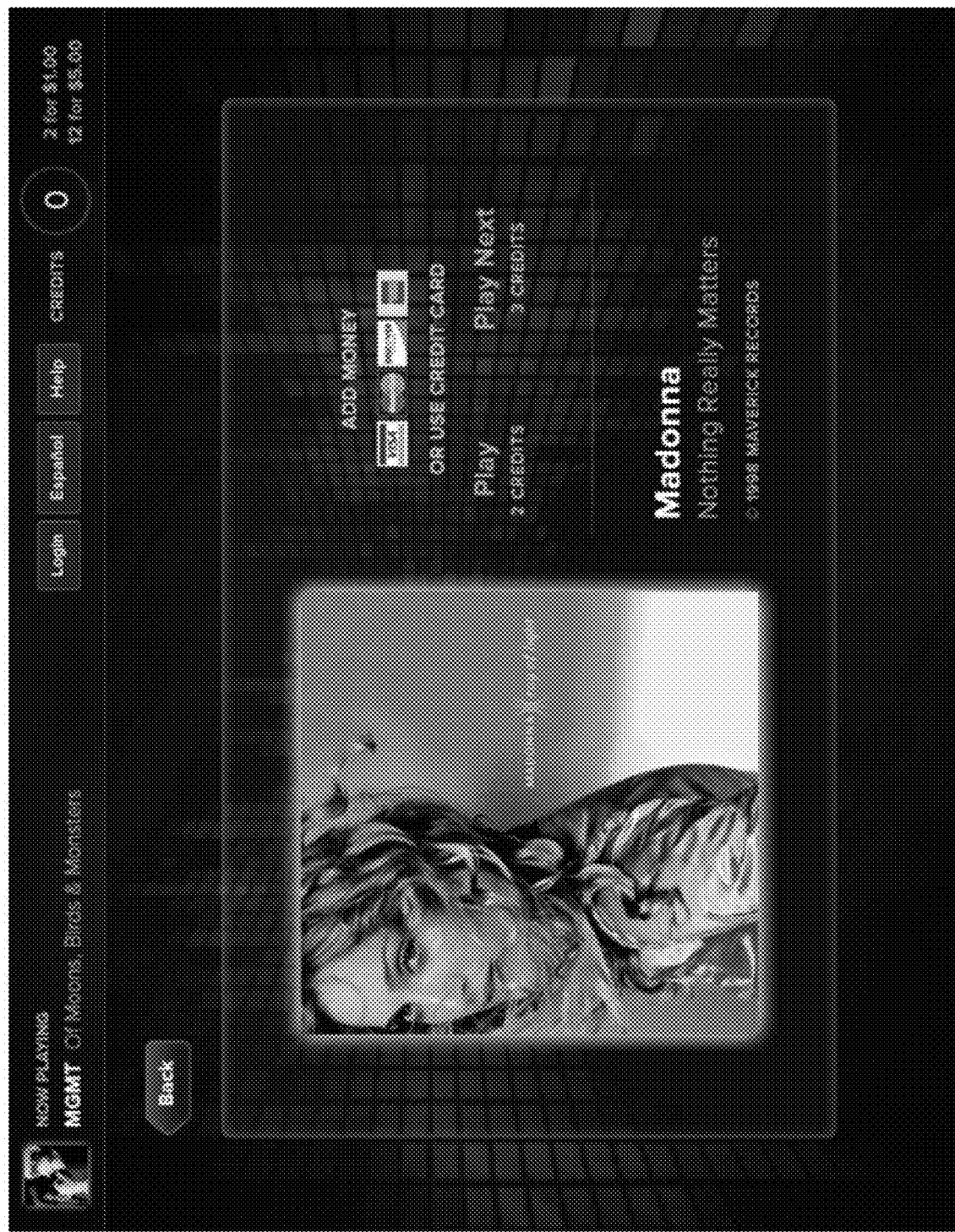
FIG. 20 is an example "play screen" in accordance with certain exemplary embodiments.

As shown in FIG. 20, there are no credits available. Thus, a user is prompted to insert credits for a play operation and a "play next" operation. The "play next" operation may enable the user to pay a premium in order to have the song moved up in the queue, potentially to the next position. A user may pay an extra number of credits for an incremental queue reveal; to "lock in" a play within a certain time period, number of songs, etc.; and/or the like, e.g., in certain exemplary embodiments. As indicated in FIG. 20, payment may be made via cash, credit card, debit card, and/or the like. The FIG. 20 example screen may be implemented as a modal screen, e.g., so as to help drive the user towards an ultimate goal with the understanding that the user is no longer browsing and the decision to play a specific item or do a certain action has been made. Modals may be generally square, appear as "pop ups" over the rest of the content, have a content area within them, have a close modal button, be paired with an overlay over the rest of the content to clearly draw a user towards the center of the modal, etc.

Figure 21:
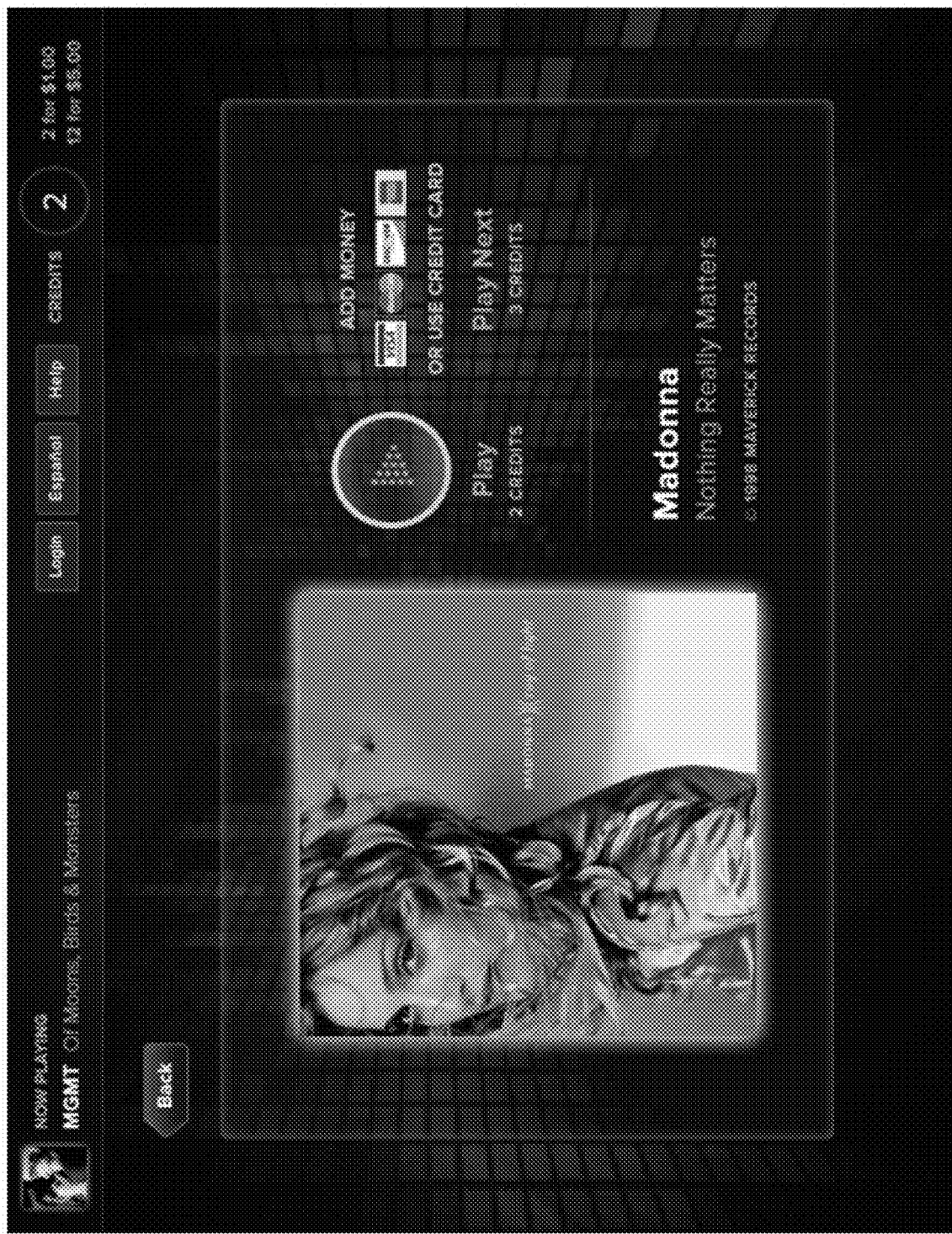
FIG. 21 is another example "play screen" in accordance with certain exemplary embodiments.

FIG. 21 involves a scenario in which there are 2 credits available. In this example, 2 credits are sufficient to play a song but are insufficient to use the "play next" operation. Thus, a control element is provided to enable this "normal" playback, but the payment required information from FIG. 20 is grouped with the "play next" operation indication. This arrangement may help the user understand what options are available with the current number of credits, and what options will require additional credits to become active.

Figure 22:
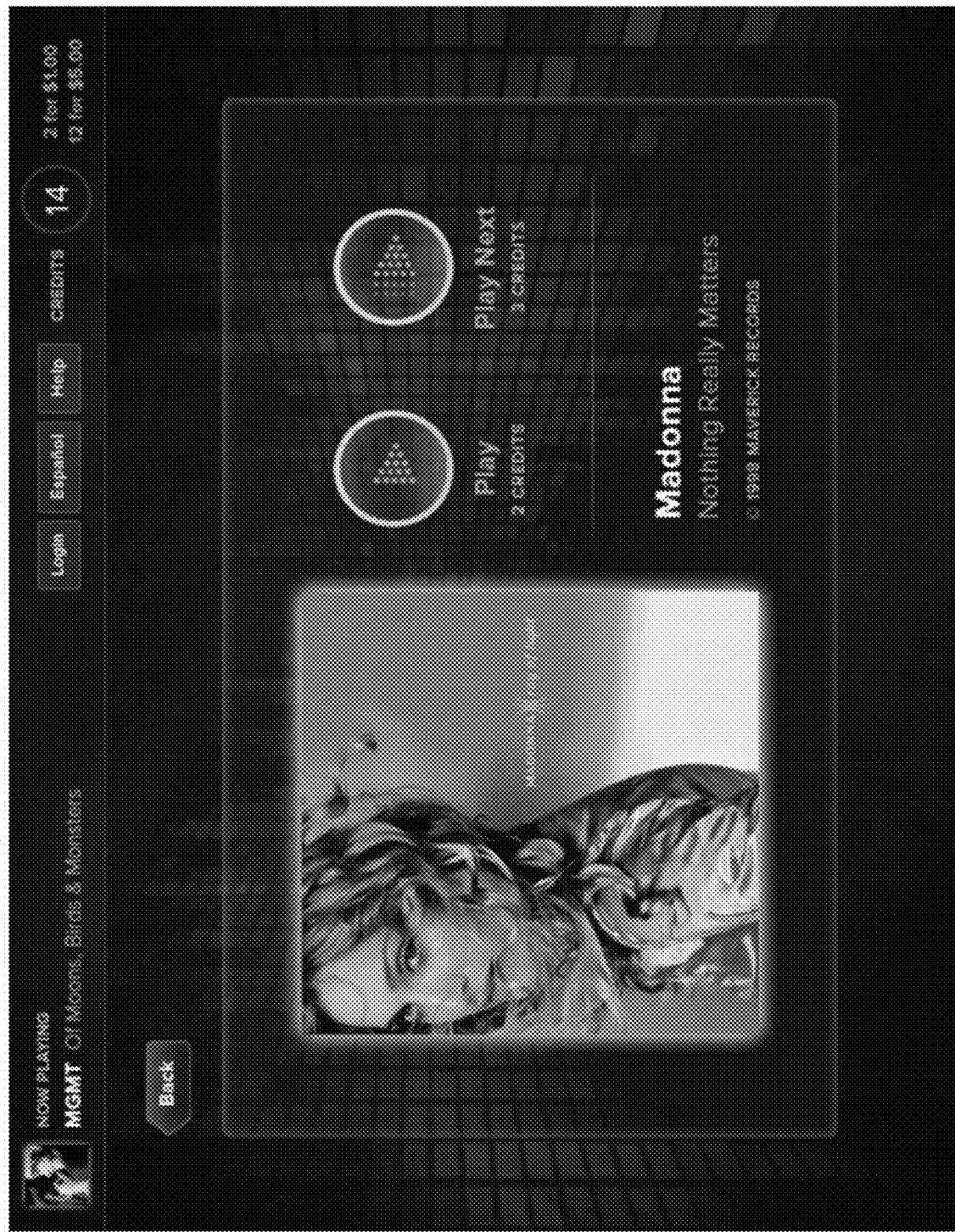
FIG. 22 is another example "play screen" in accordance with certain exemplary embodiments.

FIG. 22 involves a scenario in which there are sufficient credits available for "normal" song playback and "play next" operations. Thus, elements for actuating each option are provided. These elements have a similar visual appearance, but the "play next" operation is more similar to a conventional "fast forward" type button that may be found on a tape, CD, DVD, or other player. This helps to visually highlight the difference in playback approaches.

Figure 23:
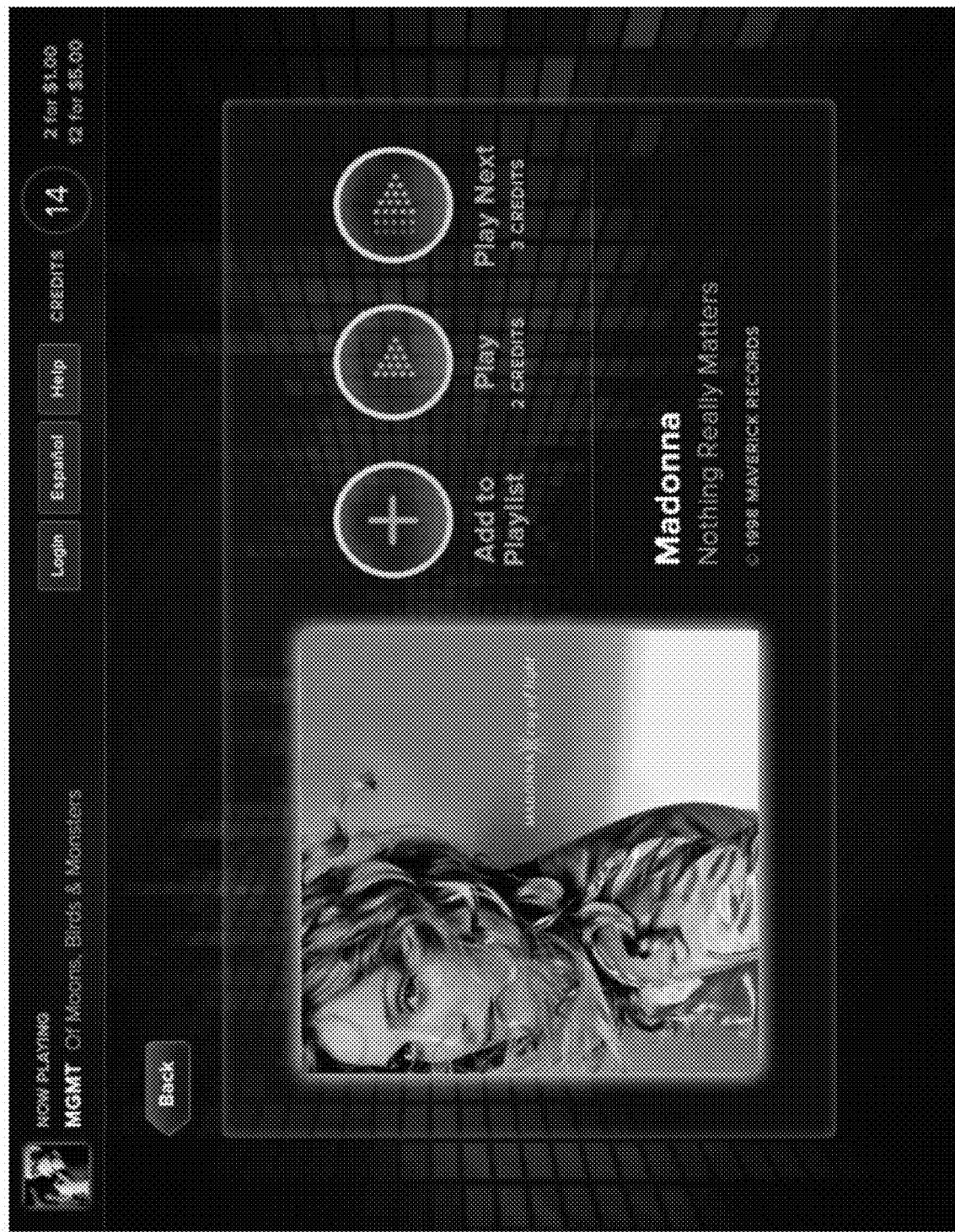
FIG. 23 is still another example "play screen" in accordance with certain exemplary embodiments.

FIG. 23 involves a scenario where a user is able to add a song to a playlist being built. This option may be available only for registered users in certain exemplary embodiments. In other embodiments, it may be available only where users have a sufficient number of credits available to play multiple songs, and the playlist option may enable users to guarantee that multiple songs are played in a specified order and/or the like.

It is noted that other pay-for-play options may be represented in the manners described above and/or other similar or dissimilar manners. For example, options may be provided enabling a user to pay a premium to trigger song plays within a particular area or particular areas in an establishment, across multiple establishments, etc.

Figure 24:
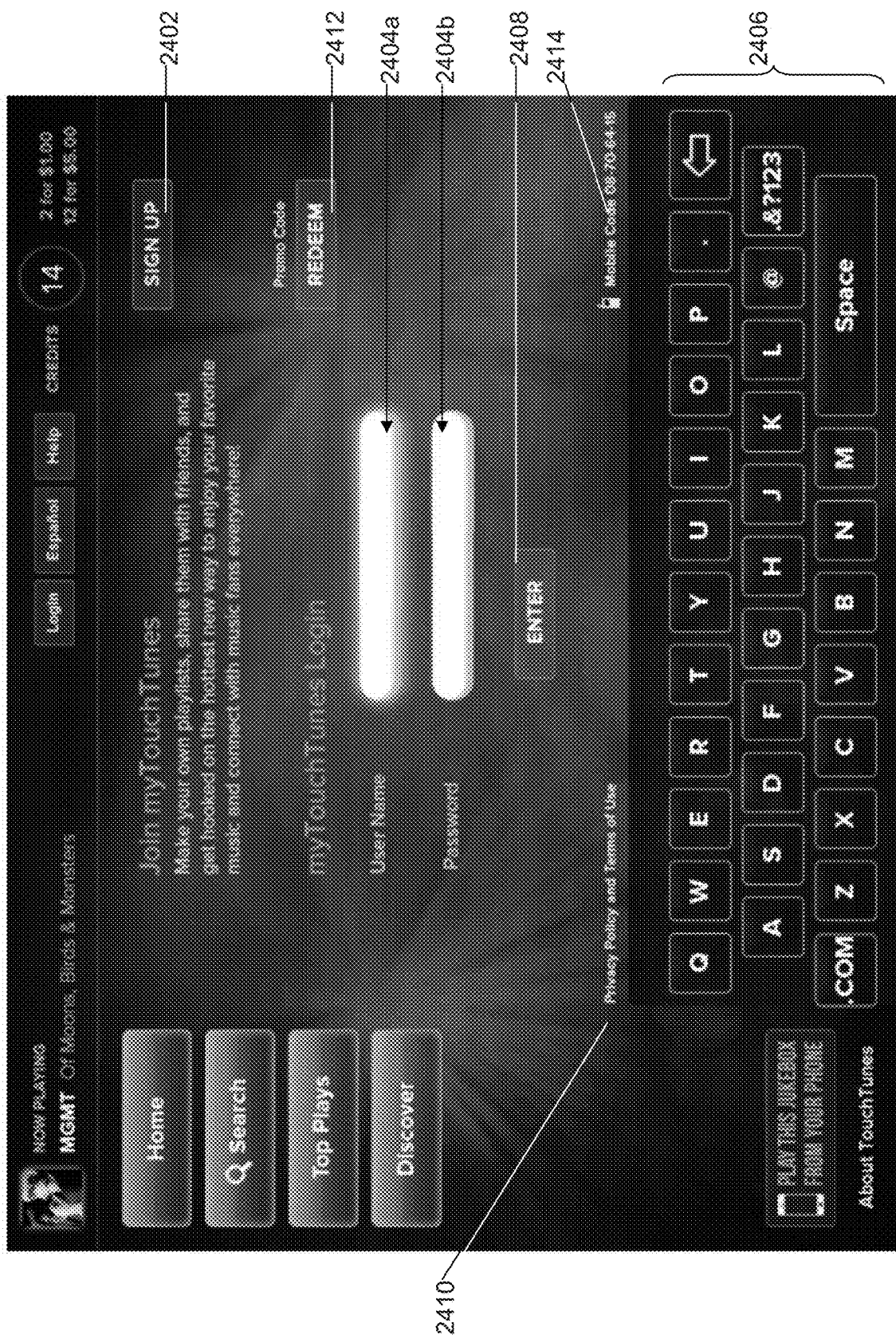
FIG. 24 is an example myTouchTunes login screen in accordance with certain exemplary embodiments.

FIG. 24 is an example myTouchTunes login screen in accordance with certain exemplary embodiments. This example screen may be displayed when the login button on the upper status bar is pressed, for example. As can be seen, an upper portion of the screen enables unregistered users to sign up for an account, e.g., by pressing the sign up element 2402. Already registered users may simply enter their user names and passwords in the corresponding text input areas 2404a and 2404b, e.g., using the keyboard 2406, and pressing the enter element 2408. Terms and conditions of use and the like may be provided to a user who presses the element at 2410. Promotional codes for the jukebox, e.g., from the venue, from an operator, from the jukebox provider, from an advertiser, and/or other party, may be redeemed by pressing the redeem button 2412. The promotional codes may entitle the user to free credits usable on the jukebox, access to otherwise hidden playlists and/or musical selections, special advertisements, custom multimedia and/or other messages; etc. The promotional codes that are entered may be checked against database entries stored locally, in the central server, and/or elsewhere, and the jukebox may be made to take an appropriate action based on a successful look-up operation.

A mobile code 2414 may be generated, e.g., enabling the user to access site specific information concerning the jukebox, to follow-up with subsequent registration of a new account, to enable a user to log in to the specific jukebox by entering the code, etc.

Another example user interface will now be described in connection with the example screenshots provided in FIGS. 25-47. Many of the features described above (e.g., in connection with the example user interface described in connection with FIGS. 3-24, for instance) may also be used in connection with this example user interface. Thus, the discussion of certain elements may be shortened or omitted, but those skilled in the art will understand what is meant.

Figure 25:
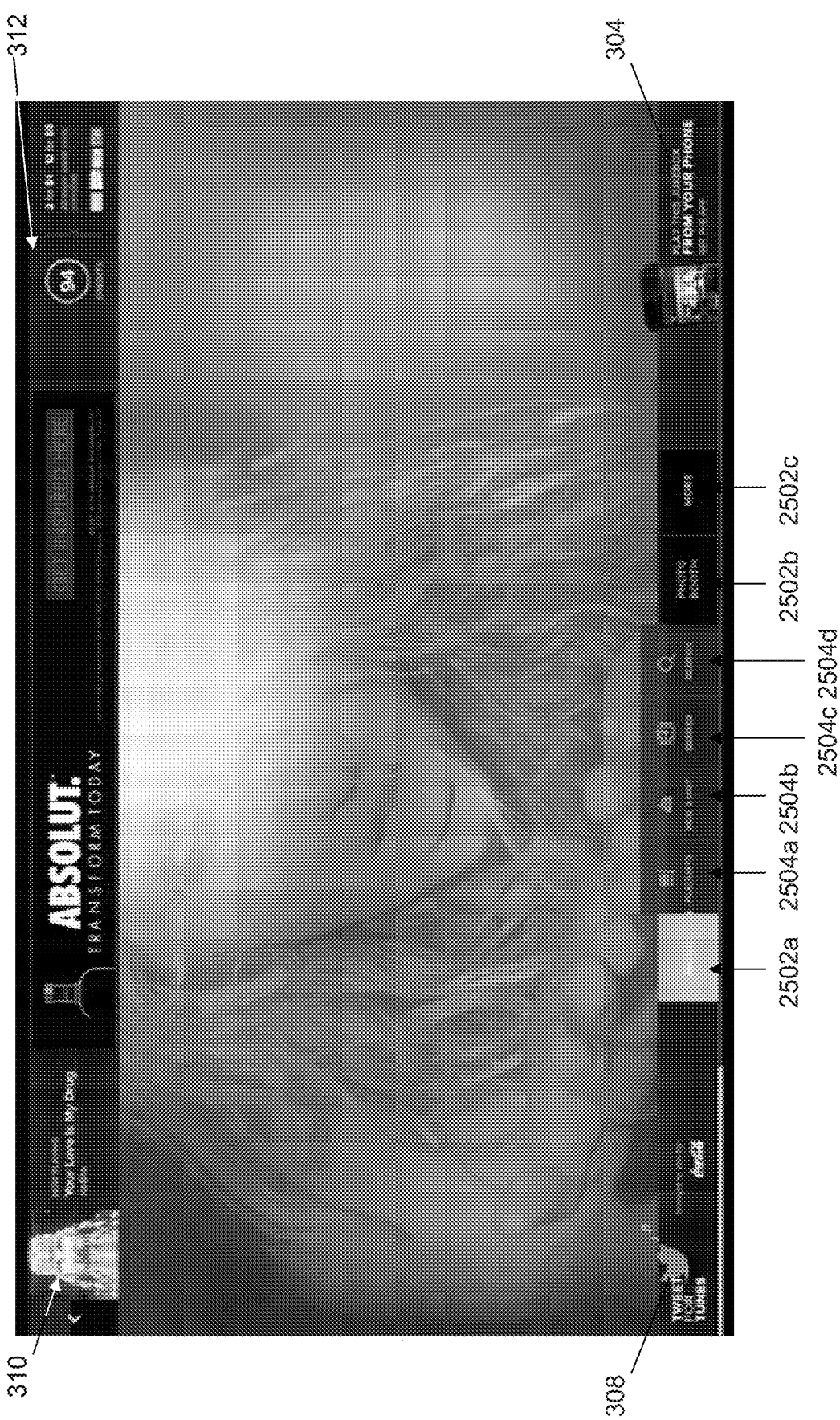
FIG. 25 shows the outline of an example screen on which other user interface elements may be located in connection with certain exemplary embodiments.

FIG. 25 shows the outline of an example screen on which other user interface elements may be located in connection with certain exemplary embodiments. In other words, it will be appreciated that the user interface elements at the top and bottom of this example layout may be maintained throughout the various selections and updated displays discussed below. This example screen includes an indication of the currently playing song. Because the song is "Your Love Is My Drug" by the artist Ke$ha, and because no other artist-specific page is selected, the background screen includes an image of Ke$ha. This artwork clearly identifies the artist whose song is being played, and may be provided by the artist, record label, or other party, but may or may not necessarily be tied to "album art" as that term is commonly used by those skilled in this art. For example, the artwork may be supplied by a music department of the jukebox provider, it may correspond to a recently "Tweeted" image that has or has not been modified, or other image retrieved from a social media page of the artist, etc. Referring once again to the upper bar area in the FIG. 25 example, a sponsored advertisement is displayed, as is a credit meter, and information about how to purchase credits. A smaller sponsored advertisement also is displayed in the lower bar area in the FIG. 25 example. One or both of these may be liked to the song being played. In certain exemplary embodiments, the image shown on the homepage may display a randomly selected artist image each time it is activated. If a genre is filtered out, thereby implying that a particular artist tagged as being associated with a particular genre should not be shown, then that image should not be displayed. In certain exemplary embodiments, rather than random selection, looping between images in a predefined order may be implemented. In some cases, it may not be desirable to display artist images, e.g., to help keep the background clean and easy to use. For instance, in the genres, new and hot playlists, and search screen, and possibly any respective sub-screens, it might in some cases be desirable to not use a background artist image for overall clarity.

A horizontal arrangement of first-level control items 2502a-2502c is shown in the lower bar area in the FIG. 25 example. These first-level control items 2502a-2502c may enable a user to switch between different modes of the jukebox. For instance, a first first-level control item 2502a enables the user to access music-related features, a second first-level control item 2502b enables the user to access photo booth related features, and a third first-level control item 2502c enables the user to access additional features of the jukebox (which may include, for example, karaoke features, access to legal or other rights information, help functions, etc.). Some or all of these first-level control items 2502a-2502c may be expandable to enable further selections relevant to the specifically selected first-level control item. In the FIG. 25 example, the first first-level control item 2502a is selected (and thus highlighted) and second-level items 2504a-2504d are shown in an expanded view along the lower bar area. These second-level items 2504a-2504d respectively enable a user to access a collection of playlists, a collection of "new and hot" items, a collection of genres, and a search interface. The functionality behind these features will be understood from the descriptions herein.

In certain exemplary embodiments, all first-level control items 2502a-2502c and all second-level items 2504a-2504d may be displayed at the same time. Vertical sub-menus may be provided to enable access to some other non-core jukebox related features (such as, for example, language, myTouch-Tunes, About TouchTunes, Help, etc.). In certain exemplary embodiments, from a navigation/action perspective, each element, when selected, may either open a submenu for the app (e.g., as shown for the second-level items 2504a-2504d) or, if no submenu is available, it instead may open the desired application in full screen mode (e.g., where the top and bottom bars are maintained, but the main content of the application, e.g., the photo booth application, takes over the main content area). Each button may rotate through several predefined applications such as, for example, photo booth, karaoke, games, etc.

Figure 26:
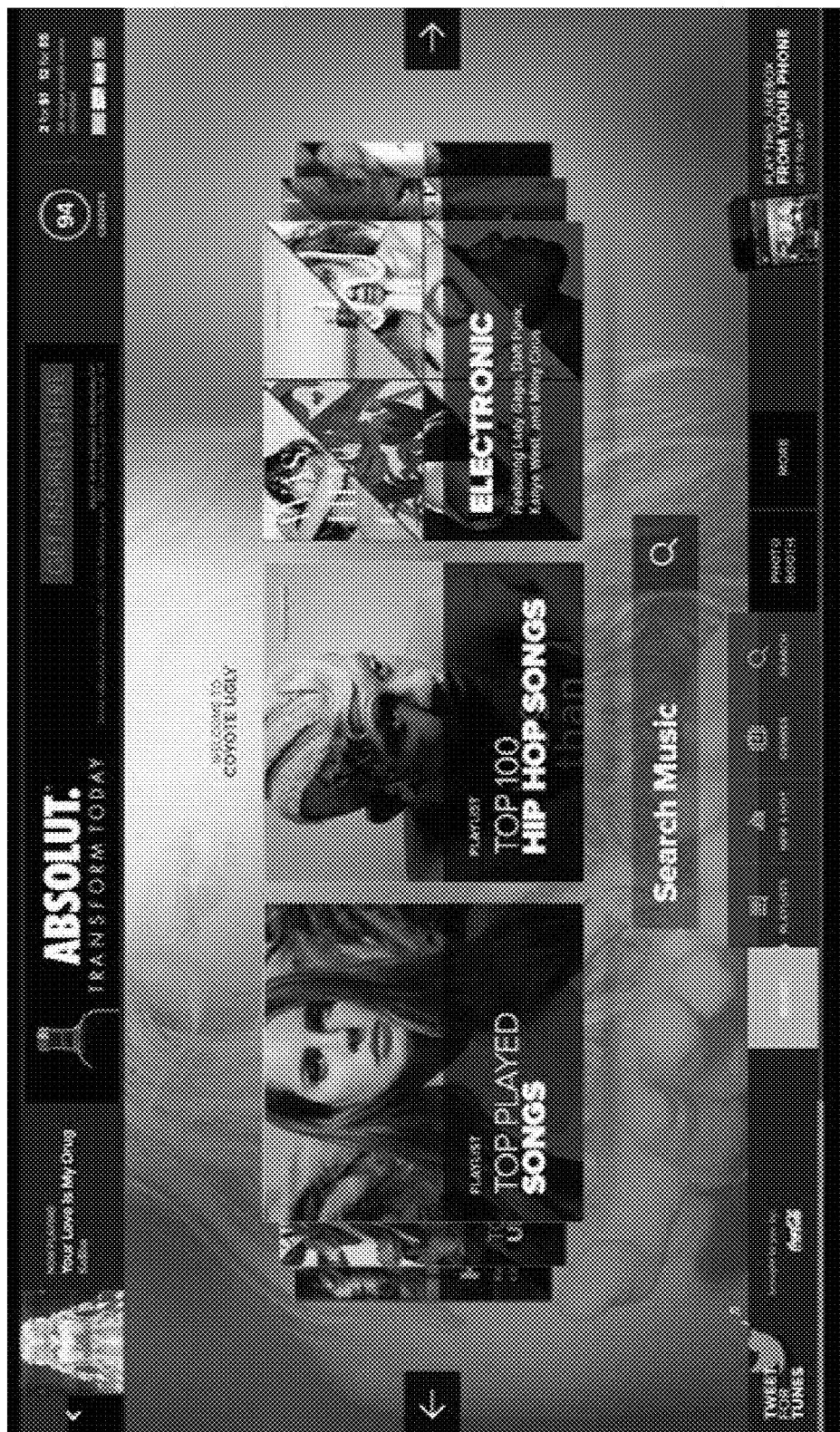
FIG. 26 shows a carousel view superimposed on the FIG. 25 example layout in accordance with an exemplary embodiment.
Figure 27:
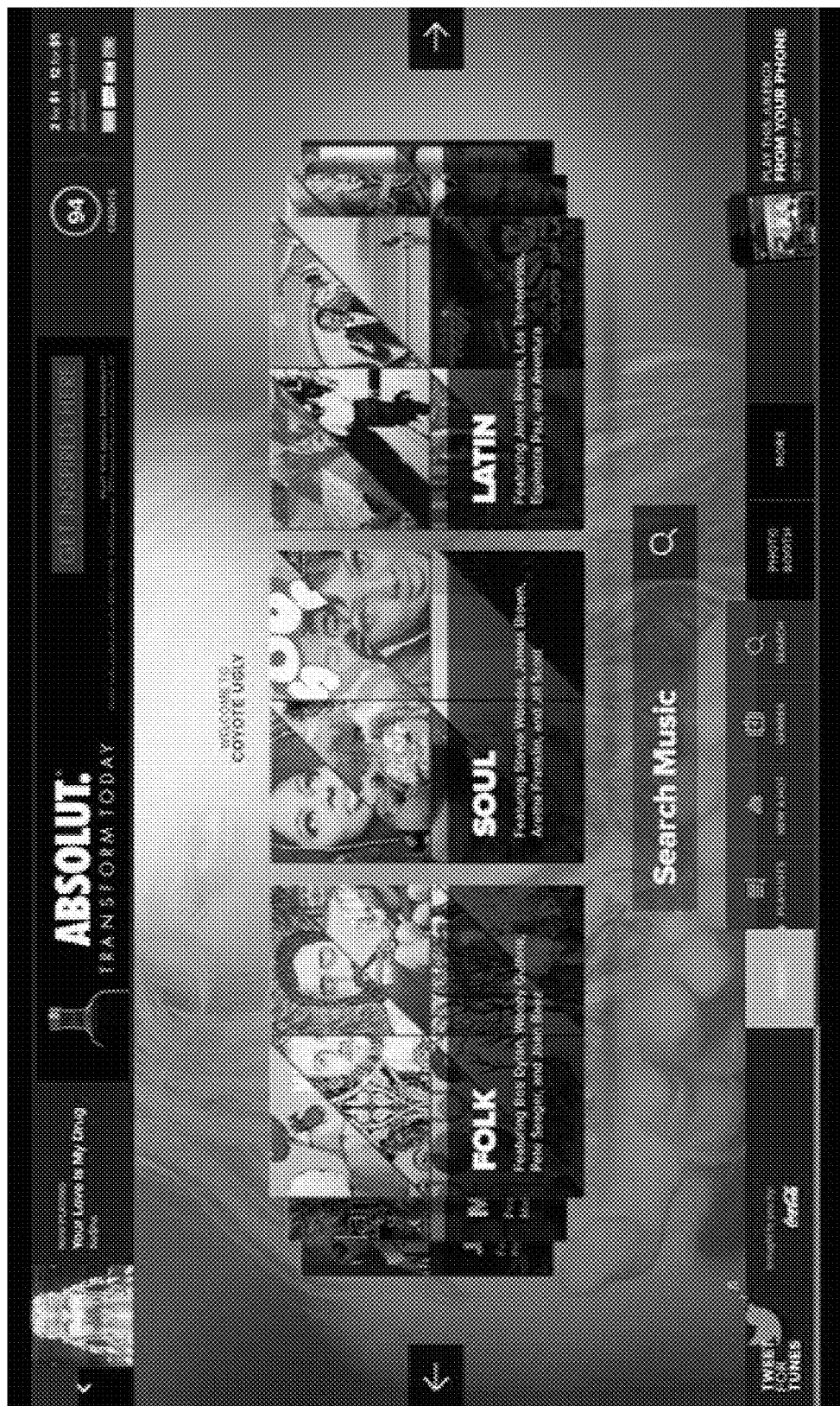
FIG. 27 shows an updated carousel view, e.g., after a user has "flipped through" at least some of the tiles from FIG. 26, in accordance with an exemplary embodiment.

FIG. 26 shows a carousel view superimposed on the FIG. 25 example layout in accordance with an exemplary embodiment. The carousel view in the FIG. 26 example includes different playlists, which may be custom-curated as indicated above. An indication of the venue (Coyote Ugly in this example) is provided, as is a larger search icon. The playlists are represented by tiles, and a user may navigate among the tiles by pressing an arrow button to the left or right, or by swiping left or right with a pointing device, finger, or the like, e.g., in embodiments where touch screen display devices are used. FIG. 27 shows an updated carousel view, e.g., after a user has "flipped through" at least some of the tiles from FIG. 26, in accordance with an exemplary embodiment.

The contents of each tile may be based on the content of each underlying playlist that the tile represents. Image and/or text may be provided. For instance, the "Electronic" playlist features includes music from artists including Lady Gaga, Daft Punk, Kanye West, and Miley Cyrus, etc. Thus, text and image information is shown in the tile in this example. As shown in the FIG. 26 example, an image for each featured artist is displayed in a predefined format (e.g., a triangular area). These images may be related to the artists but need not necessarily be tied to "album art." For instance, an image of Miley Cyrus taken during her "Bangerz" tour may be displayed, a picture of Kanye West with Kim Kardashian and/or North West may be displayed, etc. Even though these images might not be associated with the underlying albums, they nonetheless might "resonate" or otherwise convey meaning and customization to fans. These images may be updatable, e.g., by a central music department, by the artist, by a record label, etc., so as to continue to be meaningful. The ability to update image data and/or playlist content makes for more dynamic content that is meaningful and delivered in a relevant timeframe. For instance, in certain exemplary embodiments, the playlists and/or contents thereof might change, e.g., as current events unfold, thereby suggesting that different text and/or image information should be displayed for the same or different playlists. For instance, Michael Jackson's death might have been associated with a customized playlist that was relevant for an amount of time while there was still "buzz" associated with his death, an image of Miley Cyrus' tongue might have been relevant following her 2013 VMA performance, and currently Mick Jagger might stay in the news for a few weeks following the apparent suicide of his longtime lover L'Wren Scott. As another example, although Katy Perry has remained atop the pop charts and "in the news," the reasons for her doing so may have changed—and thus the artwork may change from images associated with her "Roar" music video to her "Dark Horse" while being tied into her Prismatic Tour and/or her efforts towards being named artist of the year and/or earning song of the year award at the iHeartRadio Music Awards. It thus will be appreciated that the images in certain exemplary embodiments may belong to a label or other party but need not necessarily be from a particular album—and such non-album art images may be used in any suitable location in the example user interfaces described herein.

In certain exemplary embodiments, a central storage location may host image information, playlist information, and/or the like. Structured information (e.g., an XML file, a database, etc.) and/or the like including the contents of the playlists, the images that map up with the entries therein, flagged items selected to constitute the playlists' respective tiles, etc., may be used in this regard. This information may be downloaded by individual jukeboxes at predefined intervals and/or on demand, may be pushed to jukeboxes upon updates and/or triggers from an authorized source, etc.

In the FIG. 26 example, each tile includes a tile image and a title bar. The image may be dynamically generated by using the following example rules. If a manual image is chosen by an authorized user, then that image should be displayed. This image can be a full takeover of the container, or just use the space of the image with a dynamically generated title bar, etc. If no manual image has been defined for a piece of content on the carousel, then the system may default to finding "featured art" from a song within the content's list and displaying that along with the dynamic title bar. That image may be selected at random, based on the first item appearing in the playlist, based on the most popular item in the playlist (e.g., in terms of play on the jukebox network, radio play, play at the location, etc.). If no art has been marked as "featured," then the carousel may select the most popular song from the list and display that song's album art with the dynamic title bar. The title bar in the FIG. 26 example is the dynamically generated "black bar" that overlays the image and displays up several lines of text. The number of songs in the collection is displayed in this example.

Figure 28:
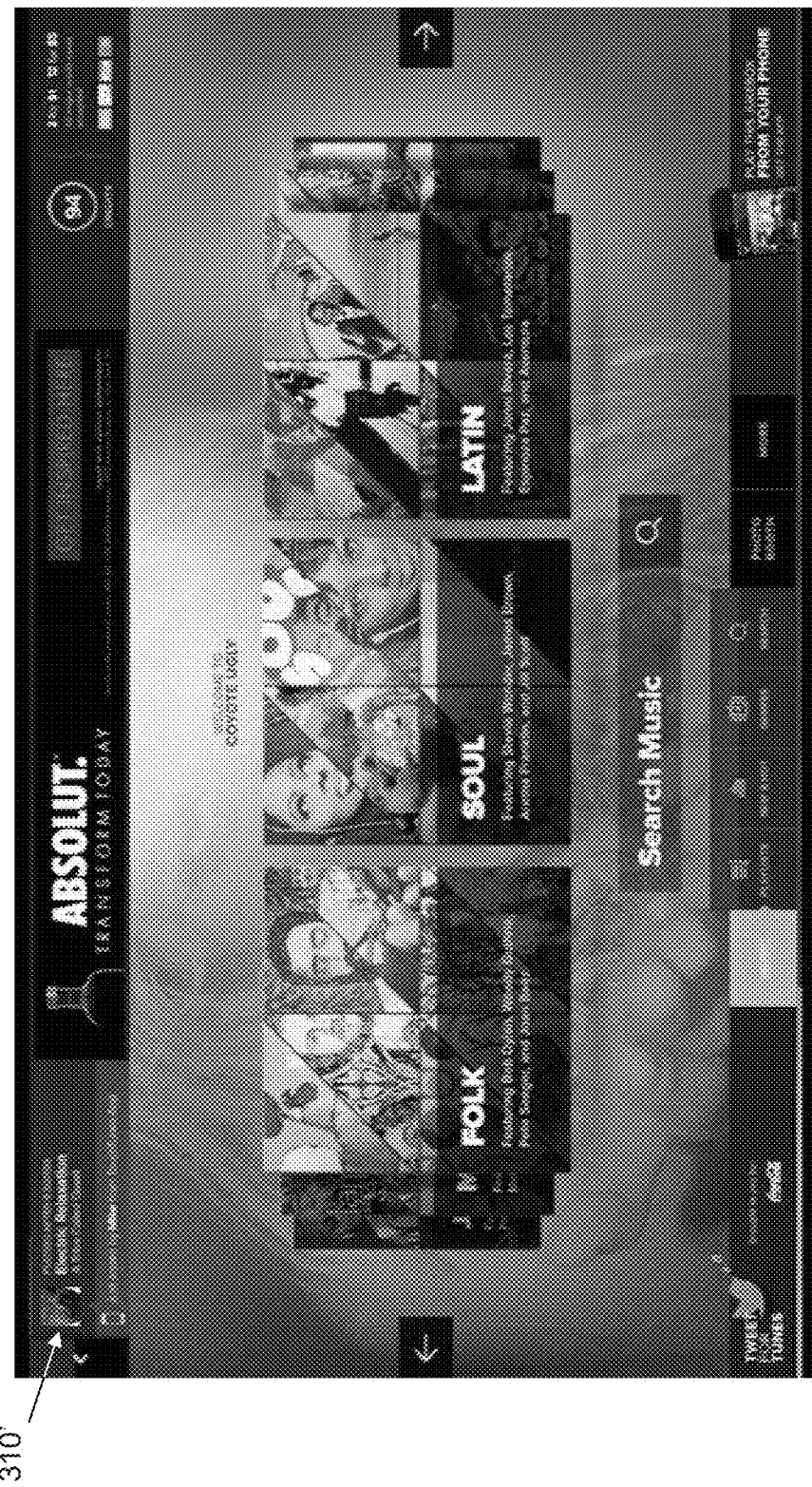
FIG. 28 shows an update to the FIG. 27 example screen that may be made when a new song is added to the queue, in accordance with certain exemplary embodiments.

FIG. 28 shows an update to the FIG. 27 example screen that may be made when a new song is added to the queue, in accordance with certain exemplary embodiments. That is, the "now playing" indication 310 may be at least temporarily replaced with an indication of the newly added item 310'. In this case, text indicating the artist and the song is provided together with an image related to same. Again, this image need not necessarily be "album art," although it might be in certain exemplary embodiments (e.g., it might be album art associated with the first song in the playlist in certain exemplary embodiments). The way in which it was added to the queue might also be indicated. For instance, in the FIG. 28 example, an indication is provided that the song was added via a mobile app, rather than by the jukebox itself. In certain exemplary embodiments, the fact that a mobile app was used may be advertised, whereas the fact that the jukebox itself was used may not be. This may raise awareness of the mobile app and encourage others to download it, e.g., to sign up and become registered jukebox users, etc. If the user who made a selection is a registered user, the user's name, nickname, avatar, and/or other identifier may be displayed. This may be the case regardless of whether the selection was made at the jukebox, via a mobile device, etc., in certain exemplary embodiments. In other exemplary embodiments, the user's identifier will not be displayed if the user makes the selection from the jukebox. In certain exemplary embodiments, registered users might elect to opt out of or into having their names or other identifiers displayed upon selections being made and added to the queue.

Figure 29:
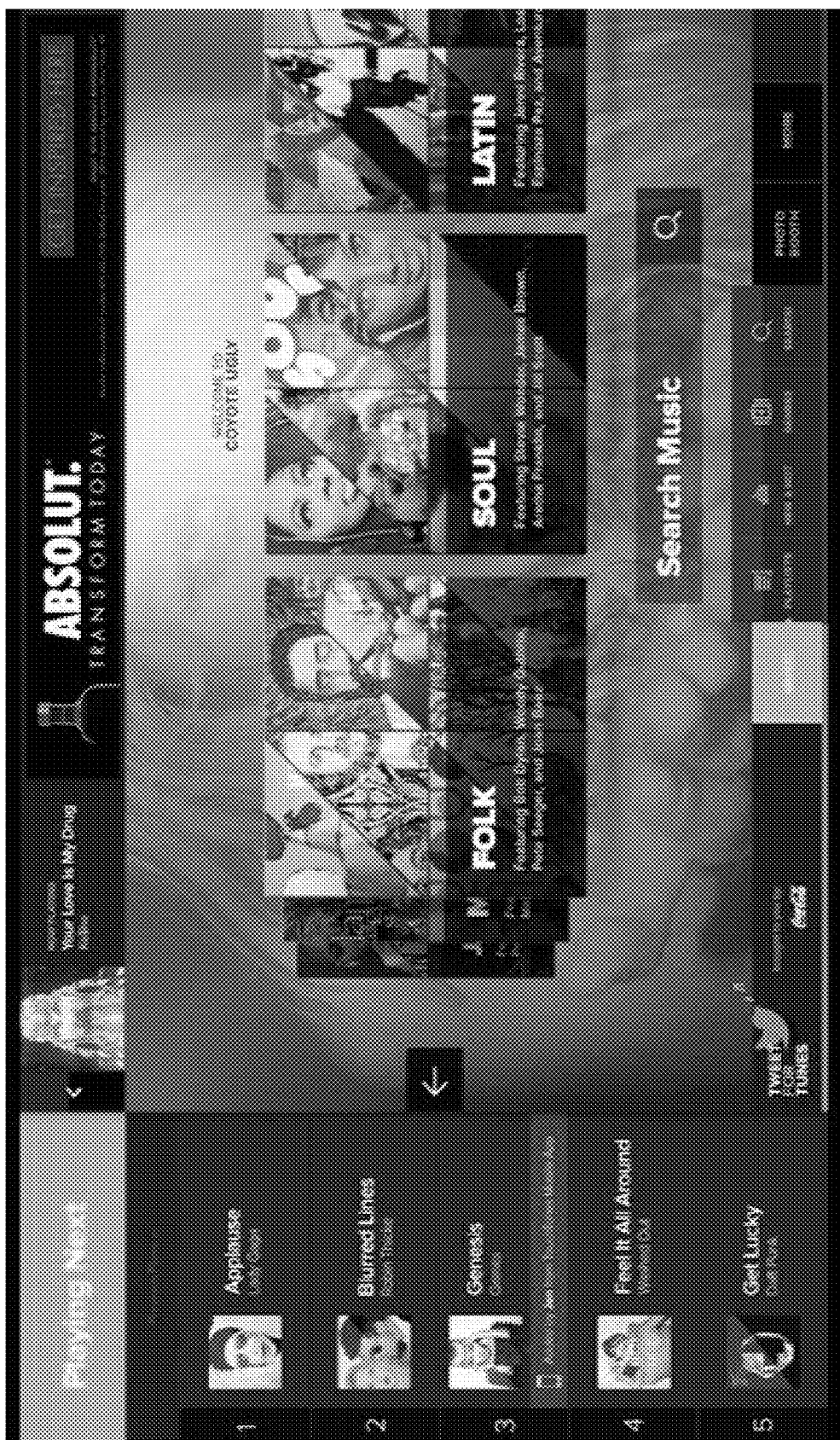
FIG. 29 is an example screenshot showing the FIG. 28 screen being modified to accommodate a partial queue reveal, in accordance with certain exemplary embodiments.

If a user selects the "now playing" indication 310 or the indication of the newly added item 310', or selects the arrow to the left of it in certain exemplary embodiments, a portion of the jukebox queue may be revealed, e.g., as shown in FIG. 29. That is, FIG. 29 is an example screenshot showing the FIG. 28 screen being modified to accommodate a partial queue reveal, in accordance with certain exemplary embodiments. As will be appreciated from a comparison between FIG. 28 and FIG. 29, the FIG. 28 screen is "shifted to the right" to make room for the revealed queue area. A user may "close" the revealed queue area by selecting the playing next element, an element in the right side of the screen, "dragging" to the left through the touch or other interface, by selecting a dedicated close button for the revealed queue area, etc. The jukebox may in certain exemplary embodiments reveal details about a predetermined number of elements in the queue "for free." This may include, for example, some or all of song/artist information, images, beats per minute, etc. In certain exemplary embodiments, the user may need to provide credits to see additional songs and/or additional details of the songs. That is, certain exemplary embodiments may show full details for the next X songs in the queue, partial details for Y songs thereafter, even less information for Z songs thereafter, and no information beyond that point. However, a user may pay additional credits to reveal more and more information in different exemplary embodiments.

Figure 30:
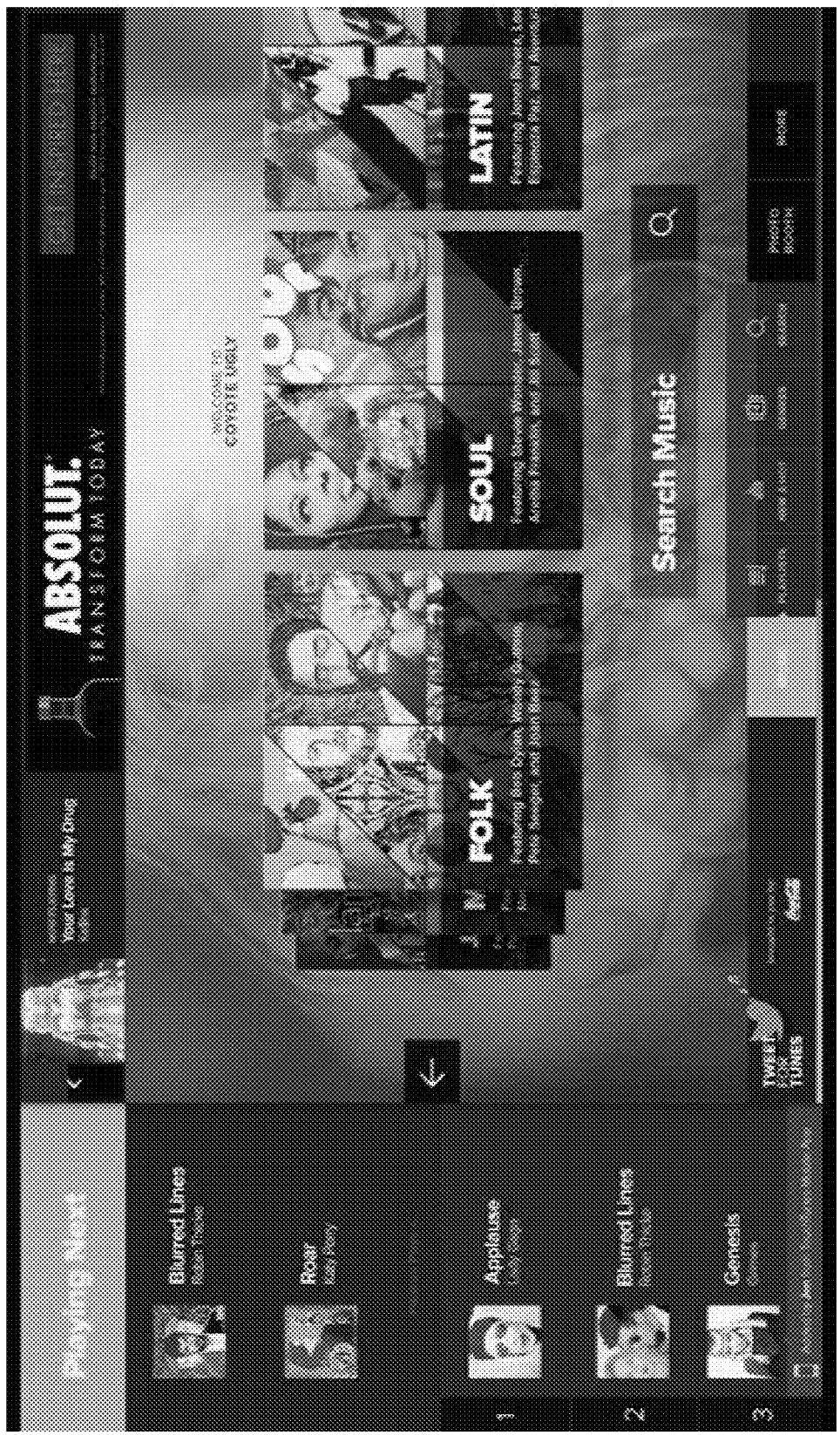
FIG. 30 updates the FIG. 29 example view to reflect previously played songs, in accordance with certain exemplary embodiments.

As shown in the FIG. 29 example, information about the next five songs is provided. The information includes song and artist name, and artwork associated with the song and/or artist. Similar to the above, an indication of the manner in which the song was selected (e.g., via mobile device) may be displayed as well, in certain exemplary embodiments. In certain exemplary embodiments, a user may scroll up or down to access songs to be played after and songs already played before these five items. In certain exemplary embodiments, if a user tries to see more than five items in the queue, it will show part of the sixth item, but then snap back to the view showing the five next items in the queue. The ability to access already played songs may be beneficial for users who are unable to identify songs but who nonetheless are able to access a jukebox to "look up" previously played songs. FIG. 30, for example, shows the previously played songs. This previously played song information may be provided for free in certain exemplary embodiments. Information for upcoming plays may be retrieved from the jukebox queue stored locally on the jukebox in certain exemplary embodiments. Information regarding previous plays may be retrieved from a listing of played songs that also is used in connection with royalty and/or accounting functions, a running copy of the queue that is cleared out at regular intervals (e.g., upon a location closing, at a set time when updates to the jukebox are provided, when royalty and/or accounting information is transmitted to a central server, etc.).

In certain exemplary embodiments, if there are not enough songs for the queue to fit the five slots, then the empty slot may be replaced by a grey box. If there are zero songs in the queue and a user clicks the show queue button, then the show queue area may still expand but a message may be provided that prompts the user to search for a song and add it to the queue. Selection of this button may then minimize the queue and allow a user to continue to browse the music experience.

Figure 31:
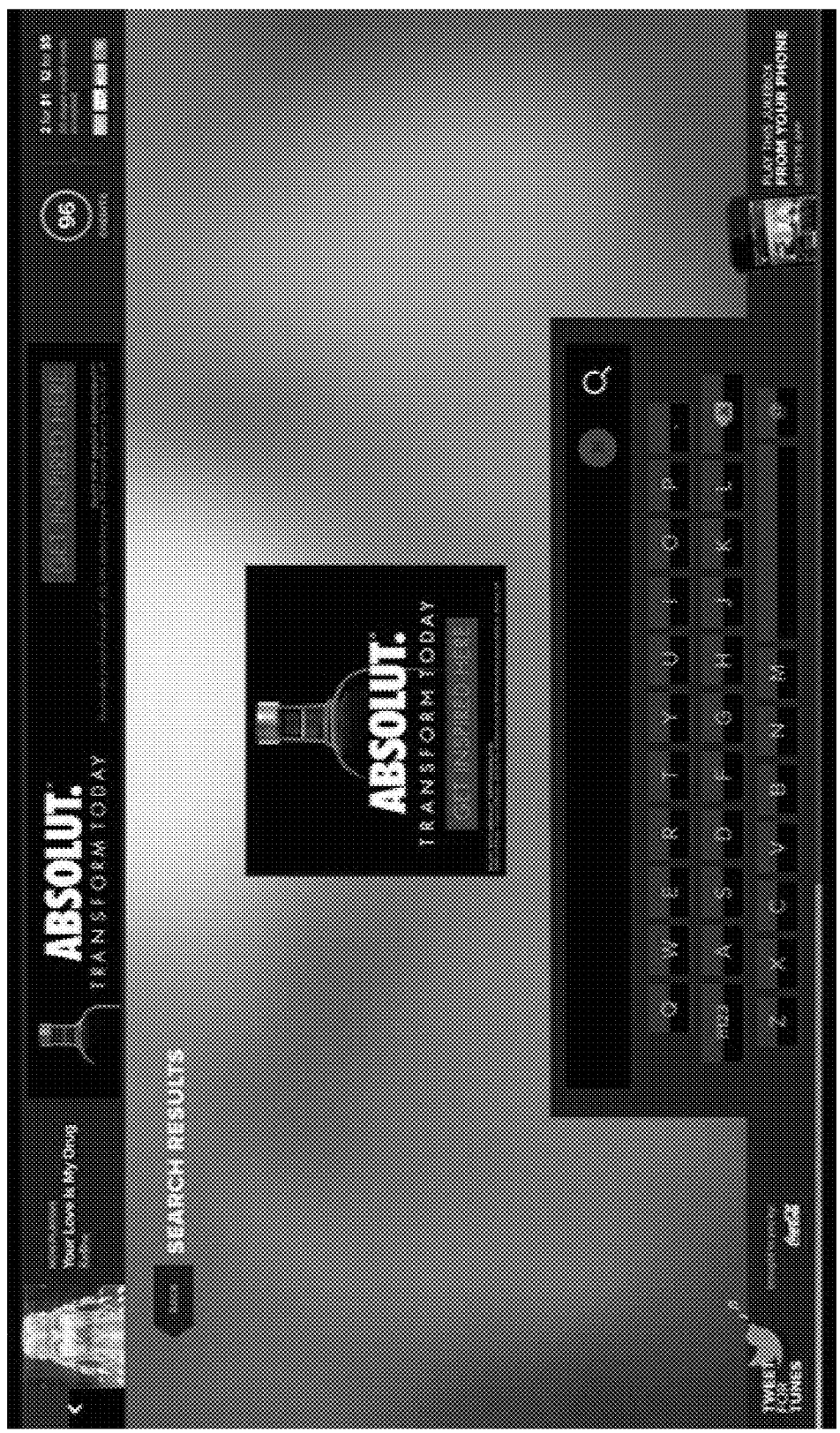
FIG. 31 is a search screen similar to that shown in and described above in connection with FIG. 4.
Figure 32:
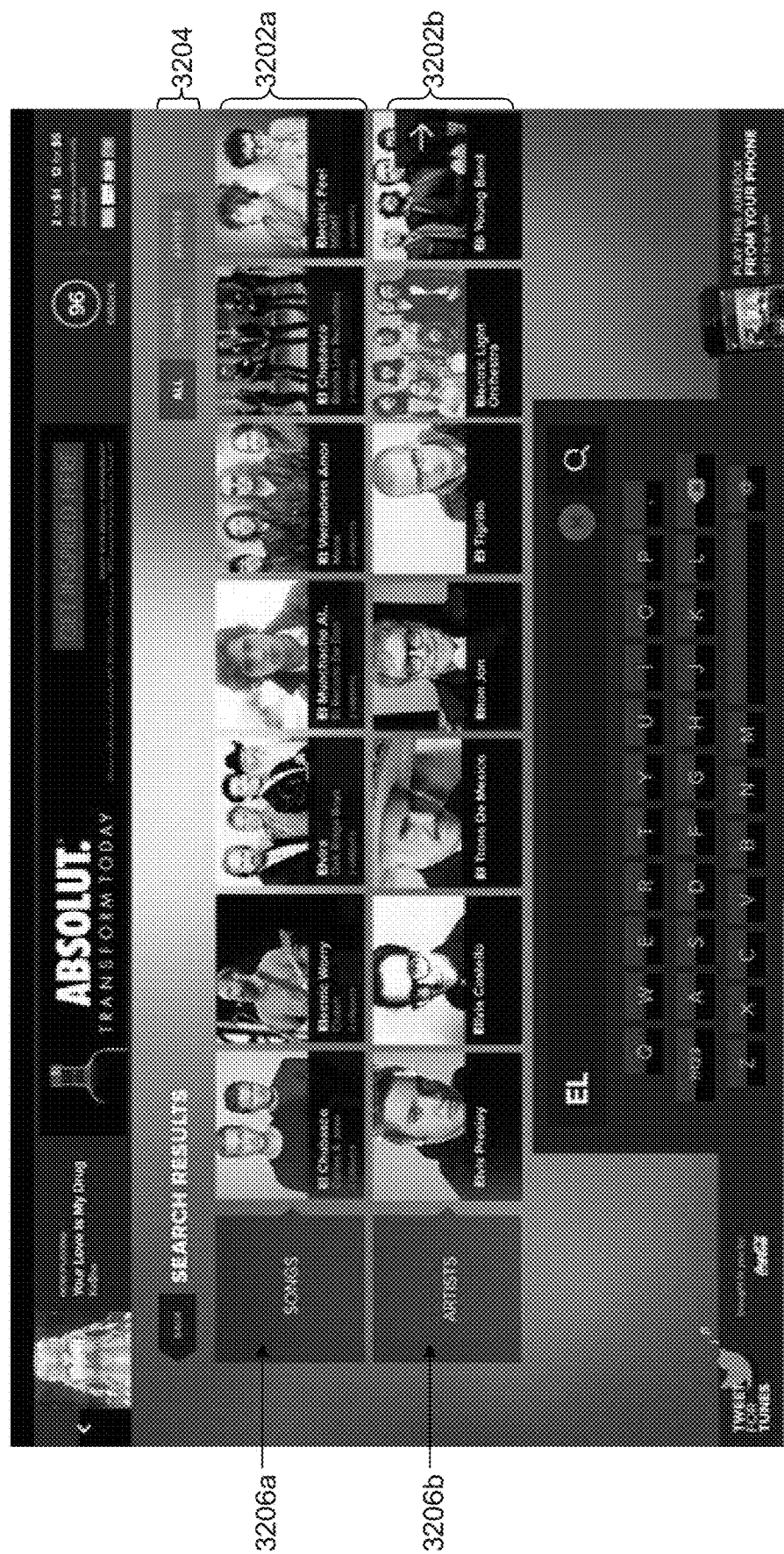
FIG. 32 is an example search results screen in accordance with an exemplary embodiment.
Figure 33:
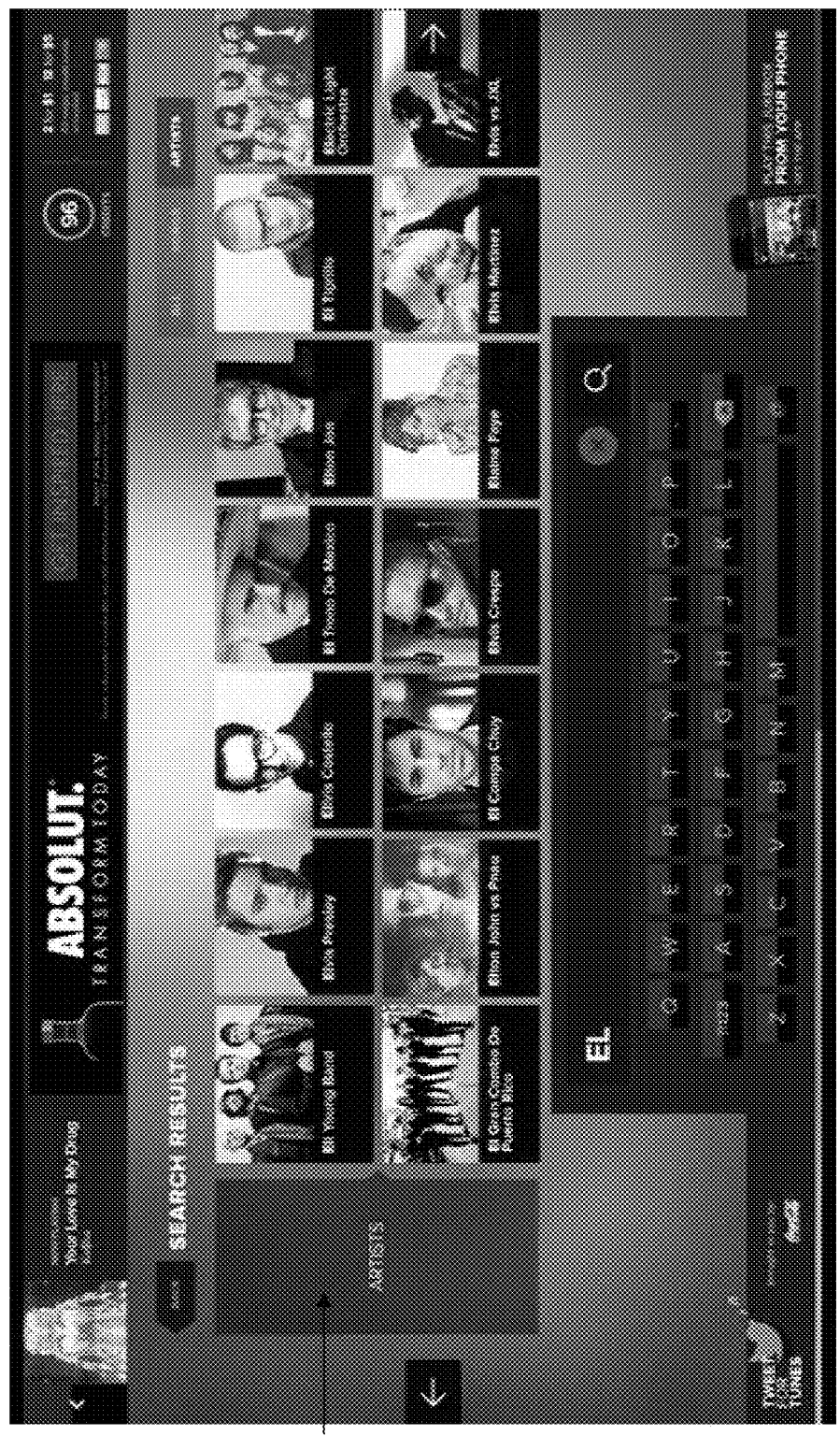
FIG. 33 shows an enlarged artists display in accordance with an exemplary embodiment, e.g., as if the artists tile were selected or the corresponding element were selected from the control elements from FIG. 32.

FIG. 31 is a search screen similar to that shown in and described above in connection with FIG. 4, and FIG. 32 is an example search results screen in accordance with an exemplary embodiment. As shown in FIG. 32, separate linear arrangements of tiles 3202a-3202b are shown for songs and artists. The control elements 3204 may be used to control whether both linear arrangements of tiles 3202a-3202b are shown for songs and artists, whether only the songs array 3202a is shown, or whether the 3202b is shown. A user may select the songs tile 3206a or the artists tile 3206b to accomplish a similar result. The search results may be scrolled left and right, either on an independent row-by-row basis or together as one element, in different exemplary embodiments. As an example of this behavior, FIG. 33 shows an enlarged artists display in accordance with an exemplary embodiment, e.g., as if the artists tile 3206b were selected or the corresponding element were selected from the control elements 3204. As will be appreciated from this display, a user the tile 3206b' is expanded to reflect that both rows of results include artists rather than songs.

As will be discerned from FIGS. 32-33, the search term is "EL" and the search results include this string. The results are not, however, listed in alphabetical order in all exemplary embodiments. Instead, the search results may be prioritized to take into account a number of different options. For instance, search results may be manipulated based on on- and/or off-site analytics and/or to reflect promotions run by a music department, a label, an individual venue, etc. A music department might understand that there is a lot of buzz associated with the Eli Young Band, that there almost always is interest in the music of Elvis Presley, and that Latin music is oftentimes played at a particular location. The search results thus are "optimized" so that the Eli Young Band and Elvis Presley tiles appear early on in the results list, while Latin artists including the text string "EL" are given priority over non-Latin artists. The remainder of the contents may be populated with "normal" alphabetical search results. In this way, it is perhaps more likely that users will more likely encounter music that they are likely to want to listen to, e.g., because the music is attracting buzz, because it oftentimes is played at a specific location, etc. It thus will be appreciated that certain exemplary embodiments may implement a smart search that helps show promoted songs first, and in which the search results vary based on the popularity of songs within the particular venue.

Figure 34:
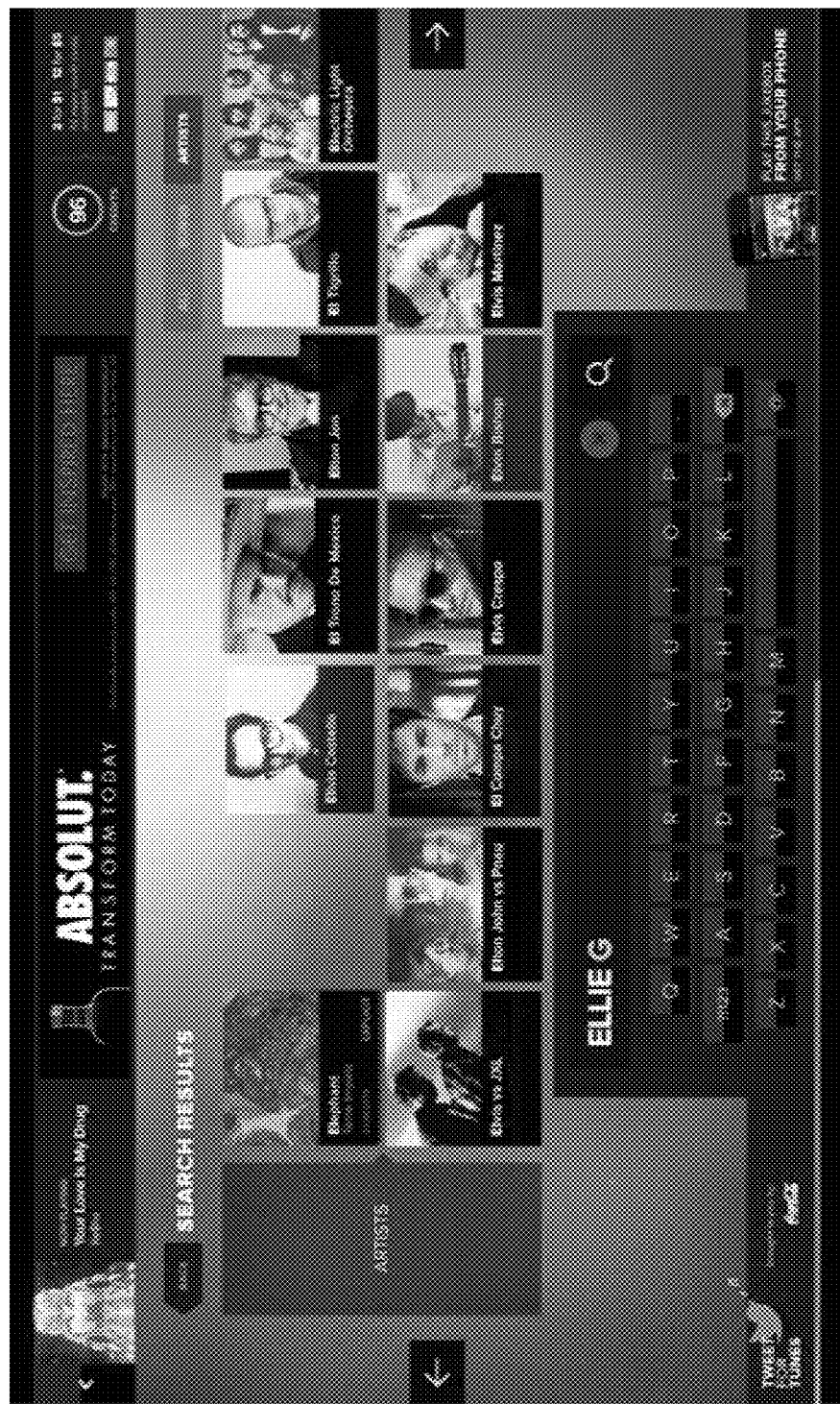
FIGS. 34-35 are example screens showing adaptive completion of search in accordance with an exemplary embodiment.
Figure 35:
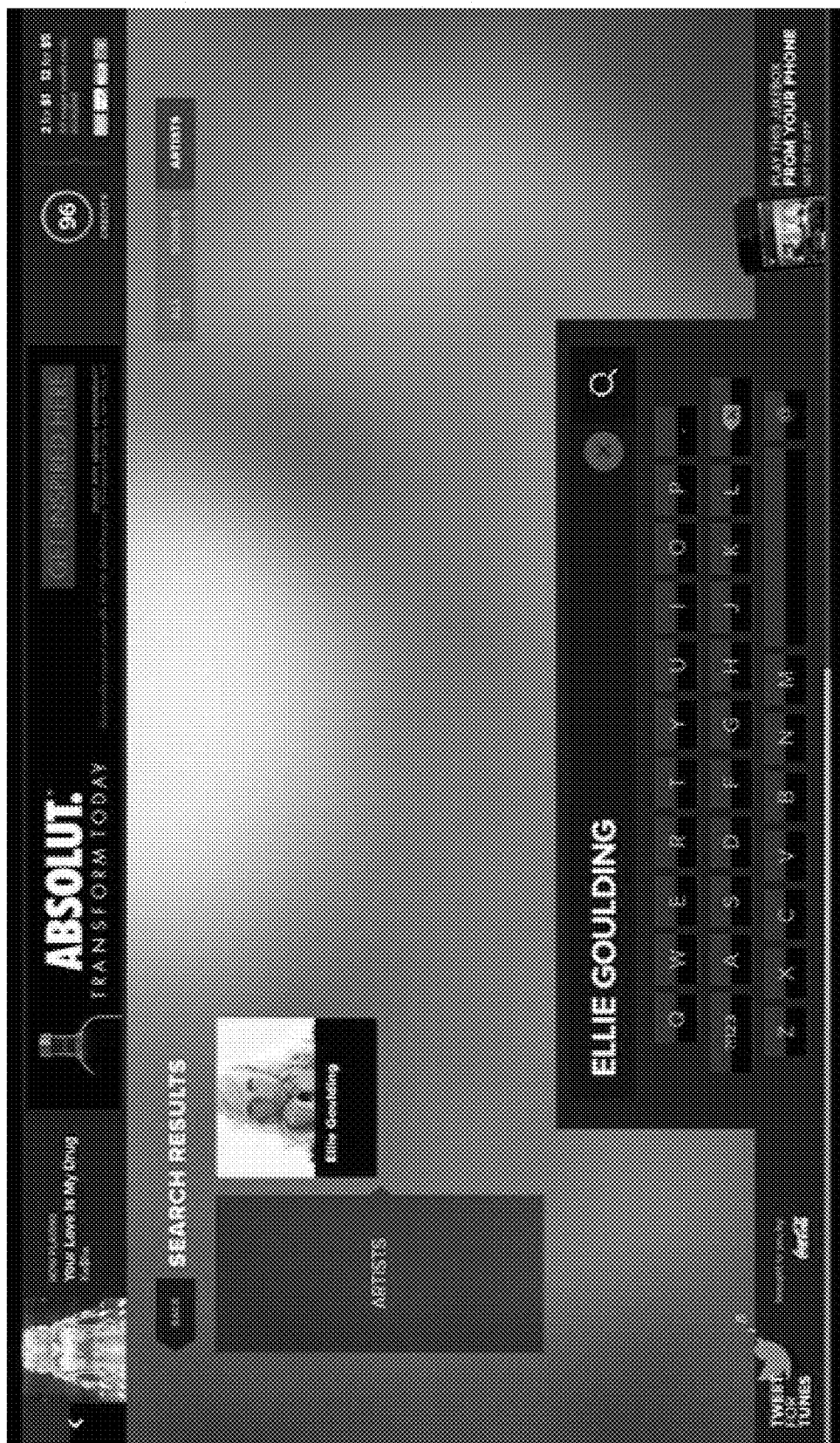

FIGS. 34-35 are example screens showing adaptive completion of search in accordance with an exemplary embodiment. As will be appreciated, as additional characters are entered, some results will fade out and others may fade in to take their place. As more and more text is entered into the search area and the results become fewer and fewer, tile replacement may fall off and tile removal may take place. The FIG. 34 example shows tile replacement and limited tile removal. In the FIG. 35 example, there is one exact match, and that is all that is shown because of the specificity of the search string coupled with the lack of "good" or high matching results.

Figure 36:
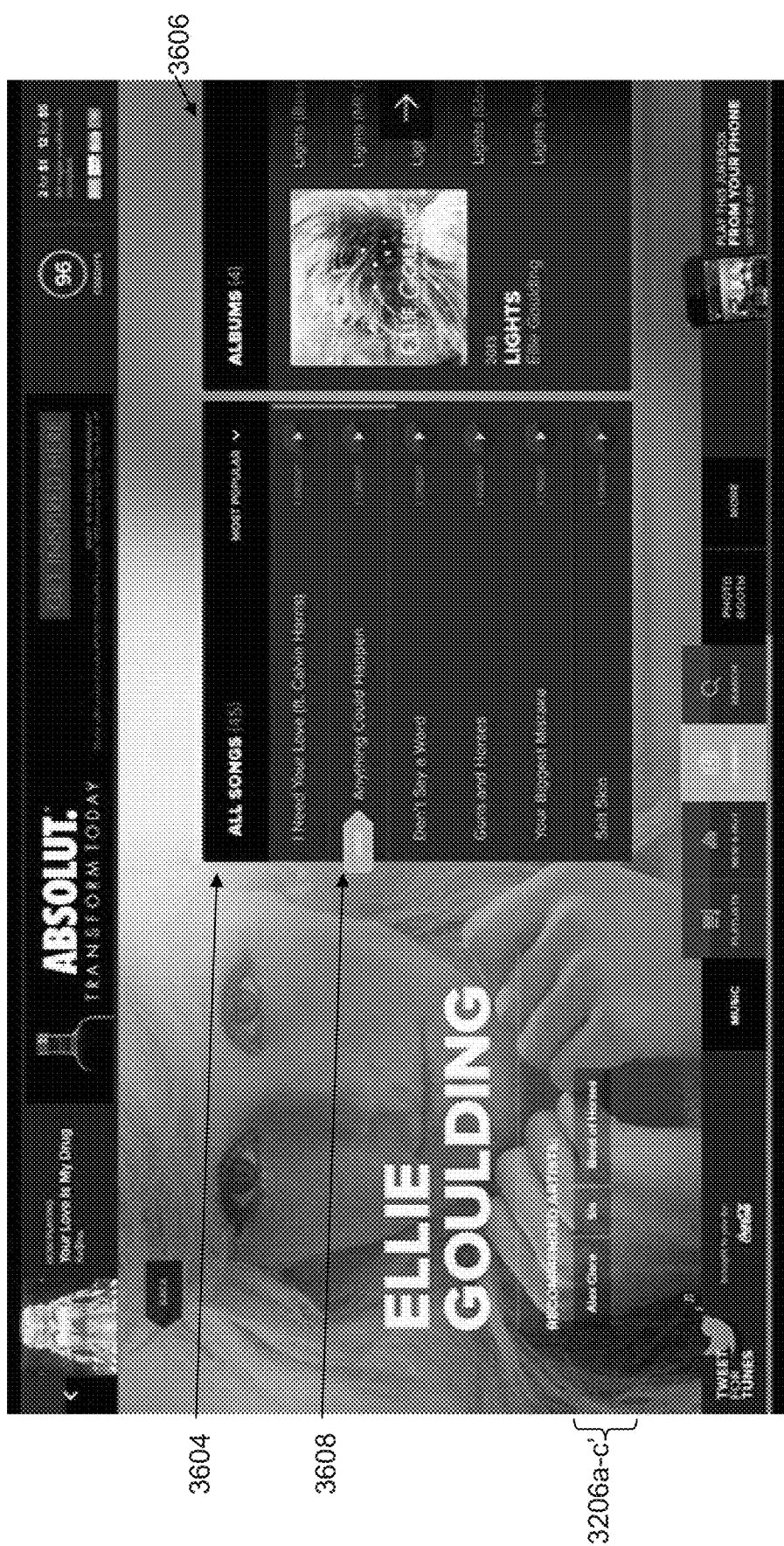
FIG. 36 is an example artist-specific page, in accordance with certain exemplary embodiments.

FIG. 36 is an example artist-specific page, in accordance with certain exemplary embodiments. The FIG. 36 screen may be reached by selecting Ellie Goulding from the artist listing in FIG. 35. When this happens, even though Ke$ha's music is still playing, Ke$ha's image as the background is replaced with an Ellie Goulding related image that may or may not be associated with album art. Other changes are made, as well, e.g., when an artist-specific page is displayed. For example, recommended related artists also are identified and may be selected using control elements 3602a-3602c. The list of recommended related artists may be determined in any suitable manner. For example, analytics gathered from jukebox usage, album and/or song sales, etc., may be used to cluster together related artists and/or albums. Musical styles (e.g., in terms of beats per minute, instrumentation, vocals, overall general "sound," artists in a specific sub-genre like "Boy Bands" or the like, etc.), proximity in release date information, news media associations (e.g., for duets or crossovers such as between Taylor Swift and Ed Sheeran, competitors for the same or similar award such as best artist or vocal group, current and/or former musical "couples" like Justin Bieber and Selena Gomez, groups who tour together like Lady Antebellum and Kacey Musgraves, "spinoff groups" like the Pistol Annies and Miranda Lambert or David Lee Roth and Van Halen, etc.), artists on the same label, and/or the like alternatively or additionally may be used to form associations and recommendations. Thus, it will be appreciated that combinations of empirical data and more subjective feelings may be used by a music department, label, or other party to make such recommendations. As will be appreciated by those skilled in the art, if a different artist is selected using one of the control elements 3602a-3602c, the screen will be updated accordingly.

The songs performed by the artist may be listed in a song list 3604, and the albums associated with the artist may be listed in an album list 3606. An indication of the number of songs is provided, as is an indication of how many credits are required for a play of a particular song. The "play" buttons in the list may be used to activate play screens. Indication such as, for example, the new tag 3608 may be used to highlight promoted or otherwise featured items. Other tags such as, for example, "featured," "hot," "sponsored," and/or the like may be used as well. Meta information may be associated with the songs and specify details such as, for example, what tag should be applied, a relevant timeframe for which the tag should be displayed, etc.

Figure 37:
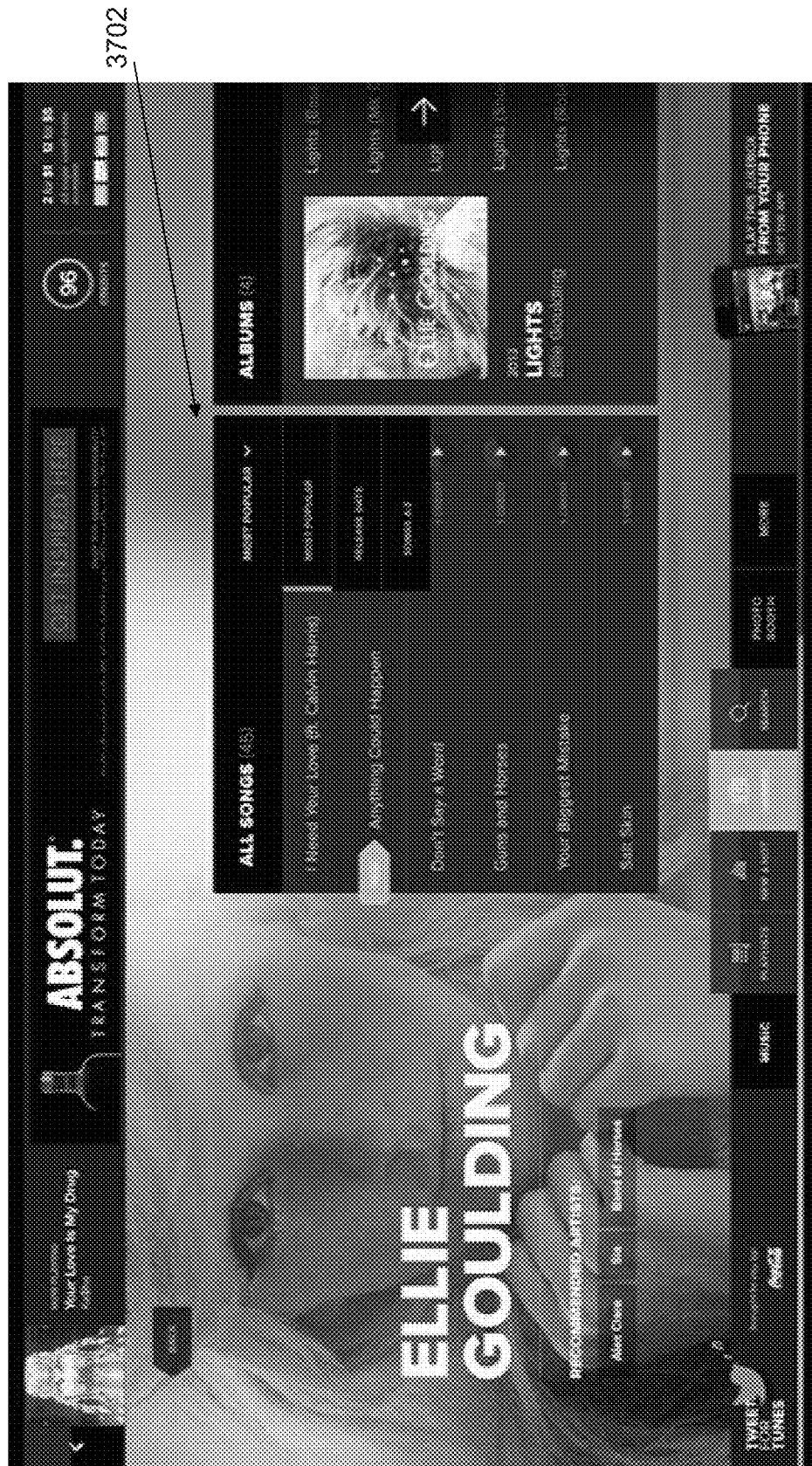
FIG. 37 shows a drop-down list from FIG. 36 being expanded.
Figure 38:
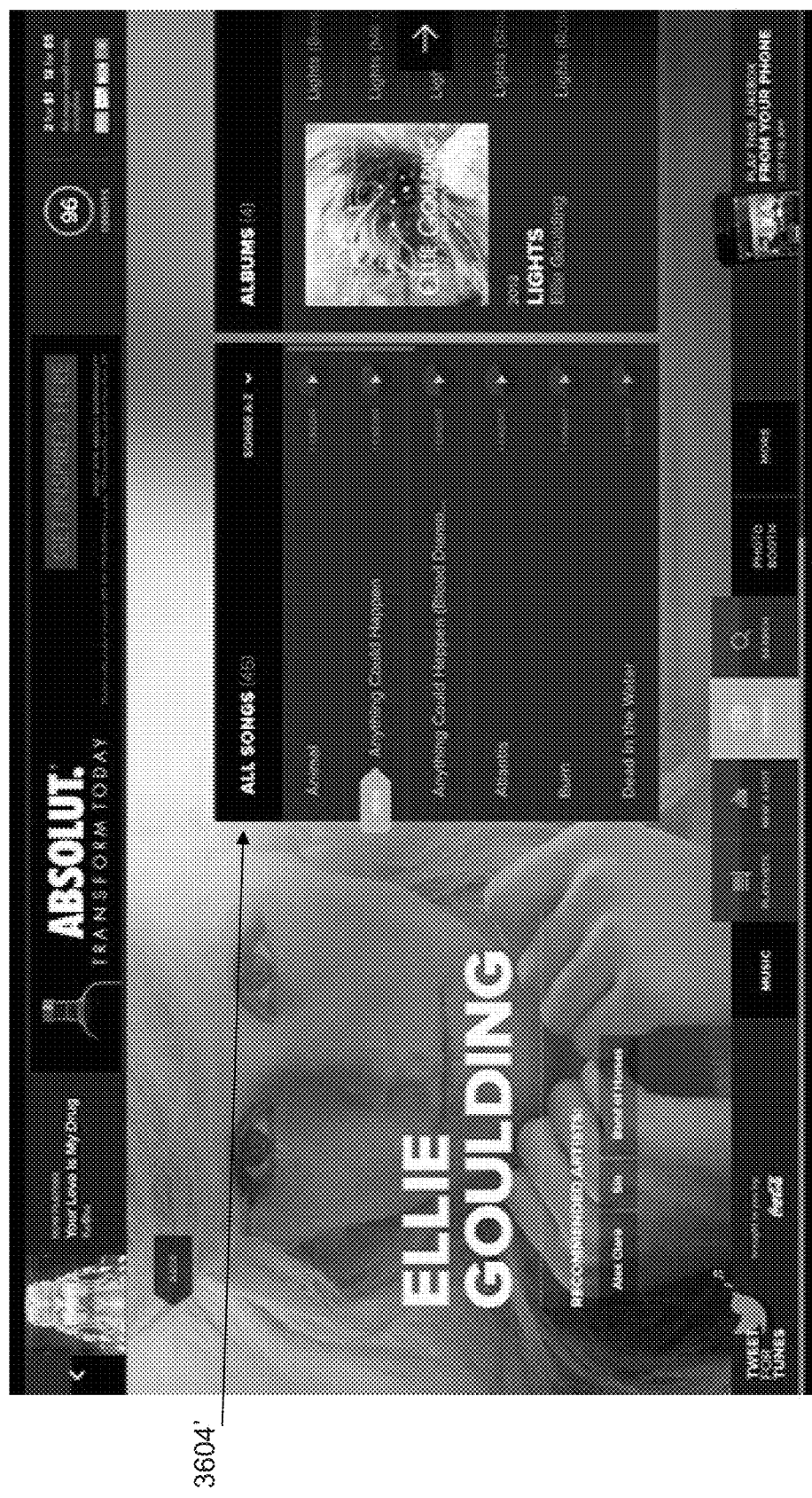
FIG. 38 includes song list reordered in connection with a selection made from the drop-down list from FIG. 37.

The songs in the song list 3604 are shown as being sorted by popularity. Popularity may be measured by an objective measure such as, for example, airplay, downloads, place on charts, sales, etc. The popularity sorting approach may be further modified, for example, such that promoted songs appear towards the top of the list, regardless of actual popularity (and regardless of how popularity is measured). This may be advantageous, for example, for a new song for which a large amount of buzz is generated but which has not made its way to the top of the charts, etc., but might perhaps do so. More subjective measures may also be helpful for artists whose careers span long periods of time and for which more objective popularity measures might not be indicative of what users might be looking for. For instance, U2's "Invisible" might currently be more popular than some of its older songs, e.g., in terms of position on the Billboard Charts, but it is not as classic as "Pride (In the Name of Love)" or "One"—and a person accessing U2's artist page could run into a situation where they still would not have found what they were looking for if a more subjective reordering were not implemented. Other ordering techniques may be used. For instance, as shown in FIG. 37, a drop down menu 3702 may be used so that songs may be ordered by release date, alphabetically, and/or the like. In this regard, FIG. 38 includes a reordered song list 3604' that is now sorted alphabetically.

Figure 39:
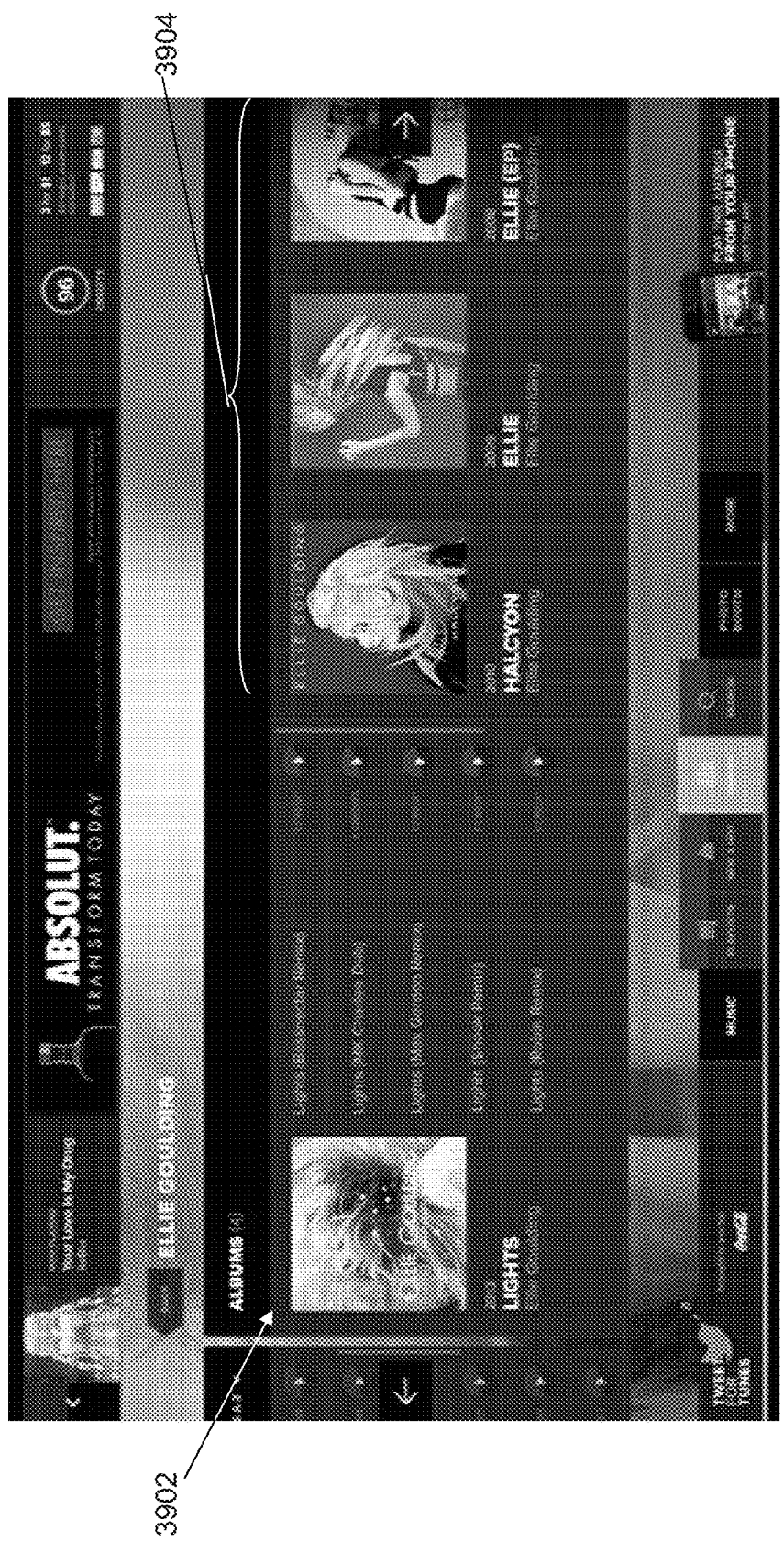
FIG. 39 is an example screen showing an expanded album view, in accordance with certain exemplary embodiments.

The user may shift the focus of the screen to the right to view further detail of the album list 3606 that is only partially shown in FIG. 36, for example. In this regard, FIG. 39 is an example screen showing an expanded album view, in accordance with certain exemplary embodiments. The expanded album view example shown in FIG. 36 indicates that there are four total Ellie Goulding albums from which selections may be made. The albums may be arranged in any order such as, for example, date of release, popularity (e.g., as measured by one of the above-described and/or other measures), in accordance with promotions, etc. In the FIG. 36 example, the "Lights" album is expanded in area 3902 so as to reveal a scrollable listing of songs on that album that are available for playback, and non-selected albums appear in a more condensed format in area 3904.

Figure 40:
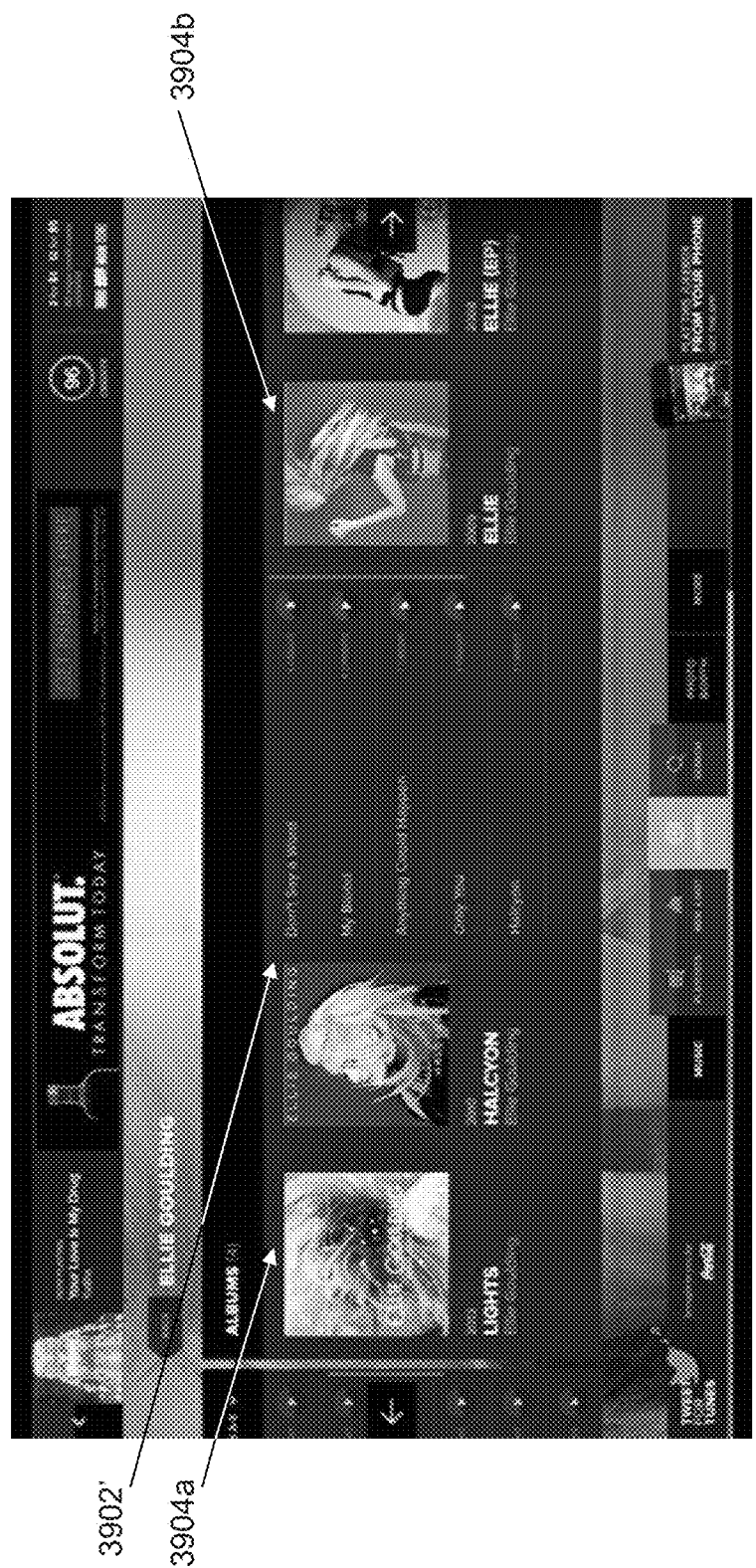
FIG. 40 shows an update to the FIG. 39 example screen, indicative of a different album being selected.

If a different album is selected, then as shown in FIG. 40, the previously expanded area 3902 is condensed into first condensed 3904a, the remaining unselected elements are shown in second condensed area 3904b, and the newly expanded area 3902' is provided for the selected example. Thus, the scrollable list of songs is shown in this newly expanded area 3902', and reordering of the albums is not performed in this exemplary embodiment. In other exemplary embodiments, reordering may be performed, e.g., so that the expanded album is always shown in the left-most area 3902 of FIG. 39, for instance.

Figure 41:
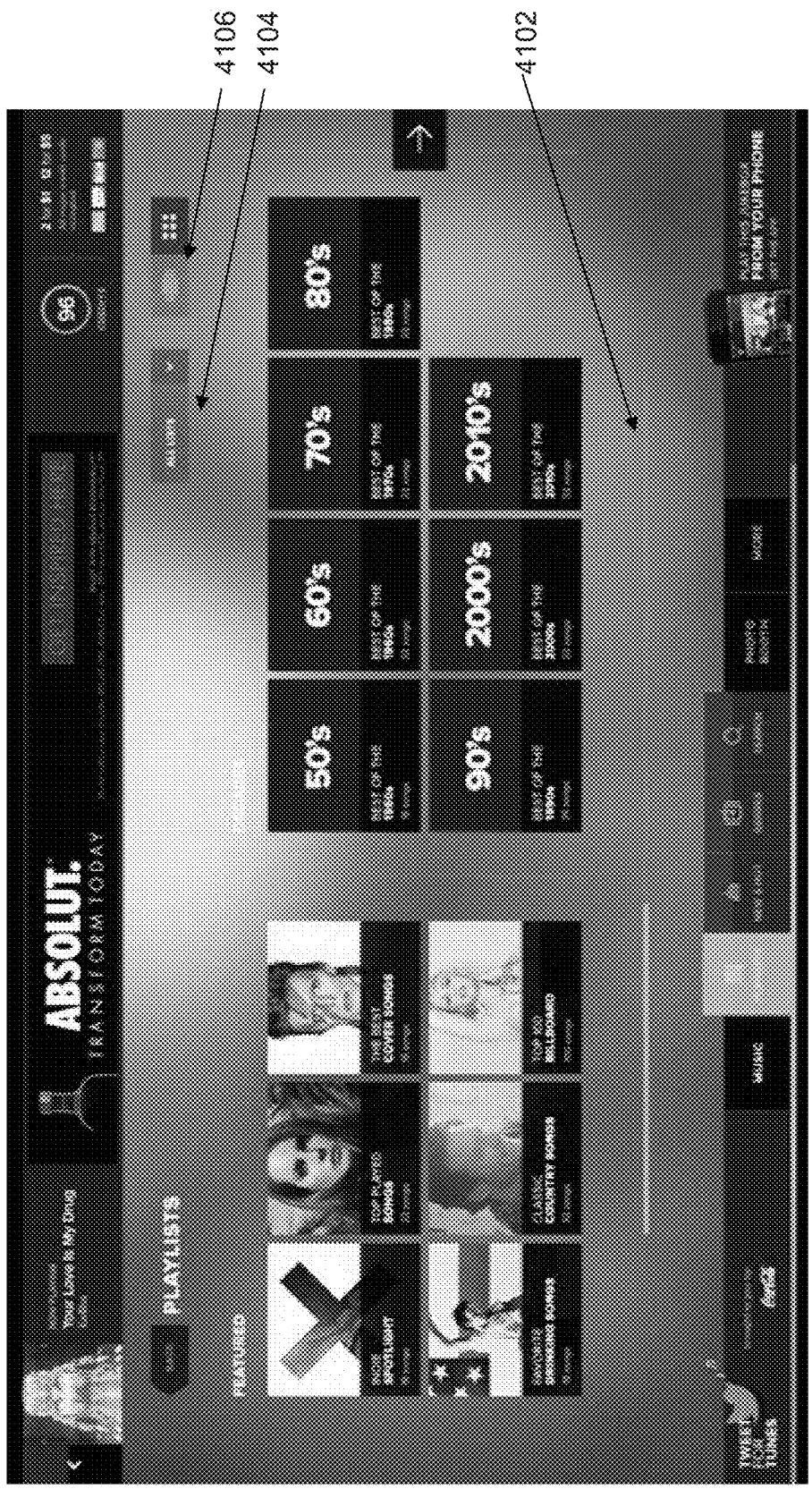
FIG. 41 is an example screen showing playlist being organized in tile views, in accordance with certain exemplary embodiments.

FIG. 41 is an example screen showing playlist being organized in tile views, in accordance with certain exemplary embodiments. In certain exemplary embodiments, the playlists screen may include all playlists that are not in "new & hot" or "genres" sections. Playlists may include collections of artists, songs, and/or albums and may have an associated tag (e.g., to indicate a new, hot, sponsored, featured, or other label). The playlists in this example are separated as featured playlists, playlists including songs in different decades, playlists including songs in different genres, and/or the like. User developed playlists may also be shown therein, e.g., if such playlists are designated as public playlists, meet the requirements of an optional screening process, receive a certain number of positive votes, and/or the like. The artwork associated with a playlist may be controlled by the music department and need not necessarily be associated with the songs included in that playlist. The Billboard Top 100 playlist in the FIG. 40 example includes a picture of Miley Cyrus, but this picture is not associated with album art and is different from the image shown when this playlist is selected (e.g., as will be appreciated form FIG. 41 below).

As explained in detail above, the playlists may be custom-curated sets of songs developed outside of the venue in which the jukebox is located. The Billboard Top 100 playlist comes from an easily recognizable source. On the other hand, the "Class Country Songs" playlist may be developed by the music department. Playlist generation in this regard may be based on a number of factors such as, for example, popularity at the specific jukebox, popularity across all jukeboxes in the network, hand-picked songs promoted by a label, and/or the like. For instance, classic Johnny Cash songs like "Ring of Fire" and "Folsom Prison Blues" likely would be present in this list based on network popularity, as would Patsy Cline's "Crazy." A venue in Tennessee might indicate the popularity of certain Tennessee-related classic country songs like the Osborne Brothers' rendition of "Rocky Top," Alabama's "Dixieland Delight" and "Tennessee River," and/or the like. In addition, John Denver songs like "Country Roads" and "Rocky Mountain High" might be included to help promote Special Consensus' bluegrass tribute album.

In certain exemplary embodiments, the songs selected for inclusion in a playlist may be selected in a defined percentage as between different categories of songs. For instance, A % of the songs in a playlist may be based on network-wide jukebox popularity, B % of the songs in that playlist may be based on jukebox-specific popularity, and C % of the songs in that playlist may be "pushed" by a label or other promoter. The A % of songs could be those songs that are trending and a user will recognize as such, the B % of songs may help to maintain the overall feel of the venue and help preserve its unique identity, and the C % of songs may relate to songs that are likely to be heard on the radio or encountered in other "media channels" or where promos are likely to be run, etc. In certain exemplary embodiments, self-populating playlists may be distributed to jukeboxes based on rules defining percentages and with input from a central server regarding at least the A % and C % songs for inclusion therein. The B % songs may be selected locally, or with localized analytics provided by the central server or the like. Thus, it will be appreciated that certain exemplary embodiments combine centrally programmed promoted songs, genre-based songs that are popular across the jukebox distribution network, and locally popular songs that match the playlist's attributes (such as, for example, genre, similar artist, similar timeframe, etc.).

It thus will be appreciated that the tile-based grid shown in the FIG. 41 example screen and the carousel display of the FIG. 26 example screen, for instance, may in essence correspond to a presentation system that allows external parties (e.g., operators, bartenders, patrons, music departments, labels, registered users, featured DJs, etc.) to create playlists and populate them. The functionality of certain exemplary embodiments may be facilitated by implementing a cloud-based music merchandizing system, wherein an operator and/or venue proprietor can select a profile for the jukebox and receive updates to playlists based upon that profile. Local and/or coarser data analytics, together with optional subjective feedback from authorized users, may be used to distribute tiles of collections of media and customize the content therein. Referring once again to the drawings, and FIG. 41 in particular, additional user interface elements are provided on this screen that might be provided on other screens as well. For instance, a horizontal scroll bar 4102 is shown so that the user knows the current relative position in the displayed list. A drop-down list 4104 may be used to sort or otherwise filter the elements (in this case, the playlists and, for example, to show only genres, new and hot lists, decades of music, etc.). Tiles may have meta-tags associated with them, e.g., to facilitate sorting and/or grouping actions appropriate for here and elsewhere. Control element 4106 may be used to switch between grid and carousel views.

In certain exemplary embodiments, a horizontal scroll bar may be displayed on every page except for the main "home page," e.g., shown in FIG. 26. In a carousel view, the items may loop, and similar looping may occur in a grid view. Thus, the scroll bar may jump from far left to far right, or vice versa, depending on whether there is a looping action.

Figure 42:
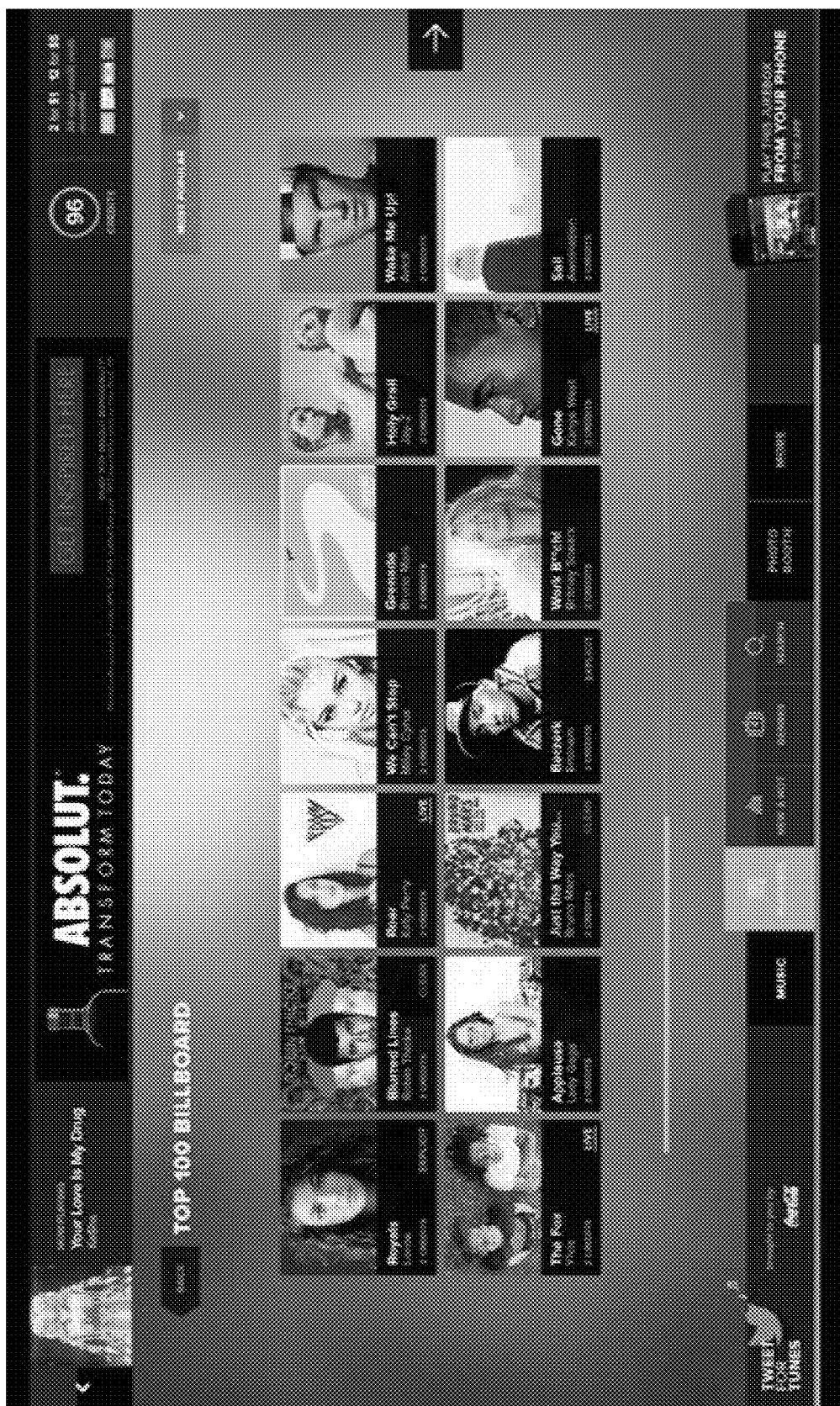
FIG. 42 is an example screen that may be displayed once a playlist is selected from FIG. 41.

FIG. 42 is an example screen that may be displayed once a playlist is selected. More particularly, the FIG. 42 example screen reflects the selection of the Billboard Top 100 playlist. As can be seen, the art for Miley Cyrus is inconsistent between FIG. 41 and FIG. 42.

Figure 43:
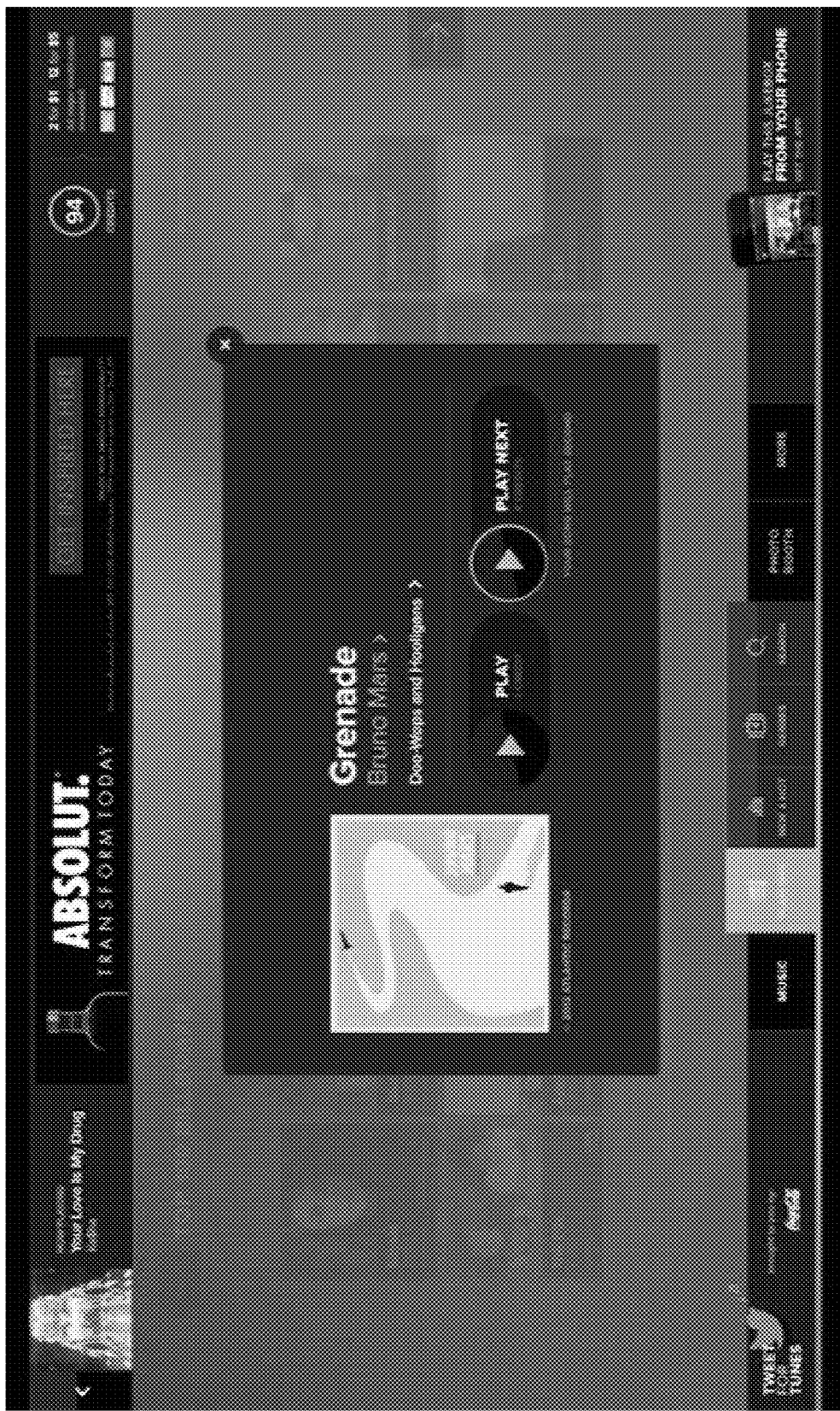
FIG. 43 is an example play screen similar to that shown in FIG. 22.
Figure 44:
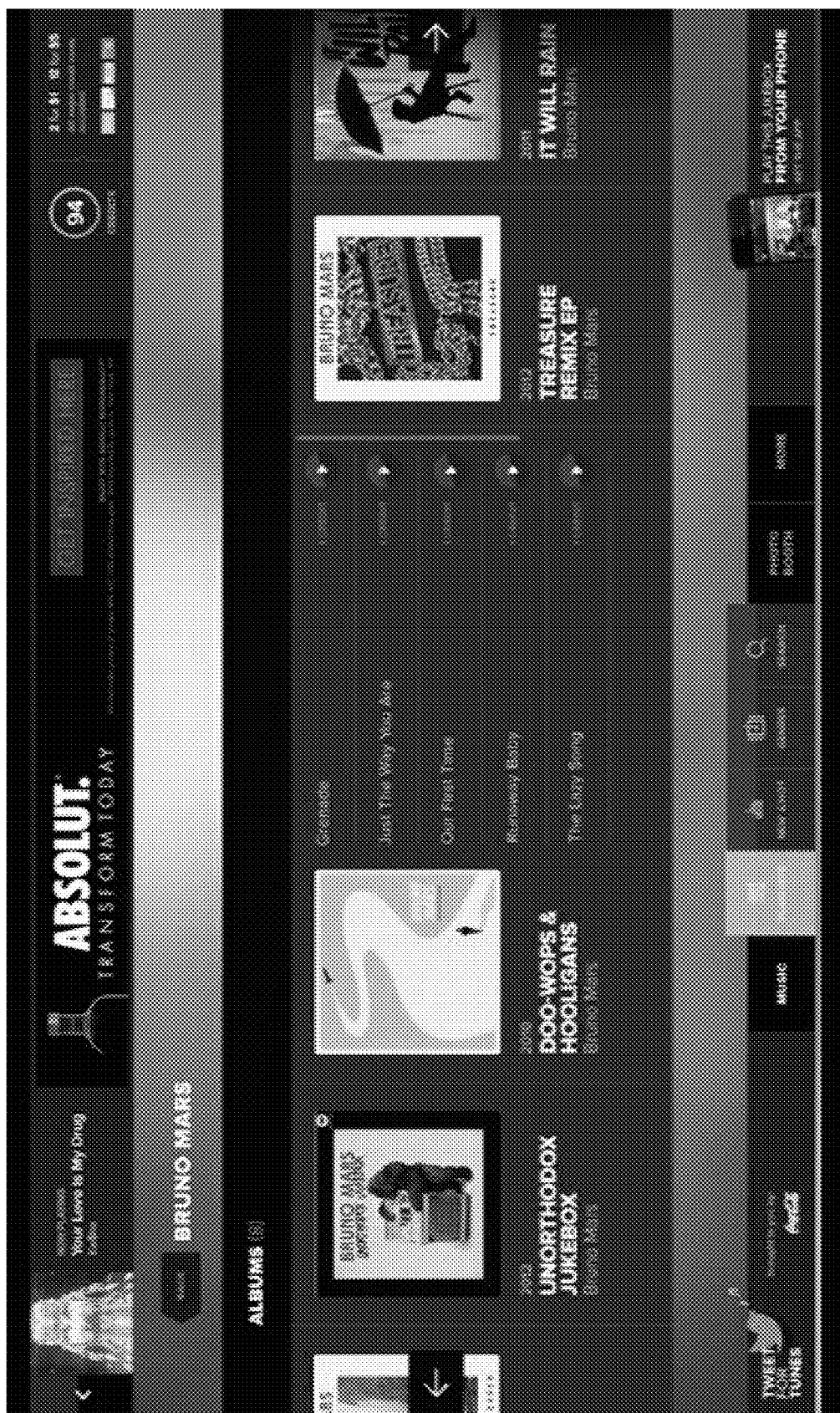
FIG. 44 is an example screen showing an expanded album view similar to FIG. 39.

FIG. 43 is an example screen similar to that shown in FIG. 22, but is for Bruno Mars and includes album art for his Doo-Wops and Hooligans album. If that album is selected, then the FIG. 44 example screen may be displayed. It will be appreciated that this example screen is similar to that described above in connection with FIG. 39.

Figure 45:
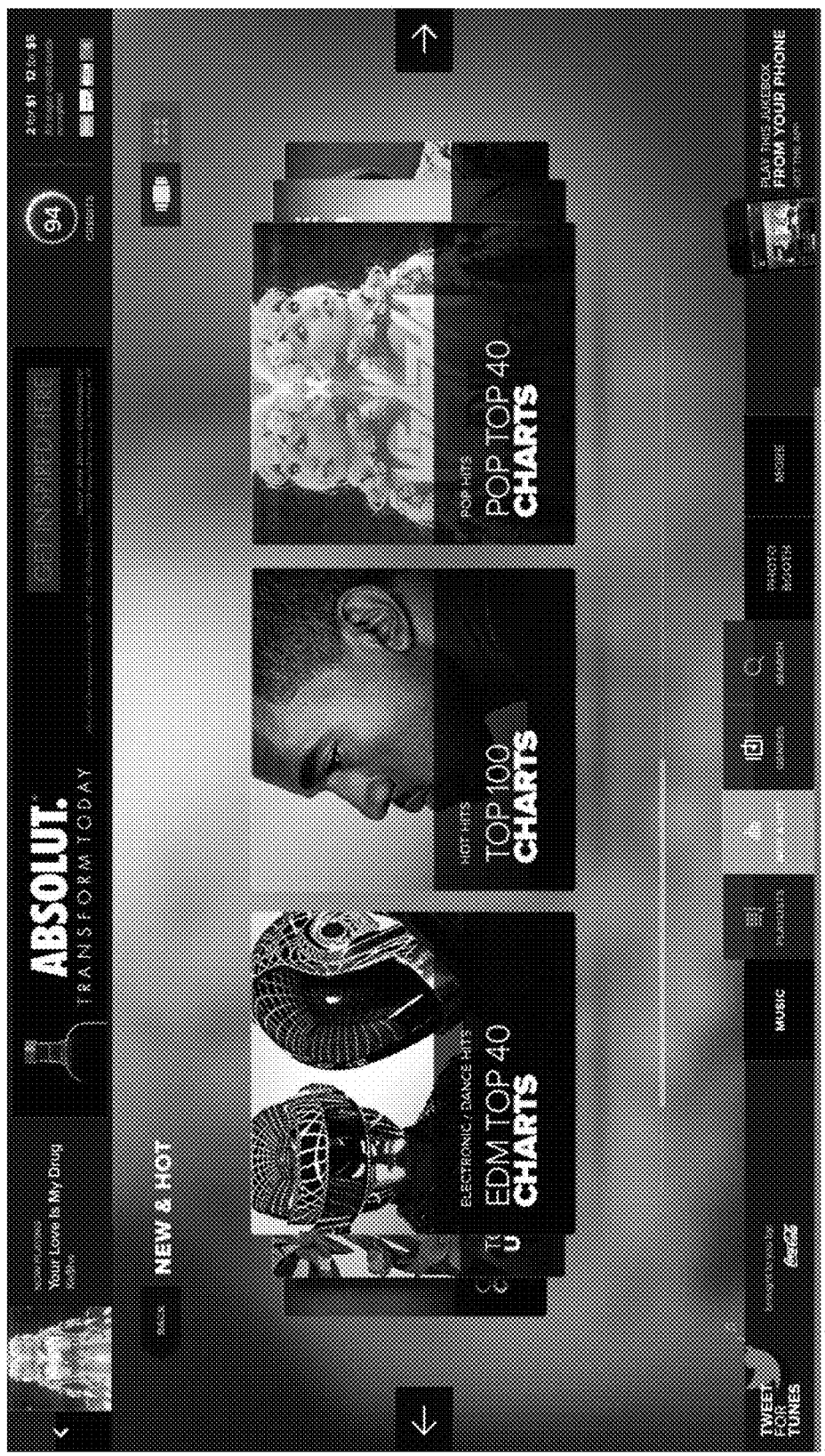
FIG. 45 is an example "new and hot" screen, in accordance with certain exemplary embodiments.

FIG. 45 is an example "new and hot" screen, in accordance with certain exemplary embodiments. The new and hot screen of certain exemplary embodiments may be thought of as being another set of playlists. However, it may be thought of as a "super meta category" that pulls tagged playlists appropriate for new and hot musical collections (e.g., as would be appropriate for groupings of songs based on industry-recognized charts, local jukebox usage, song plays across the network, etc.).

Figure 46:
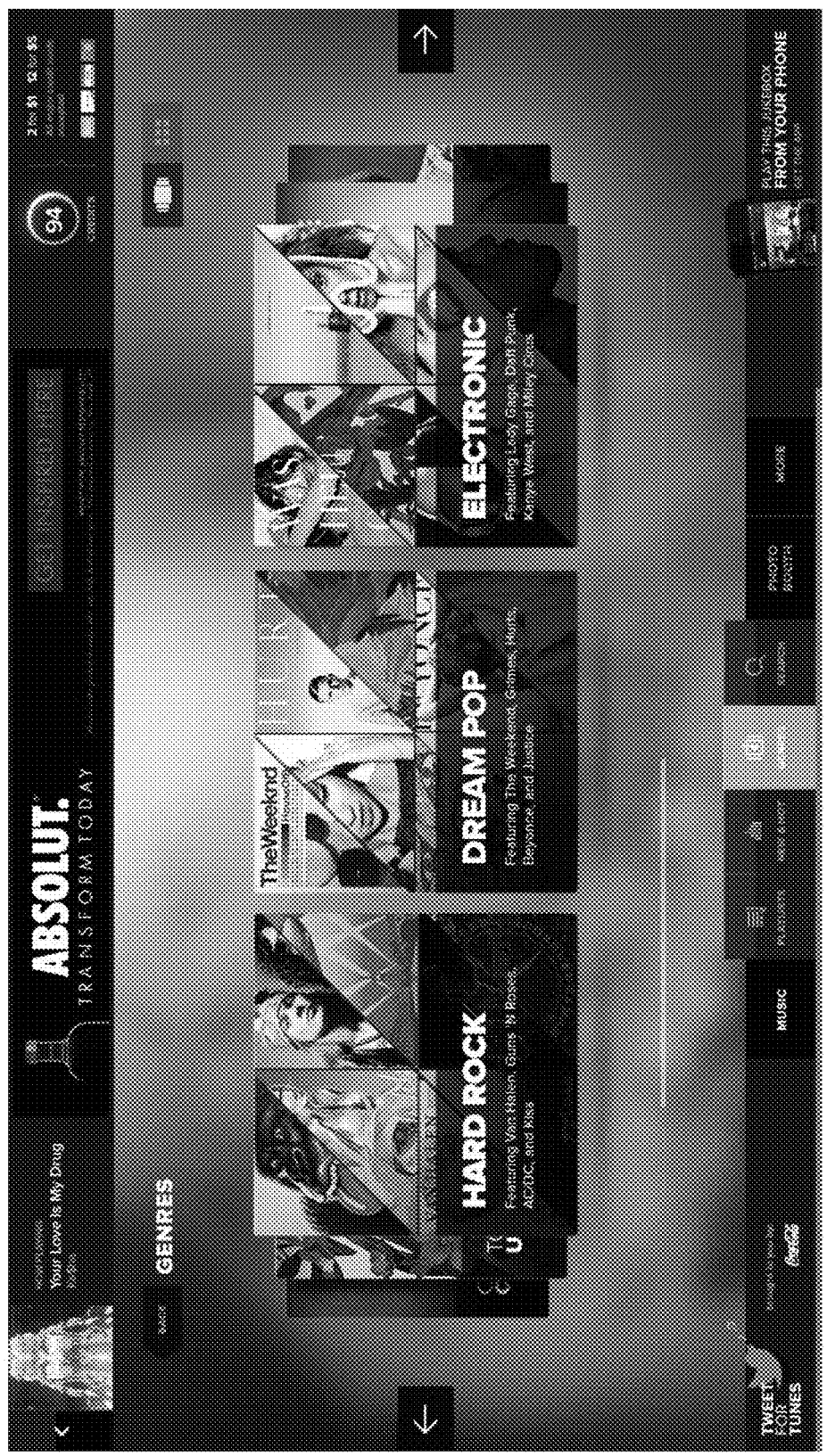
FIGS. 46-47 are example genre views in accordance with certain exemplary embodiments.
Figure 47:
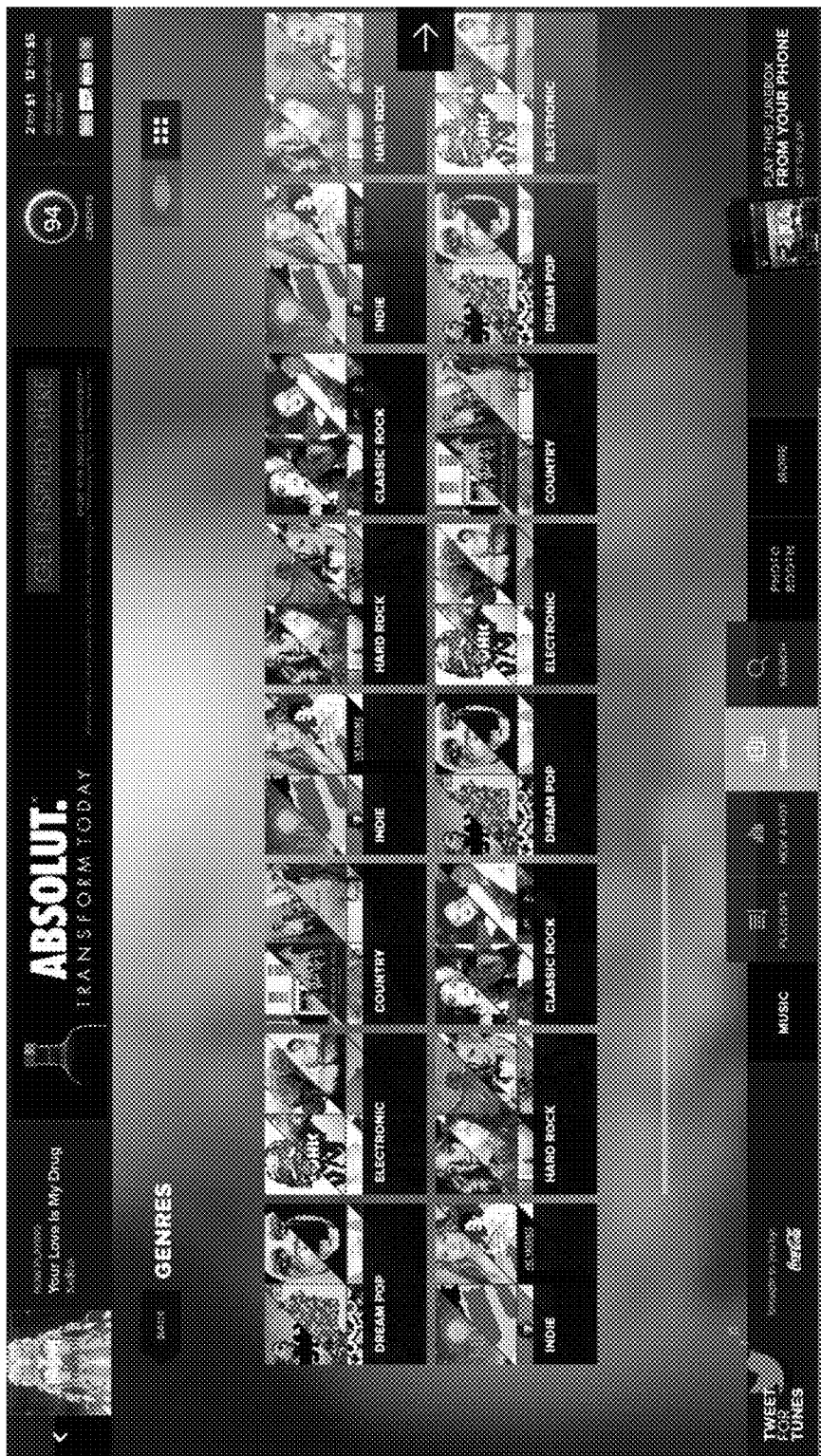

FIGS. 46-47 are example genre views in accordance with certain exemplary embodiments. Similar to the playlists screen and the new and hot screen, playlists for genres are displayed and selectable through the carousel and/or grid views. One difference in this particular example, however, relates to the lines of text that are displayed in the individual tiles. In this regard, the first line of text may name the genre that the songs are included therein, whereas the second line of text may pick the most popular artists, albums, and/or the like (e.g., up to 4a predefined number such as, for example, four, and depending on how long the names are) and display text such as, for example, "Featuring ARTIST 1 Name, ARTIST 2 Name, etc.", and/or the like. Alternatively, or in addition, tagged songs that are related to a promotion, featured by the music department, etc., may be identified in the second line of text. Tags may be used to indicate new, sponsored, featured, hot, and/or other items here as well. Genres may or may not be split into sub-genres and, thus, filter options may or may not be displayed in certain exemplary embodiments. FIG. 46 is an example carousel view, and FIG. 47 is an example grid view. In the grid view, the second line of text that displays featured content within the genre playlist is not displayed, e.g., to save space.

As indicated above, certain exemplary embodiments may implement photo booth features. Conventional photo booths have the advantage of an enclosed space and a seat for the subject. The presence of the enclosure and the known location of the subject(s) enables conventional photo booth image capture algorithms to make certain assumptions useful in image capture and processing. For instance, the enclosed booth with the internal flash allows for the exposure to be very predictable. Internal light will dominate the color space and allow for simple white balance correction. In addition, the seat for the subject, combined with the physical constraints of the photo booth, helps restrict the distance from the focal plane to a very small range and easily positions the subject's face. These known quantities help solve problems in portraiture. Conventional digital cameras and cell phones use a different technique to determine exposure, white balance, spot focus point, and/or the like. For instance, a viewfinder is presented to the photographer with a suggested focus point and a proposed use of flash, if necessary or desired. It oftentimes is up to the photographer to accept the focal point, or to reposition the focus point on another face within the composition. Once satisfied with the settings, the photographer presses the shutter button, touches the capture button within the cell phone application, etc., and the picture is taken with the now-known properties.

Taking photographs in open space in a machine-driven manner is complex and a number of problems are presented. First, ambient light normally dominates and delivers an environment with unpredictable color temperature. Second, people may position themselves in groups far from the camera focal plane or as individuals very close to the focal plane. These two unpredictable elements make taking a picture with appropriate exposure, color temperature, and focus very difficult, especially as compared to conventional photo booths and digital cameras and cell phones.

Certain exemplary embodiments help solve these problems and enable high quality pictures to be taken. In certain exemplary embodiments, a user touches the screen to start picture-taking operations, and an algorithm guides the performance of subsequent operations.

In a first step, a determination is made as to whether the subject is front-lit or backlit. By comparing the relative luminosity of what is in the background and the luminosity of objects in the foreground, for example, is possible to determine whether more light is being reflected from the subjects or from background objects. This determination may be used in governing parameters such as, for example, the amount of gain used in the viewfinder reflecting the subject images, the luminosity of any flash to be applied, and the post-processing luminosity and white balance adjustments.

In a second step, program logic helps locate the faces of likely subjects and spot meter the faces.

In a third step, depending on the luminosity of the metered face, the previously determined lighting state (front-lit or backlit) is used in calculating an optimized combination of flash and gain.

In a fourth step, the flash intensity is raised to confirm face positions, focus is locked for a predetermined amount of time (e.g., for 5 to 10 frames or approximately 10 ms), and the image is capture.

In a fifth step, based on the ambient lighting state and the resulting luminosity of the captured image, a final white balance curve is applied to color correct the captured image.

In addition to the software process applied to take an automated picture in an uncontrolled environment, certain exemplary embodiments use additional techniques to create a flash powerful enough to light a much larger space while still using a very small LED light, without causing that LED light to overheat. LEDs typically are only 17% efficient and as such generally require appropriate surrounding materials to provide the light to the field of view and with a dispersion suitable for lighting the likely subject area substantially evenly and without bleeding into areas outside of the composition. Lenses, while able to focus the image, are sometimes difficult to manufacture and, depending on the lens, can reduce light throughput. Thus, certain exemplary embodiments use an improved lens-less LED light as a flash.

Some conventional LEDs use an external phosphorous coating that creates a yellowish image that presents undesirable aesthetics in the captured images. Thus, in attempting to create a lens-less LED light, a disadvantageous cosmetic look may appear, particularly where it otherwise might be desirable to position the LED light behind a clear lens while providing a sleek black finish. It thus would be desirable to conceal the LED light without losing luminosity but while still providing a more natural and/or less yellowish color, even in daylight.

Certain exemplary embodiments address this issue through a combination of enclosing the LED light in an angular baffle that provides sufficient reflectivity inside and allows for controlled light dispersion. This baffle may be located behind a transparent mirrored film that, when the LED is off, reflects the light on the exterior of the device but when the LED light is illuminated provides an efficient flash. The baffle may be constructed with a mechanical heat sink sufficient to keep the LED cool through both brief 100% flash cycles and extended 40% lighting cycles (which may be used, for example, in longer video capture sequences). In certain exemplary embodiments, a mirrored baffle may be used in combination with a heat sink and a protective clear coating within the jukebox, e.g., in a lens-less LED flash environment.

Certain exemplary embodiments may use a modified version of the Leopard LI-720USBAF-TT camera, which is controlled via the USB Video device Class (UVC) interface through a limited set of controls, which set camera mode and operating parameters. The following table lists example camera parameters for front-lit and backlit use cases that were found to be most advantageous in high- and low-light scenarios. More particularly, optimizations were performed assuming full and low power flash settings for front-lit dark indoor stills/high-quality video and low-quality video, as well as full and low power flash settings for backlit "daylight" stills/high-quality video and low-quality video. Aside from the headers, the bolded values indicate parameters that change between modes.

| Parameter | Front-lit Values | Backlit Values |
| --- | --- | --- |
| Mode | MJPG | MJPG |
| Resolution | 1280x720 | 1280x720 |
| Frame Rate | 30 fps | 30 fps |
| Brightness | 0 | 0 |
| Contrast | 123 | 123 |
| Saturation | 110 | 110 |
| Hue | 0 | 0 |
| White Balance Temperature, Auto | 1 (enabled) | 1 (enabled) |
| Gamma | 6 | 10 |
| Gain | 70 | 110 |
| Power Line Frequency | 50 Hz/60 Hz (as appropriate for country) | 50 Hz/60 Hz (as appropriate for country) |
| Sharpness | 120 | 80 |
| Backlit Compensation | 0 | 2 |
| Exposure, Auto | Aperture Priority | Aperture Priority |
| Focus, Auto | 1 (enabled) | 1 (enabled) |
| Focus (absolute) | Not set | Not set |

With respect to the choice of gain, exposure, and backlit compensation, it was found that front-lit subjects typically will have overexposed faces whereas backlit subjects typically will have underexposed faces. However, tuning can be adjusted to bring the faces (especially) into correct exposure, and this can be achieved by reducing gain for front-lit scenes, and increasing gain and also using backlit compensation for backlit scenes.

Sharpness was determined subjectively, by considering the accuracy of detail and texture in the images at varying sharpness settings.

The following formulae may be used in determining whether the scene should be front-lit or backlit:

$$frontlit = \frac{\text{brightness of face } ROI}{\text{frame brightness}} > thresh$$

$$backlit = \frac{\text{brightness of face } ROI}{\text{frame brightness}} \leq thresh$$

This determination may be made while the algorithm is detecting faces. In this vein, the algorithm may take all of the detected face regions and choose the primary face region as the face closest to the image center. For this identified primary face, the brightness is computed as the sum of all pixels in this Region of Interest (ROI). The figure is normalized by the brightness of the whole frame.

As alluded to above, two intensities are used for the flash, namely, full power and low power. Full power is used for still capture and high-quality video scenes, and is the same in front-lit and backlit modes. Low power is used for continuous (low-quality) video, again the same in front-lit or backlit modes. In this case, full power mode sets a flash current of 250 mA, and low power mode sets a flash current of 100 mA. These settings were selected to balance image quality against thermal management and user comfort.

It will of course be appreciated that other LED lights/light packages may be used, and that optimizations may be performed accordingly.

Figure 48:
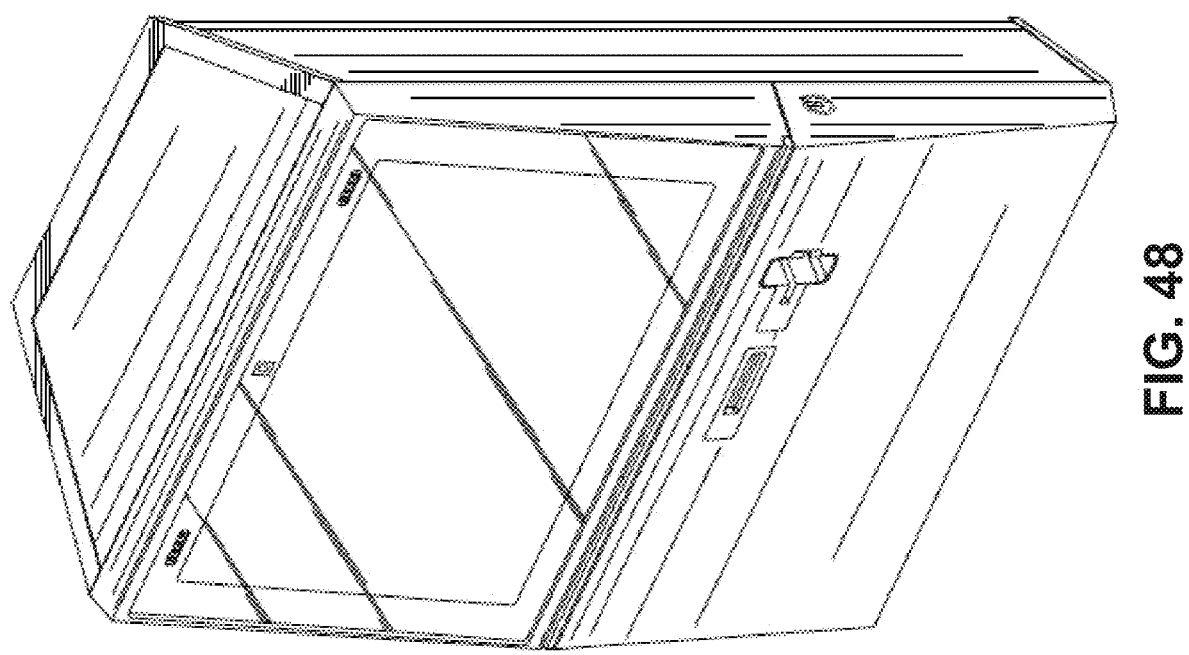
FIG. 48 is a front perspective view of an example jukebox on which the user interfaces described herein may be provided, according to certain exemplary embodiments.

The user interfaces described herein may be used in connection with any suitable jukebox device, an example design of one of which is disclosed in U.S. application Ser. No. 29/477,654, filed Dec. 24, 2013, which is incorporated by reference herein. FIG. 48 is an example front perspective view of this example jukebox. The FIG. 48 example jukebox may be attached to a stand, e.g., of the type disclosed in U.S. application Ser. No. 29/485,933, filed on Mar. 25, 2014, the entire contents of which are hereby incorporated by reference herein. It will be appreciated that the angular design of this example jukebox may extend into the stand and support structure in certain example embodiments.

The jukebox, upper housing, lower housing, face(s) (e.g., the upper front face, the lower front face, etc.), LED lights and/or LED lighting element(s), camera, payment collector(s), display area, frames (including, for instance, the joining frame between the upper and lower housings, the frame in the display, etc.), and/or the like, shown in the '654 application may be implemented in any combination, sub-combination, and/or in any combination of sub-combinations. In this vein, the payment acceptors may be reversed, two or more of one type of payment acceptor may be provided with zero or one of another type of payment acceptor is provided, two or more of both types of payment acceptors may be provided, and/or the like. In addition, in certain example embodiments, at least partially translucent and/or at least partially reflective surfaces may be provided on the jukebox (e.g., at the top, bottom, right, and/or left surfaces of the rear housing, etc.).

LED lighting elements may be provided around the exterior of the jukebox, which may provided for interesting and aesthetically pleasing displays during low-light time periods. However, the reflective surfaces may be desirable in certain example embodiments from an aesthetic viewpoint where there is more ambient light. It will be appreciated that these surfaces may in essence be two-way mirrors, e.g., such that light from the LEDs can be seen when activated (e.g., at nighttime) and so that the jukebox appears interesting during the daytime or when the lights are turned up in the venue.

In certain example embodiments, the audio wiring may monitor the electrical properties of the connection, e.g., to ensure that the proper impedance, resistance, voltage, etc., is coming across the line. This may help inform the operator and/or location personnel that the house audio system might have been wired incorrectly. From a performance perspective, the source of buzz, pops, and/or the like may be more easily identified and potentially diagnosed.

Certain example embodiments may incorporate auxiliary input monitoring techniques. See, for example, U.S. Publication No. 2013/0179980, the entire contents of which are hereby incorporated by reference herein.

Certain exemplary embodiments may incorporate a removable "core" in connection with such example jukeboxes. The core may in certain implementations house all or substantially all control electronics and/or components including, for example, a motherboard, audio mixer, amplifier, pre-amp., processor, memory, non-transitory computer readable media storing the catalog of local songs (e.g., a hard disk drive, solid state drive, flash drive, and/or the like), network interface card, display card, etc. The core may also include a flat panel display (e.g., an LCD, plasma display, and/or the like), a touch screen, etc., as well as a power supply and docking adapter. By providing an easily removable core, if the jukebox suffers from a problem (e.g., an HDD failure, the display being cracked, data being corrupted, a power supply failing, etc.), it becomes easy for an operator to simply open the jukebox, remove the core, and insert a new core in its place. In one example implementation, the core weighs less than about 30 pounds and can be carried in a specially designed (e.g., appropriately sized and shaped) backpack, carrying case, or the like. Once the core is shipped back to the manufacturer, the manufacturer may open it up, perform the desired repairs, refurbish the core, and send it back into the field, if possible.

Features of an example removable core will be explained in connection with FIGS. 49-59. In this regard, FIG. 49 is a front elevation view of an example enclosed core that may be used in the FIG. 48 example jukebox, in accordance with an exemplary embodiment. FIG. 49 shows the main display screen and a narrow bezel around it. The core is designed to fit into the jukebox shell, and this exemplary embodiment includes a plurality of locating features and a latch that helps secure the core in place and make the desired electrical connections.

FIG. 50 is a bottom plan view of the example core shown in FIG. 49, and shows a hole or opening in the core for accommodating a latch provided in the jukebox shell's interior. As will be appreciated from FIG. 50, a plurality of connectors are provided (e.g., for connecting with the display, a network connection, a power supply, etc., and at least some of these connectors may be "loose" or "floating" such that some play is allowed as the core is guided into or out of place and as connections are made or as the components are disconnected.

FIG. 51 is a right side elevation view of the example core shown in FIG. 49, and FIG. 52 is a rotated version of FIG. 51. The left side view may be substantially the mirror of the right side view. Thus, on the sides, right-left alignment guides (e.g., facilitating the left-to-right alignment in the shell) may be provided, as may be top and bottom "keyhole" locks. A slide support member may be provided on each side so that corresponding features on the shell engage with them and help receive the core into the shell. An area where the core may rest on a cross-beam or structural member of the core also is identified.

Figure 53:
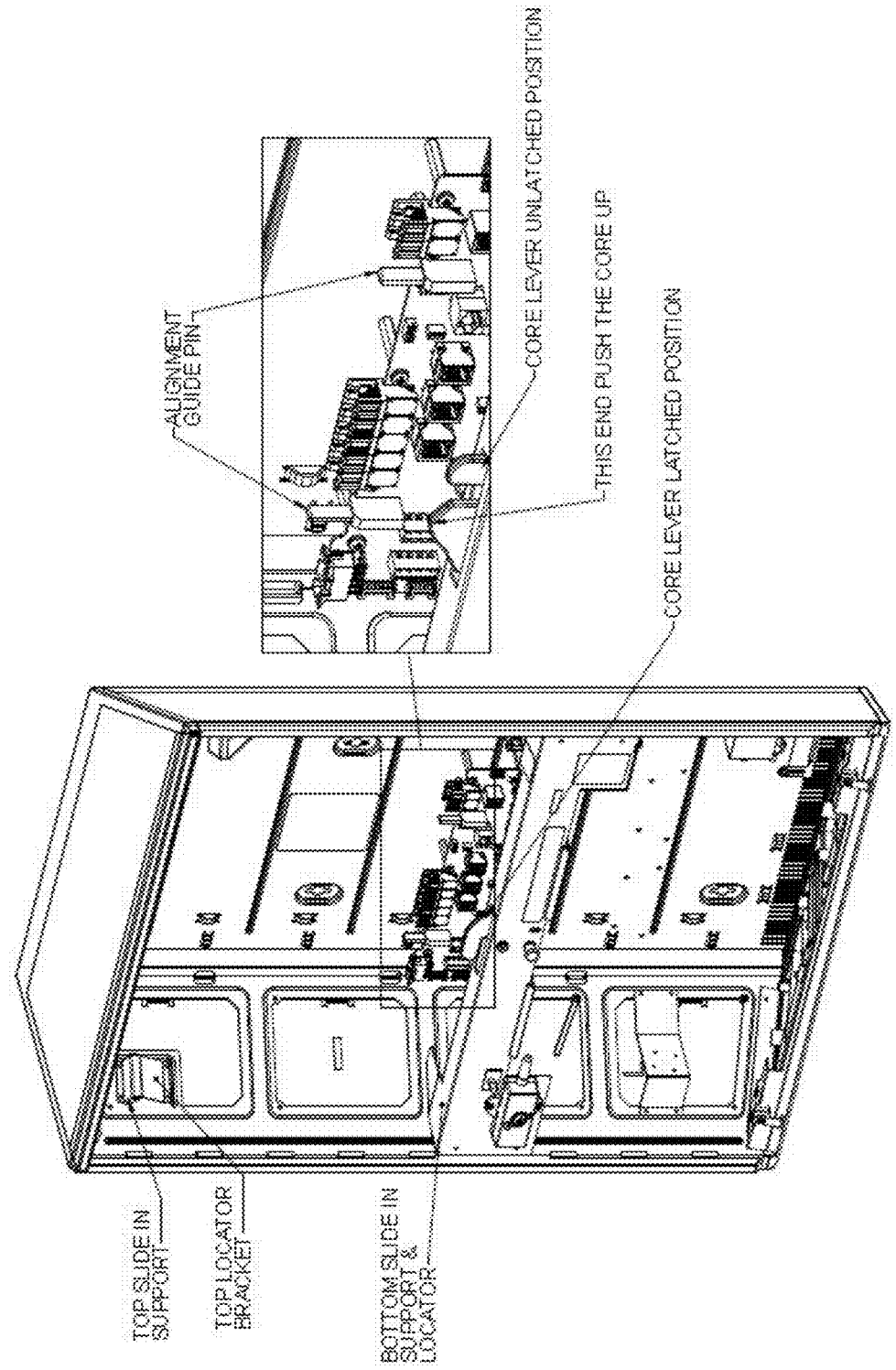
FIG. 53 is a front perspective view of the interior of the FIG. 48 example jukebox, ready to receive the example core of FIG. 49.

FIG. 53 is a front perspective view of the interior of the FIG. 48 example jukebox, ready to receive the example core of FIG. 49. Brackets may be provided at the top and bottom of the shell so that when the top and bottom slides are received into the top and slide supports, the brackets provide a suitably strong connection with the outer area to hold the core and shell in position relative to one another. The cross-beam member where the core rests is shown, as is the latch. A lever may be used to adjust between latched and unlatched positions, and a foot of the latch may help push the core out of place (e.g., away from the cross-beam member) when the core is being removed. Guide pins may help locate the more fine features once the core is basically put into place and latched into the shell. The FIG. 53 view shows a hinged arrangement at the left side for the front face plates, etc.

Figure 58:
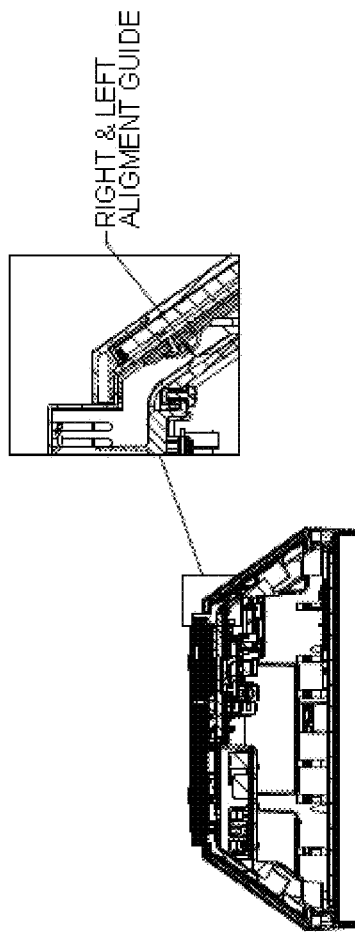
FIG. 58 is a cross-sectional view through the section line shown in FIG. 57, with the example core of FIG. 49 being located in the jukebox shell and with the lever in the unlocked or "core up" position.
Figure 59:
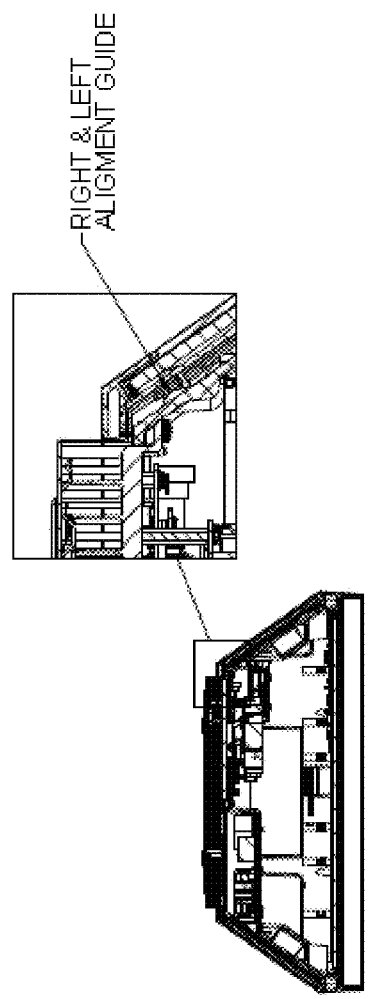
FIG. 59 is a cross-sectional view through the section line shown in FIG. 57, with the example core of FIG. 49 being located in the jukebox shell and with the lever in the locked or "core latched" position.
Figure 57:
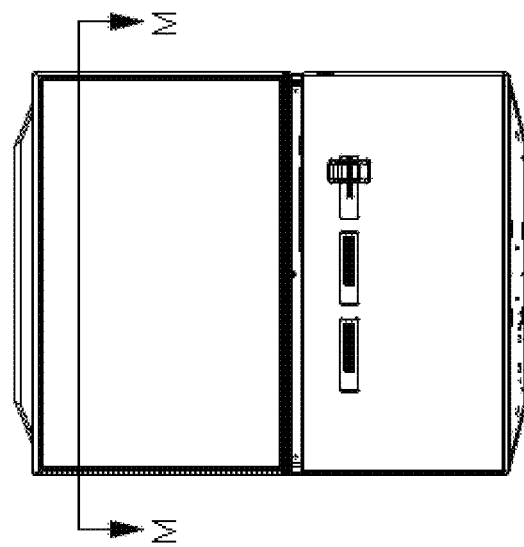
FIG. 57 is a front elevation view of the FIG. 48 example jukebox with a section line referenced in FIGS. 58-59.

FIGS. 54-59 show the core being latched into place using a lever, in accordance with an exemplary embodiment. They also show the core sliding on the bottom support and along alignment guides such that good electrical, electromechanical, and/or other connections are formed. More particularly, FIG. 54 is a front elevation view of the FIG. 48 example jukebox with a section line referenced in FIGS. 55-56; FIG. 55 is a cross-sectional view through the section line shown in FIG. 54, with the example core of FIG. 49 being located in the jukebox shell and with the lever in an unlocked or "core up" position; and FIG. 56 is a cross-sectional view through the section line shown in FIG. 54, with the example core of FIG. 49 being located in the jukebox shell and with the lever in a locked or "core latched" position. FIG. 57 is a front elevation view of the FIG. 48 example jukebox with a section line referenced in FIGS. 58-59; FIG. 58 is a cross-sectional view through the section line shown in FIG. 57, with the example core of FIG. 49 being located in the jukebox shell and with the lever in the unlocked or "core up" position; and FIG. 59 is a cross-sectional view through the section line shown in FIG. 57, with the example core of FIG. 49 being located in the jukebox shell and with the lever in the locked or "core latched" position.

Because the core is sealed, cooling may take place from outside of it, e.g., via external ventilation means such as fans, heat sinks, and/or the like. Temperatures may be taken from a number of different locations inside of or proximate to the core, e.g., to know which cooling means to activate, and when to activate/deactivate them. In certain exemplary embodiments, a fan tray may be placed near the top of the jukebox shell, e.g., to provide cooling to at least some of the components in the core and/or the core itself. An example fan tray assembly is shown and described in connection with FIGS. 60-68. It will of course be appreciated that the fan tray may be repositioned in different exemplary embodiments (e.g., to the bottom of the shell, at the cross-beam member, behind the core (e.g., at the back of the jukebox), etc., in certain exemplary embodiments. It also will be appreciation that multiple fan trays may be used in these and/or other example positions in certain exemplary embodiments.

FIG. 60 is a front perspective view of a fan tray that may be used in connection with the FIG. 48 example jukebox, in accordance with an exemplary embodiment; and FIG. 61 shows the range of movement of components in the FIG. 60 example fan tray. FIG. 62 is a top plan view of the FIG. 60 example fan tray, showing the electronic fan controller thereof. As will be appreciated form these views, the tray may be stationary as small (e.g., 80 mm) fans positioned at opposing ends of the tray pivot back and forth. A small electronic fan controller may be located in the tray, e.g., to cause the fans to turn on/off, rotate, etc., e.g., in response to input from a thermal sensor. In this regard, FIG. 63 is a front elevation view of the FIG. 60 example fan tray, and shows a small thermal sensor configured to detect the temperature of or proximate to the amplifier built into the core. FIG. 64 is a bottom plan view of the FIG. 60 example fan tray, and shows that a simple magnet may be usable to locate the fan tray in the box, cause rotation, etc.

FIGS. 65-68 show the fan tray assembly being located in the shell. That is, FIG. 65 is a front perspective view of the FIG. 60 example fan tray located in the jukebox shell; FIG. 66 is a front elevation view of the FIG. 48 example jukebox with section lines referenced in FIGS. 67-68; FIG. 67 is a cross-sectional view of FIG. 66 taken through the A-A line; and FIG. 68 is a cross-sectional view of FIG. 66 taken through the C-C line.

As indicated above, an operator might select a profile for a jukebox from a predefined list of profiles. Doing so may cause the jukebox to retrieve particular playlists or the like. Profiles may be created from an existing profile or "from scratch." With respect to the former, an existing profile that is close to the profile being created is located, a child profile is created from the selected parent, basic information (e.g., name, description, basic settings, etc.) is entered, and the tile sets and playlist categories to copy or inherit are specified. With respect to the latter, basic information (e.g., of the type identified above) is entered, and tile lists for the home carousel and playlist grid are filled with tiles. Public and/or private profile names, descriptions, and/or the like may be specified, as may a default language, pricing scheme, etc.

A profile may be built up by adding tiles and tile lists. Tiles may be one of four types, namely, songs, albums, artists, and playlists, in certain exemplary embodiments. Tiles may be searched for and then added. Quick searches may be used, e.g., to identify a profile based on a common name, ID, or the like. More advanced searches based on artist, song, album, playlist, tiles, etc., may be used, as well. In certain exemplary embodiments, for non-tile search results, a create tile screen may be displayed, and the user may have an opportunity to build a specific tile around the selected searched for item. Search results may be filtered, ordered, and/or searched, etc., in different exemplary embodiments. Filtering may be performed, for example, based on metadata tags such as, for example, genre, style, mood, tempo, explicit, edited, lyric verified, and/or subcategories thereof. In certain exemplary embodiments, elements that are collections of other elements (e.g., albums, which are collections of songs) may be expanded, and items at any level of granularity may be selected in different exemplary embodiments. Alternatively, or in addition, tiles may be built, e.g., using the example search techniques described above and/or other approaches. That is, tiles may be built "from scratch," modeled off of a selected searched for tile or other item, etc. Search results and/or other displayed artist, album, song, Tile, profile, etc., may include information including, for example, name/description, artist/type, status, number of elements in collection (if applicable), percentage popularity, etc.

Tiles may be static or dynamic in different use cases, e.g., as indicated above. A static tile always points to the same content. For instance, if its type is song, it will always point to that same song. By contrast, a dynamic tile's content may change over time and, thus, it may be useful in generating top music assets according to user specified criteria (e.g., top number of elements of a given type over for a defined time period in a geographic area, etc.). A dynamic tile's content will be refreshed on a periodic and/or aperiodic basis (e.g., based on a manual update), and this may be performed on a jukebox, at a central server, or elsewhere. The same or similar basic information for a tile may be provided. Artwork for a tile may be generated based on its contents (and may or may not correspond to album art), based on user-provided images, etc. Tiles may be laid out with a specific format (e.g., 1 image, 2×2 images, etc., with or without customizable text, etc.).

Profiles may have different statuses assigned to them. Example statuses include draft (e.g., when the profile is first created, when a published profile is modified, etc.), awaiting approval (e.g., when submitted for approval and prior to being published to jukeboxes), and approved (e.g., accepted by a central content checking authority and authorized for publication to jukeboxes), published (e.g., which causes an update to any prior versions at a central server and/or at the jukeboxes, etc.), and/or the like.

In certain exemplary embodiments, profiles may be saved as structured documents (e.g., XML documents, JSON documents, etc.) that conform to a predefined schema. In certain exemplary embodiments, profiles may be saved as database entries (e.g., tables and/or the like in a relational or other database, etc.). Pending and approved profiles, for example, may be saved to a central storage location and transmitted to jukeboxes that wish to accept such profiles.

Sub-catalogs may be built from profiles, e.g., to filter out songs with explicit lyrics, to include only edited songs, to include lyric verified content, etc., in certain exemplary embodiments. Genre, sub-genre, mood, style, beats per minute, age, etc., may also be used in sub-catalog generation.

Figure 69:
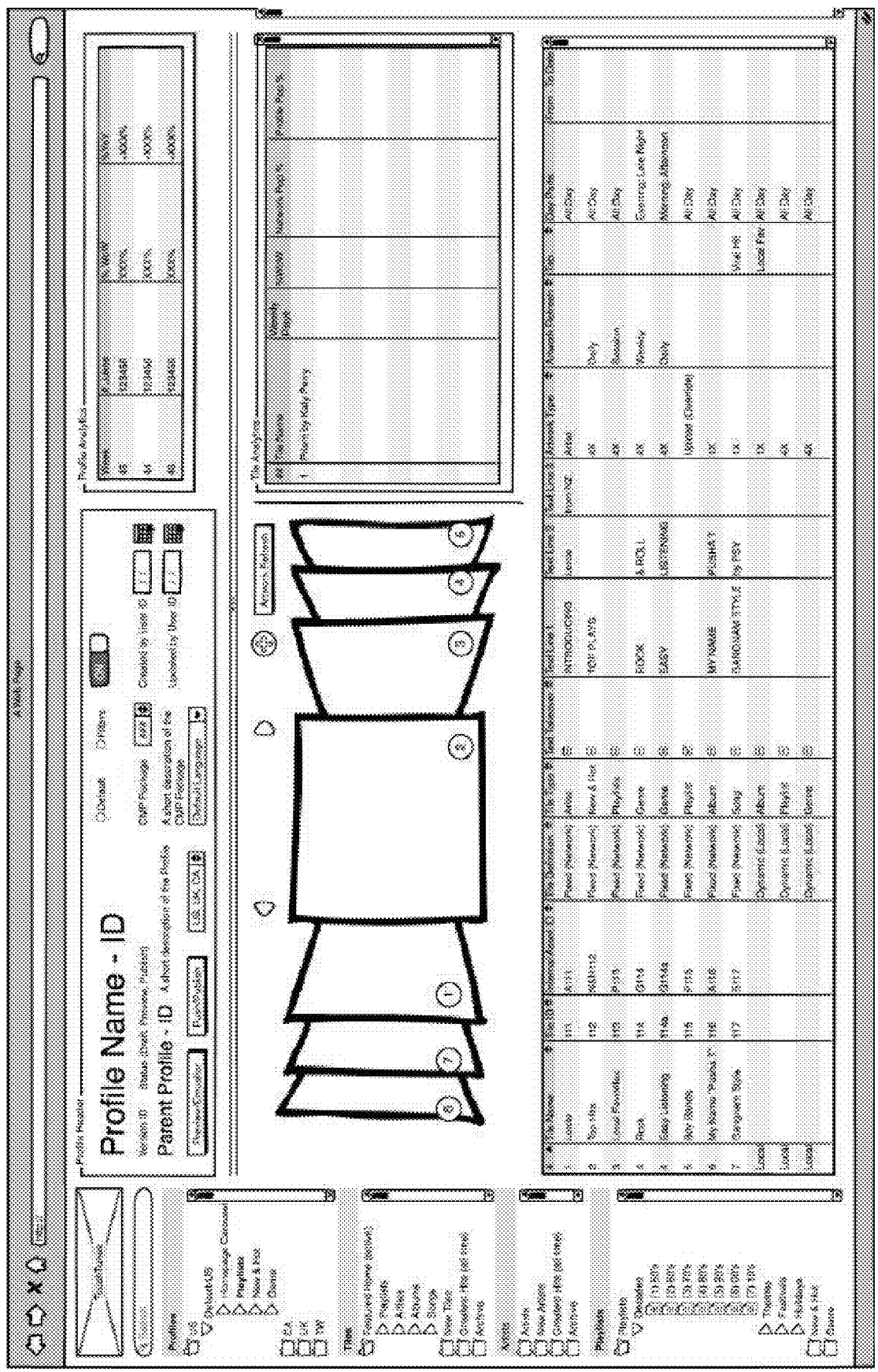
FIG. 69 is an example profile details page that may be used in creating a new profile in accordance with an exemplary embodiment.

FIG. 69 is an example profile details page that may be used in creating a new profile in accordance with an exemplary embodiment. A new profile could be created as a "top-level" profile for a territory, as a sub-profile of a genre (e.g., Classic Rock as a sub-profile of Rock, "Boy Bands" as a sub-profile of Pop, etc.), etc. The hierarchical tree-like structure shown at the left-hand side may be persisted throughout the several views, e.g., allowing users to quickly jump between profiles, tiles, playlists, etc. It also may support drag-and-drop operations in certain exemplary embodiments. The hierarchical tree-like structure may be arranged as follows (at least initially):

```
Profile
    United States
        Subordinate Profile 1
            Home Carousel
                Browse Playlists Grid
                    Featured
                    New & Hot
                    Decades
                    Etc.
                Video
        Subordinate Profile 2
        United Kingdom
        Canada
    Tiles
        New Tiles
        Archives
    Artists
        New Artists
        Archives
    Playlists
        Playlists
        New & Hot
        Genre
        Decades
        Etc.
    Videos
        New Videos
        Archive
```

The sequencing of tiles and/or the like may be specified using the FIG. 69 example screen. Alternatively, or in addition, the jukebox's local popularity may control the sequencing, e.g., to favor more popular tiles, etc. Primary and secondary sorting, etc., may be implemented, e.g., for sub-categories of tiles, etc. The ordering used for the primary list need not be used in some or all of the secondary lists.

Profile analytics may include data for a current week and one or more prior weeks. The number column indicates the number of jukeboxes assigned to the profile, the % WoW value provides a week-over-week comparison of the profile's total jukeboxes assigned to it, and the % YoY value provides similar comparison based on the same week last year. Similar information may be provided in tile analytics, as discussed elsewhere.

Figure 70A:
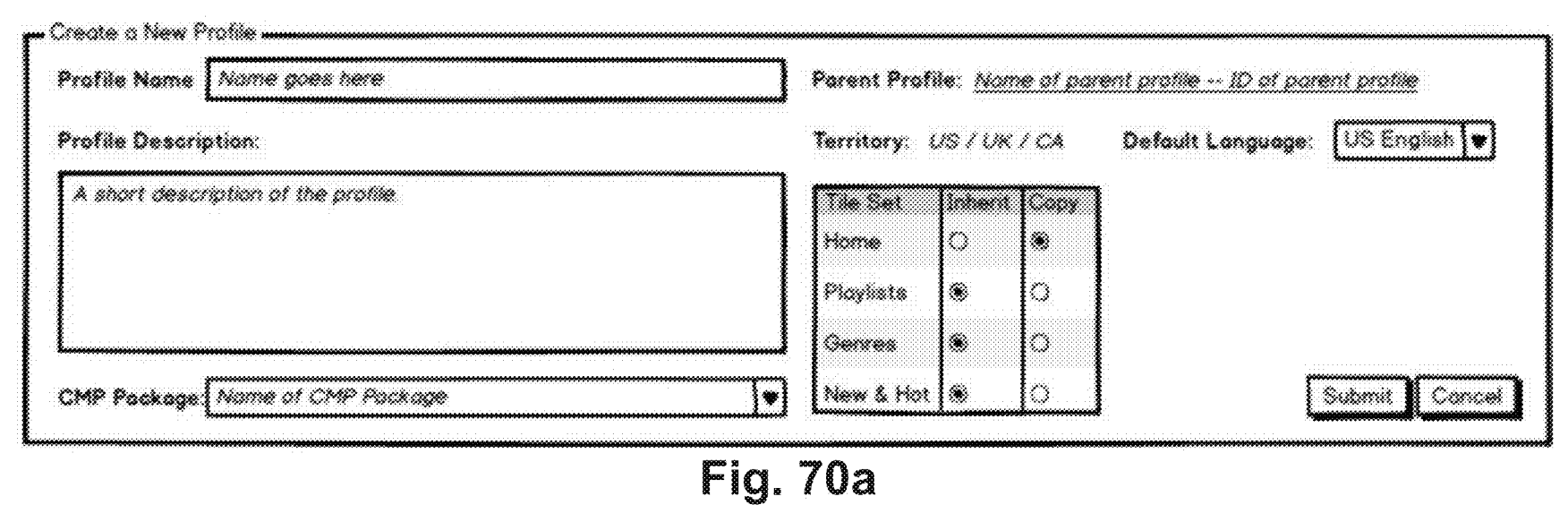

FIG. 70a is an example screen that may be used to create a new profile in certain exemplary embodiments. Among the fields in this screen is a series of radio buttons that may be used to indicate which tile lists should be inherited from a parent profile, and which should be copied. The copy behavior indicates that the setting, value, content, and/or the like is copied such that, a new instance is created for larger content items (e.g., tile lists) and simple values are merely replicated. Changing the parameter in the child has no effect on the parent for copies. The inherit behavior indicates that the setting, value, content, and/or the like is linked as between the parent and child, such that both the child and the parent use the instance of larger content items (e.g., tile lists) and that if the instance is modified (e.g., at the parent), then the modification is applied to all profiles linked to that instance. For simple parameters, inheritance need not be used, but synchronization may be maintained. In any event, once these items are selected, the FIG. 69 example screen may populate itself. For instance, for inherited tile lists, the tile list table (below the carousel or grid view preview) may appear grayed-out, e.g., to help make clear that it is inherited and not editable. Copied tiles may be edited or removed, and additional tiles can be added, moved around, etc. Once the profile is created, it may be pushed to jukeboxes that want it (e.g., based on a selection from an operator, venue manager, or other authorized person). FIG. 70b is a table showing an example profile header format that may be used in connection with certain exemplary embodiments.

Figure 71A:
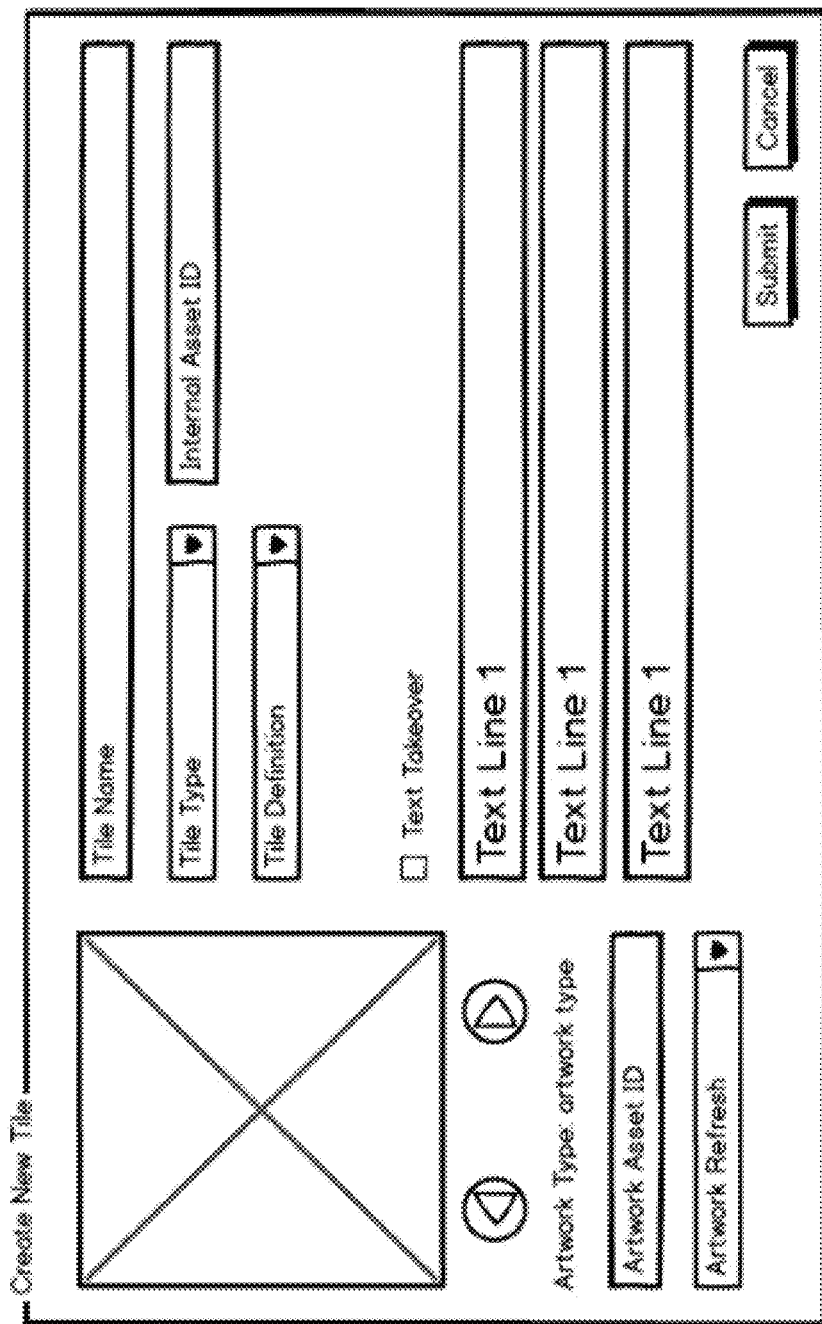
FIG. 71a is an example tile creation screen that may be used in certain exemplary embodiments.

The second area on the left of the FIG. 69 example view enables users to create, modify, delete, and/or otherwise manipulate tiles. FIG. 71a is an example tile creation screen that may be used in certain exemplary embodiments. The image associated with the tile may be specified, e.g., as a single image associated with an album, as artwork associated with the top four (or other specified number) of songs, etc. A thus-added tile may be moved to a profile (e.g., by dragging and dropping or other operations). The text takeover field, when "on," indicates that no text can be placed over the image. FIG. 71b is a table showing an example tile definition format that may be used in connection with certain exemplary embodiments. FIGS. 71c(1)-71c(2) provide another example tile definition format that may be used in connection with certain exemplary embodiments.

Figure 72:
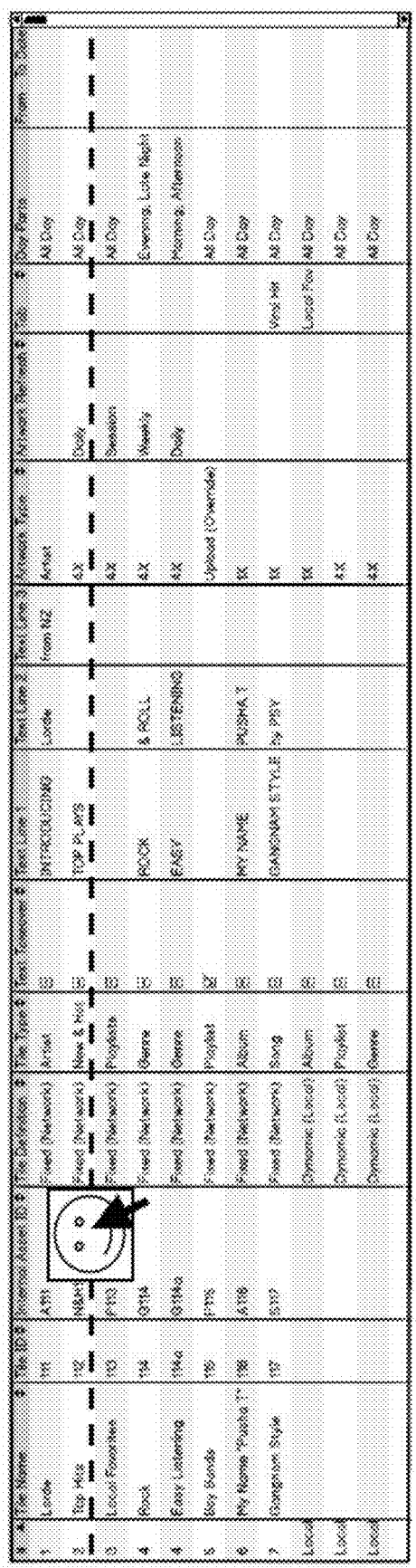
FIG. 72 is an enlarged area of the lower portion of the FIG. 69 screen, showing a tile being added to the profile.

FIG. 72 is an enlarged area of the lower portion of the FIG. 69 screen, showing a tile being added to the profile. Day parting (e.g., indicating when a tile is to be activated during a day such that, for example, classical music plays for brunch, pop music plays for dinner, and Hip Hop plays during late night hours, etc.), enable/disable dates, and/or the like may be specified, and/or default values may be applied. The carousel preview of FIG. 69 may be automatically updated to indicate the addition of the new tile.

Figure 73A:
FIG. 73a is an example profile analytics screen that may be displayed to users, in accordance with certain exemplary embodiments.

FIG. 73a is an example profile analytics screen that may be displayed to users, in accordance with certain exemplary embodiments. In addition to providing analytics about top plays, artists/songs searched, jukeboxes using the profile, coinage, etc., items from the lower portions of the display may be used to create new tiles, e.g., through drag-and-drop or other operations, in which items are associated with tiles or the like in the associated dropdown to the left side of the example screen.

With respect to the analytics offered, with respect to top tiles at the bottom area of the example screen, the top listing will display a predefined (e.g., 5) tiles at a time with the ability to scroll horizontally from left to right to see more. The user may scroll up through a predefined number of additional tiles (e.g., top 20, top 50, top 100 tiles). An overlay may be provided with rank. Similar displays may be provided for top songs, albums, artists, and/or the like.

Further metrics may be derived from play data measured at a jukebox device's front-end interface and consolidated at the central server, e.g., for royalty accounting purposes. FIG. 73a(1), for example, plots revenue vs. date for a specific jukebox and as an average across the network. FIG. 73a(2), for example, plots revenue vs. date by play type (e.g., selection from search, genre, new and hot, playlist, home screen, etc.). FIG. 73a(3), for example, displays the revenue by play type on the vertical axis and profile name along the horizontal axis. Hovering over an area may provide additional details about the relevant part.

Similar to the revenue charts discussed above, play data charts may be displayed, e.g., as a series of pie charts. For instance, FIG. 73a(4) is a series of pie charts showing play data for play type, title type, plays by origin and credit, and paid play type. Percentages may be visible, as well. Information about the device used to make a play may be provided, as well, e.g., to generate a plays by original and play next operation chart, etc.

The period of analysis may be altered, e.g., to reflect annual, monthly, weekly, daily, lifetime, custom-defined, and/or other periods. Territories also may form the basis of data refining operations in certain example implementations. Such custom-defined periods may be of a predetermined minimum and maximum duration. It will be appreciated that other graph formats may be used in place of or together with those shown in the examples discussed herein. For instance, area formats may be used rather than line charts, area charts may be used for jukebox-specific information and line charts may be used for macro average data, etc. It also will be appreciated that different types of data may be overlaid on a common graph (e.g., the stacked bar chart may also indicate number of venues, etc.).

FIG. 73b is an example tile analytics view that may be displayed to users, in accordance with certain exemplary embodiments. The number column indicates the rank of the tile, the weekly plays is a simple count of plays, the WoW % column is a week-over-week percentage change in the number of plays, and network and profile popularity measures also are provided. In certain exemplary embodiments, network popularity ranking may be the value contained within the catalog, where each song is associated with a numerical value representing popularity in the network. The value will be the same for all jukeboxes and will vary each week, for instance.

Figure 74:
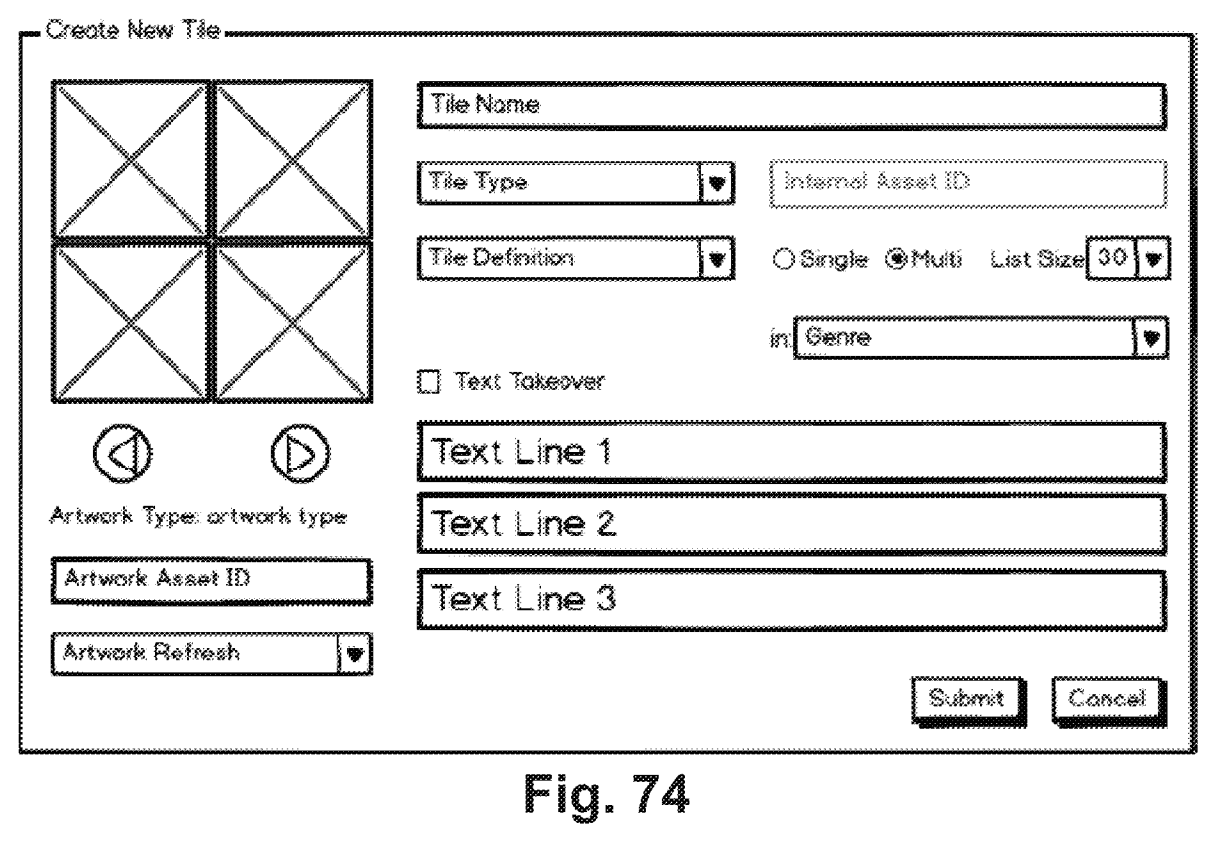

FIG. 74 is an example new tile creation screen that may be used to create dynamic tiles, in accordance with certain exemplary embodiments. Dynamic tiles may be generated locally (at the jukebox), based on the network as a whole, or in some blended fashion. The tile definition is set to allow for multiple entries, and the user may select a number of items to be included in the list (in this example, 30) from a particular group (in this example, genre). Thus, a user may create a dynamic list of the top X songs from a specified genre, playlist, profile, region, jukebox, etc. The configuration of the image may also be specified in the art at the left of the screen, and an indication of how often the artwork in the images and/or the list is to be updated (e.g., daily, weekly, monthly, etc.) may be specified in certain exemplary embodiments. Thus, it will be appreciated that the example techniques described herein may be used to create static and/or dynamic tiles, playlists, profiles, and/or the like, e.g., in different use cases.

A search function may be used to help locate songs, artists, albums, etc., addable to tiles, playlists, genres, profiles, etc. Adaptive search techniques, different ordering techniques, etc., may be applied (e.g., as described above) in order to facilitate such features. Similar searches may be performed for playlists, tiles, profiles, and/or the like, e.g., for editing, adding to another of the same or different type of element, etc.

Figure 75:
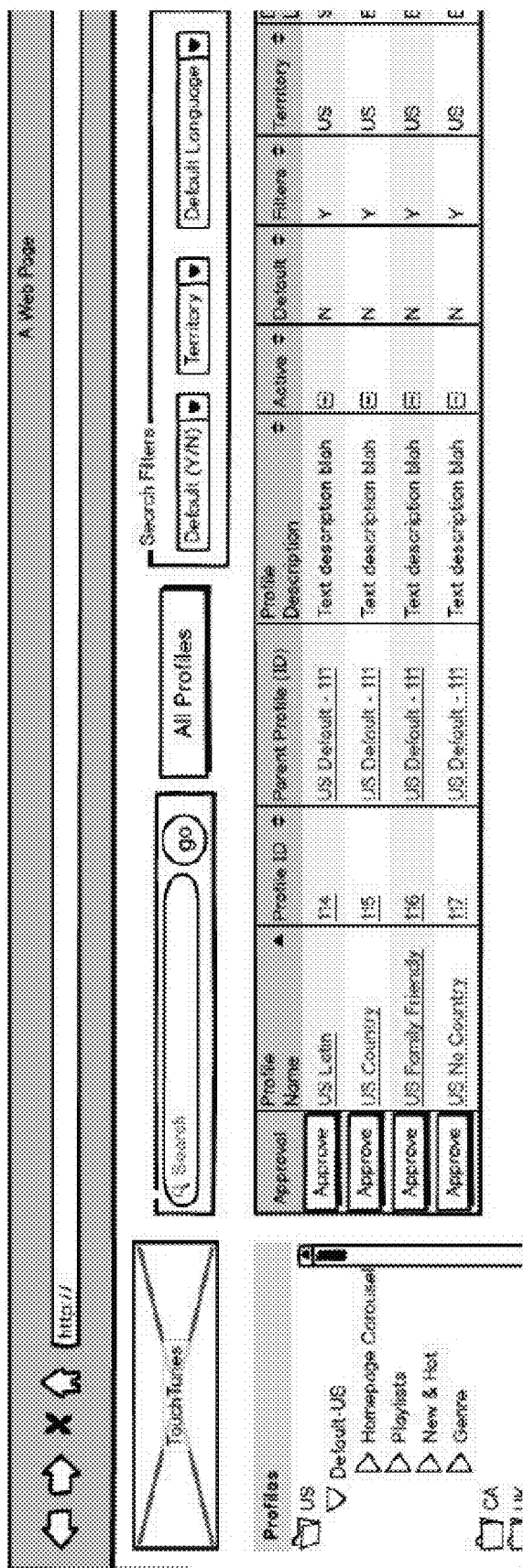
FIG. 75 is an example approval screen that may be used in connection with certain exemplary embodiments.

A completed profile, tile, etc., may be saved as a draft and approved by others (e.g., the jukebox provider or the like) before it is publishable to jukeboxes. FIG. 75 is an example approval screen that may be used in connection with certain exemplary embodiments.

In certain exemplary embodiments, translations may be provided for different localities. Similarly, different images may be tied to different localities, e.g., to match local standards of decency, to include graphics-based text in an appropriate language, etc.

It will be appreciated that the use cases presented herein are provided by way of example and without limitation. Other flowcharts and use cases are possible in connection with different exemplary embodiments, implementations, and/or uses of this invention.

Certain exemplary embodiments relate to an entertainment center comprising a computer capable of communicating with networks, wherein said computer is further connected to at least one display through standard analog, digital, or network-addressable displays, said computer being operable to interact with a remote device connected to one of said networks in communication with said computer, said remote device being operable to accept a code and transmit said code to said computer, and wherein said computer can validate against a database or against an algorithm the validity of said code and, upon positive validation, said computer is configured to allocate a monetary value or a credit value to said remote device. The remote device may be operable to browse content contained on said computer and said remote device may be further operable to select and pay for said content using said monetary or said credit value, said computer may be operable to reduce said monetary or said credit value upon a selection by said remote device. The code may instead or in addition be sent to the remote device and entered on the computer. Certain exemplary embodiments relate to an out-of-home entertainment center coupled with at least one Internet-based messaging system and/or a social networking site and coupled with at least one remote device, said remote device being connected to the out of home entertainment center by a wired or wireless local area network or through the Internet, wherein the use of some of the entertainment center services by said remote device causes said entertainment center to send messages to said at least one Internet-based messaging system. Connecting the system through the Internet may require a user to input a code to the remote device that uniquely identifies the entertainment center.

The present disclosure has used certain terms that should not be interpreted as limiting the invention to a particular embodiment, hardware components and configurations, software configurations, etc. For example, many features and examples have been described in relation to their existence within a bar, pub, or other environment. However, it will be appreciated that the features present in the exemplary embodiments of the present invention are adaptable for use in any location where a jukebox (or multiple jukeboxes) may be located. Similarly, while certain features and functions are described with reference to usage by "users," "owners," "operators," "patrons," etc., it will be appreciated that these terms are generic and may, in most cases, be used interchangeably depending on the embodiment chosen and the feature employed. For example, while it may be advantageous to limit the initial song selection to owners and/or operators, in certain exemplary embodiments, patrons may play a role in the initial song selection. It will be appreciated that the term "display" includes, for example, monitors connected to computers directly or remotely, or embedded ICs such as IP TV technology. Displays may be network addressable. Also, standard digital signs (LED based) also may be considered displays and/or may be provided as network addressable displays.

Although certain exemplary embodiments have been described in connection with out-of-home locations, it will be appreciated that the techniques described herein may be adapted for use in an in-home or personal jukebox.

Still further, particular hardware combinations and configurations are disclosed that represent only one way which the embodiments may be constructed. Central servers may, in some exemplary embodiments, comprise one or more servers acting together or separately to coherently provide the full range of services necessary to enable a functioning jukebox. For example, a cluster of servers may comprise a virtual central server, with one server providing media, another tracking membership, still another processing licensing, etc. Similarly, the local servers described herein may be incorporated into the jukeboxes. For example, the local servers may appear to function independently, even though they exist as part (e.g. partition) of an integrated mass storage device within the jukebox. Indeed, as hard disks become larger and less expensive, they may preferably serve the functions of local servers.

Also, although the term "song" has been used sometimes in the above-description, this term is not intended to be limiting to the scope of the invention, and any instance or instances of media (e.g., song, video, song/video combination, data, information etc.) can be used in any embodiment herein and still fall within the intended scope of the invention.

Lastly, it will be appreciated that the screen shots and software arrangements presented herein are only one exemplary method for organizing and displaying the features disclosed herein. Other configurations are possible and are therefore contemplated herein.

While the preferred aspects of the invention have been illustrated and described herein, it will be apparent to one of ordinary skill in the art that various changes and/or modifications can be made. Thus, the specific description herein is meant to be exemplary only and is not intended to limit the invention beyond the terms of appended claims.

What is claimed is:

1. A jukebox device, comprising:
   a display device; and
   front and rear body portions that are connected to one another and that together define an interior area sized and shaped to accommodate control componentry of the jukebox device;
   wherein the front body portion includes upper and lower portions that meet one another proximate to a generally medial area of the jukebox device,
   the lower portion supporting a bill acceptor and/or a credit card reader,
   the upper portion supporting the display device, and
   the upper and lower portions having respective thicknesses that are greatest proximate to where they meet one another and that respectively taper approaching top and bottom surfaces of the jukebox device.

2. The device of claim 1, wherein the rear body portion is trapezoidal in shape when viewed from top and bottom plan views.

3. The device of claim 2, wherein the rear body portion includes top and side panels that are at least partially reflective.

4. The device of claim 1, wherein the rear body portion includes top and side panels that are at least partially reflective.

5. The device of claim 4, further comprising one or more lights internal to the jukebox device and configured to illuminate the top and side panels.

6. The device of claim 1, further comprising a camera and one or more LED flash elements.

7. The device of claim 1, further comprising a hinge mechanism connecting the front and rear body portions to one another.

8. The device of claim 1, wherein the rear body portion includes one or more cooling vents.

9. The device of claim 1, being wall-mountable.

10. A wall-mountable jukebox device, comprising:
    a touch-sensitive display device; and
    front and rear body portions that are connected to one another and that together define an interior area sized and shaped to accommodate control componentry of the jukebox device;
    wherein the rear body portion is trapezoidal in shape when viewed from top and bottom plan views,
    wherein the rear body portion includes top and side panels that are at least partially reflective, and
    wherein the front body portion includes upper and lower portions that meet one another proximate to a generally medial area of the jukebox device,
    the lower portion supporting a bill acceptor and/or a credit card reader,
    the upper portion supporting the display device, and
    the upper and lower portions having respective thicknesses that are greatest proximate to where they meet one another and that respectively taper approaching top and bottom surfaces thereof.

11. The device of claim 10, further comprising one or more lights internal to the jukebox device and configured to illuminate the top and side panels.

12. The device of claim 10, further comprising a camera and one or more LED flash elements.

13. The device of claim 10, further comprising a hinge mechanism connecting the front and rear body portions to one another.

14. The device of claim 10, wherein the rear body portion includes one or more cooling vents.

* * * * *